US011581439B2

(12) United States Patent
Yamazaki et al.

(10) Patent No.: US 11,581,439 B2
(45) Date of Patent: Feb. 14, 2023

(54) SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yoshiyuki Kobayashi, Kanagawa (JP); Daisuke Matsubayashi, Kanagawa (JP); Akihisa Shimomura, Kanagawa (JP); Daigo Ito, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 192 days.

(21) Appl. No.: 16/693,482

(22) Filed: Nov. 25, 2019

(65) Prior Publication Data
US 2020/0127137 A1  Apr. 23, 2020

Related U.S. Application Data

(62) Division of application No. 14/313,008, filed on Jun. 24, 2014, now abandoned.

(30) Foreign Application Priority Data

Jun. 27, 2013 (JP) ................. 2013-134865
Jul. 29, 2013 (JP) ................. 2013-156551

(51) Int. Cl.
*H01L 29/786* (2006.01)
*H01L 29/423* (2006.01)
*H01L 29/66* (2006.01)

(52) U.S. Cl.
CPC .... *H01L 29/7869* (2013.01); *H01L 29/42376* (2013.01); *H01L 29/42384* (2013.01);
(Continued)

(58) Field of Classification Search
CPC ......... H01L 29/42384; H01L 29/42376; H01L 29/7869–78693; H01L 29/78648; H01L 29/78696
See application file for complete search history.

(56) References Cited

U.S. PATENT DOCUMENTS 5,731,856 A  3/1998  Kim et al.
5,744,864 A  4/1998  Cillessen et al.
(Continued)

FOREIGN PATENT DOCUMENTS

CN    103107200 A    5/2013
EP      1737044 A   12/2006
(Continued)

OTHER PUBLICATIONS

Mativenga.M et al., "Bias-induced migration of ionized donors in amorphous oxide semiconductor thin-film transistors with full bottom-gate and partial top-gate structures", AIP Advances, Jul. 31, 2012, vol. 2, p. 032129.
(Continued)

*Primary Examiner* — Lauren R Bell
(74) *Attorney, Agent, or Firm* — Fish & Richardson P.C.

(57) ABSTRACT

To provide a semiconductor device in which a large current can flow. To provide a semiconductor device which can be driven stably at a high driving voltage. The semiconductor device includes a semiconductor layer, a first electrode and a second electrode electrically connected to the semiconductor layer and apart from each other in a region overlapping with the semiconductor layer, a first gate electrode and a second gate electrode with the semiconductor layer therebetween, a first gate insulating layer between the semiconductor layer and the first gate electrode, and a second gate insulating layer between the semiconductor layer and the second gate electrode. The first gate electrode overlaps with part of the first electrode, the semiconductor layer, and part
(Continued)

of the second electrode. The second gate electrode overlaps with the semiconductor layer and part of the first electrode, and does not overlap with the second electrode.

7 Claims, 37 Drawing Sheets

(52) U.S. Cl.
CPC .. H01L 29/66969 (2013.01); H01L 29/78645 (2013.01); H01L 29/78648 (2013.01); H01L 29/78693 (2013.01); H01L 29/78696 (2013.01)

(56) References Cited

U.S. PATENT DOCUMENTS

| | | | |
|---|---|---|---|
| 5,847,413 A * | 12/1998 | Yamazaki | H01L 21/28512 257/69 |
| 6,294,274 B1 | 9/2001 | Kawazoe et al. | |
| 6,563,174 B2 | 5/2003 | Kawasaki et al. | |
| 6,590,229 B1 | 7/2003 | Yamazaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,537,976 B2 | 5/2009 | Hirose | |
| 7,674,650 B2 | 3/2010 | Akimoto et al. | |
| 7,732,819 B2 | 6/2010 | Akimoto et al. | |
| 8,067,775 B2 | 11/2011 | Miyairi et al. | |
| 8,242,553 B2 | 8/2012 | Korenari et al. | |
| 8,339,828 B2 | 12/2012 | Yamazaki et al. | |
| 8,344,788 B2 | 1/2013 | Yamazaki et al. | |
| 8,476,631 B2 | 7/2013 | Kim et al. | |
| 8,619,454 B2 | 12/2013 | Yamazaki et al. | |
| 8,629,441 B2 | 1/2014 | Yamazaki et al. | |
| 8,723,173 B2 | 5/2014 | Yamazaki et al. | |
| 8,748,224 B2 | 6/2014 | Noda et al. | |
| 8,804,396 B2 | 8/2014 | Yamazaki et al. | |
| 8,823,439 B2 | 9/2014 | Yamazaki et al. | |
| 8,878,173 B2 | 11/2014 | Yamazaki | |
| 9,029,851 B2 | 5/2015 | Miyairi et al. | |
| 9,059,295 B2 | 6/2015 | Yamazaki | |
| 9,093,328 B2 | 7/2015 | Yamazaki et al. | |
| 9,135,958 B2 | 9/2015 | Yamazaki et al. | |
| 9,202,851 B2 | 12/2015 | Yamazaki et al. | |
| 9,287,390 B2 | 3/2016 | Noda et al. | |
| 9,318,512 B2 | 4/2016 | Miyairi et al. | |
| 9,449,991 B2 | 9/2016 | Yamazaki | |
| 9,601,603 B2 | 3/2017 | Miyairi et al. | |
| 9,705,005 B2 | 7/2017 | Yamazaki et al. | |
| 9,793,383 B2 | 10/2017 | Noda et al. | |
| 9,842,937 B2 | 12/2017 | Yamazaki | |
| 9,853,066 B2 | 12/2017 | Yamazaki et al. | |
| 10,079,251 B2 | 9/2018 | Yamazaki et al. | |
| 10,153,380 B2 | 12/2018 | Miyairi et al. | |
| 10,170,632 B2 | 1/2019 | Miyairi et al. | |
| 10,763,372 B2 | 9/2020 | Miyairi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0140302 A1 * | 6/2005 | Park | H01L 27/3251 315/169.3 |
| 2005/0199959 A1 | 9/2005 | Chiang et al. | |
| 2006/0033108 A1 | 2/2006 | Hoffman | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Theiss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0241336 A1 | 10/2007 | Tokioka et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2007/0290227 A1 | 12/2007 | Liang et al. | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025677 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0181565 A1 * | 7/2010 | Sakata | H04M 1/0266 257/43 |
| 2010/0244017 A1 * | 9/2010 | Hoffman | H01L 29/7869 257/43 |

(56) References Cited

U.S. PATENT DOCUMENTS

| | | | |
|---|---|---|---|
| 2010/0301326 A1 | 12/2010 | Miyairi et al. | |
| 2011/0003418 A1* | 1/2011 | Sakata | H01L 27/1218 438/34 |
| 2011/0140100 A1 | 6/2011 | Takata et al. | |
| 2011/0181349 A1 | 7/2011 | Yamazaki et al. | |
| 2011/0310381 A1 | 12/2011 | Kamata | |
| 2012/0061666 A1 | 3/2012 | Inoue et al. | |
| 2012/0146713 A1 | 6/2012 | Kim et al. | |
| 2013/0119373 A1 | 5/2013 | Yamazaki | |
| 2017/0301380 A1 | 10/2017 | Yamazaki et al. | |
| 2018/0166579 A1 | 6/2018 | Yamazaki | |
| 2019/0035818 A1 | 1/2019 | Yamazaki et al. | |
| 2020/0219905 A1 | 7/2020 | Yamazaki et al. | |

FOREIGN PATENT DOCUMENTS

| | | |
|---|---|---|
| EP | 2226847 A | 9/2010 |
| EP | 2421031 A | 2/2012 |
| JP | 60-198861 A | 10/1985 |
| JP | 62-194675 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-125970 A | 4/1992 |
| JP | 05-251705 A | 9/1993 |
| JP | 06-151851 A | 5/1994 |
| JP | 06-237008 A | 8/1994 |
| JP | 08-160469 A | 6/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-352087 A | 12/2006 |
| JP | 2011-049529 A | 3/2011 |
| JP | 2011-054949 A | 3/2011 |
| JP | 2011-091382 A | 5/2011 |
| JP | 2011-124360 A | 6/2011 |
| JP | 2011-129900 A | 6/2011 |
| JP | 2011-172217 A | 9/2011 |
| JP | 2011-228689 A | 11/2011 |
| JP | 2011-258926 A | 12/2011 |
| JP | 2012-023346 A | 2/2012 |
| JP | 2012-033908 A | 2/2012 |
| JP | 2012-064929 A | 3/2012 |
| JP | 2013-123045 A | 6/2013 |
| KR | 2008-0060995 A | 7/2008 |
| KR | 2011-0138185 A | 12/2011 |
| KR | 2012-0005055 A | 1/2012 |
| KR | 2012-0091293 A | 8/2012 |
| KR | 2012-0127713 A | 11/2012 |
| KR | 2013-0052513 A | 5/2013 |
| TW | 201220687 | 5/2012 |
| WO | WO-2004/114391 | 12/2004 |
| WO | WO-2010/047217 | 4/2010 |
| WO | WO-2011/055631 | 5/2011 |
| WO | WO-2011/062058 | 5/2011 |
| WO | WO-2011/089841 | 7/2011 |
| WO | WO-2011/122363 | 10/2011 |
| WO | WO-2012/002292 | 1/2012 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the I2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=lnteger) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZNO TFT", IMID '07 Digest, 2007, pp. 1249-1252.

Park.S et al., "42.3: Transparent ZnO Thin Film Transistor for the Application of High Aperture Ratio Bottom Emission AM-OLED

(56) References Cited

OTHER PUBLICATIONS

Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/066492) dated Sep. 16, 2014.

Written Opinion (Application No. PCT/JP2014/066492) dated Sep. 16, 2014.

\* cited by examiner

Source Side

Drain Side

In Whole

Source Side + Dual Gate Driving

L > Lov

L = Lov

In Whole

Without GE2

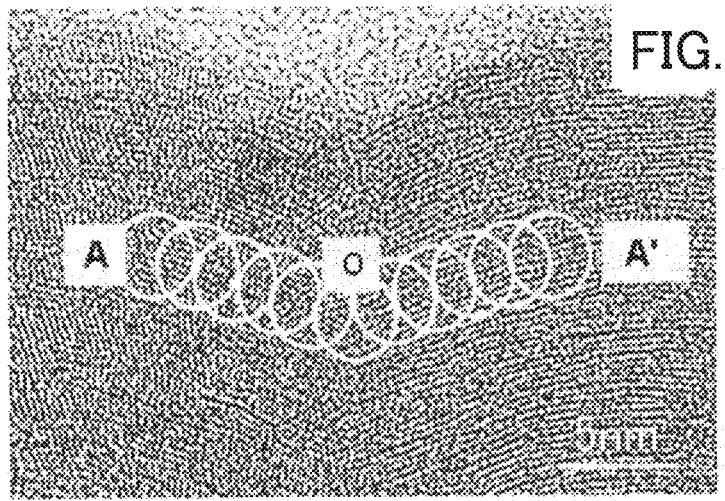
FIG. 34A
FIG. 34B
FIG. 34C
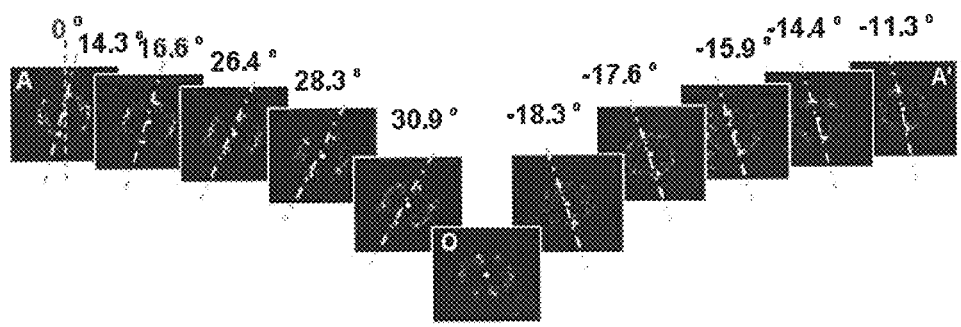

CAAC-OS nc-OS

□ proportion of non-CAAC    ▤ proportion of CAAC as-sputtered after heat treatment at 450°C

SEMICONDUCTOR DEVICE

CROSS-REFERENCE TO RELATED APPLICATIONS

This application is a divisional of U.S. application Ser. No. 14/313,008, filed Jun. 24, 2014, now pending, which claims the benefit of foreign priority applications filed in Japan as Serial No. 2013-134865 on Jun. 27, 2013, and Serial No. 2013-156551 on Jul. 29, 2013, all of which are incorporated by reference.

TECHNICAL FIELD

The present invention relates to a semiconductor device.

In this specification and the like, a semiconductor device generally means a device that can function by utilizing semiconductor characteristics. A semiconductor element such as a transistor; a power device; an integrated circuit, a power supply circuit, or a power converter circuit each including a power device; a semiconductor circuit; an arithmetic unit; a memory device; an imaging device; an electro-optical device; a power generation device (e.g., a thin film solar cell and an organic thin film solar cell); and an electronic appliance may include a semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a storage device, a method for driving any of them, and a method for manufacturing any of them.

BACKGROUND ART

A technique by which transistors are formed using semiconductor thin films formed over a substrate having an insulating surface has attracted attention. The transistor is used in a wide range of electronic appliances such as an integrated circuit (IC) or an image display device (also simply referred to as a display device). As semiconductor thin films that can be used in the transistors, silicon-based semiconductor materials have been widely used, but oxide semiconductors have attracted attention as alternative materials.

As a semiconductor device used for a power device, a power device manufactured with the use of silicon is widely prevalent. However, the performance of a power device including silicon is reaching its limit, and it is becoming difficult to achieve higher performance.

Silicon has a narrow band gap; therefore, the operation range of the power device including silicon is limited at high temperature. Thus, in recent years, a power device including SiC or GaN, which has a wide band gap, has been developed.

The use of an oxide semiconductor in a semiconductor device which is used as a power device for high-power application is disclosed (see Patent Documents 1 and 2).

REFERENCE

Patent Document

[Patent Document 1] Japanese Published Patent Application No. 2011-91382
[Patent Document 2] Japanese Published Patent Application No. 2011-172217

DISCLOSURE OF INVENTION

It is desirable that a large current flow in a transistor used in a semiconductor device for high-power application such as a power device. It is also desirable that tolerance to a high driving voltage be ensured. It is also desirable that a normal operation can be performed even at a high temperature.

It is desirable that the threshold voltage of a transistor be controlled to be an appropriate value in order to reduce the power consumption of a semiconductor device including a transistor.

An object of one embodiment of the present invention is to provide a semiconductor device in which a large current can flow. Another object is to provide a semiconductor device which can be driven stably at a high driving voltage. Another object is to provide a semiconductor device capable of high temperature operation. Another object is to provide a semiconductor device in which the threshold voltage is easily controlled. Another object is to provide a semiconductor device with reduced power consumption. Another object is to provide a highly reliable semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a semiconductor layer, a first electrode and a second electrode electrically connected to the semiconductor layer and apart from each other in a region overlapping with the semiconductor layer, a first gate electrode and a second gate electrode with the semiconductor layer therebetween, a first gate insulating layer between the semiconductor layer and the first gate electrode, and a second gate insulating layer between the semiconductor layer and the second gate electrode. The first gate electrode is provided to overlap with part of the first electrode, the semiconductor layer, and part of the second electrode, and the second gate electrode is provided to overlap with the semiconductor layer and part of the first electrode and so as not to overlap with the second electrode.

In the above structure, it is preferable that the first electrode serve as a source electrode and the second electrode serve as a drain electrode. Alternatively, it is preferable that the first electrode serve as a drain electrode and the second electrode serve as a source electrode.

Furthermore, a potential lower than a potential applied to the first electrode is preferably applied to the second gate electrode.

In the above structure, it is preferable that a third gate electrode be further included, the third gate electrode be provided to overlap with the semiconductor layer and part of the second electrode with the second gate insulating layer therebetween and so as not to overlap with the first electrode, and the second gate electrode and the third gate electrode be apart from each other in a region overlapping with the semiconductor layer.

Furthermore, it is preferable that the first gate electrode be electrically connected to the third gate electrode.

Furthermore, it is preferable that the semiconductor layer have an island shape, the second electrode have a ring shape having an opening overlapping with the semiconductor layer, and the first electrode be provided inside the opening. Alternatively, it is preferable that the semiconductor layer have an island shape, the first electrode have a ring shape having an opening overlapping with the semiconductor layer, and the second electrode be provided inside the opening.

Furthermore, the semiconductor layer preferably includes an oxide semiconductor layer. At this time, it is preferable that an oxide layer be provided on the opposite side of the semiconductor layer with the second gate insulating layer therebetween, and the oxide layer contain oxygen at a higher proportion than oxygen in a stoichiometric composition.

Furthermore, it is preferable that a first oxide layer be further provided between the semiconductor layer and the second gate insulating layer, and a second oxide layer be further provided between the semiconductor layer and the first gate insulating layer. Here, it is more preferable that the first oxide layer and the second oxide layer each contain one or more of the metal elements contained in the semiconductor layer.

Another embodiment of the present invention is a semiconductor device including a semiconductor layer, a source electrode and a drain electrode which are electrically connected to the semiconductor layer and apart from each other in a region overlapping with the semiconductor layer, a first gate electrode and a second gate electrode with the semiconductor layer therebetween, a first gate insulating layer between the semiconductor layer and the first gate electrode, and a second gate insulating layer between the semiconductor layer and the second gate electrode. The first gate electrode is provided to overlap with part of the source electrode, the semiconductor layer, and part of the drain electrode, and the second gate electrode is provided to overlap with the semiconductor layer and part of the source electrode and so as not to overlap with the drain electrode.

Another embodiment of the present invention is a semiconductor device including a semiconductor layer, a source electrode and a drain which are electrode electrically connected to the semiconductor layer and apart from each other in a region overlapping with the semiconductor layer, a first gate electrode and a second gate electrode with the semiconductor layer therebetween, a first gate insulating layer between the semiconductor layer and the first gate electrode, and a second gate insulating layer between the semiconductor layer and the second gate electrode. The first gate electrode is provided to overlap with part of the source electrode, the semiconductor layer, and part of the drain electrode. The second gate electrode is provided to overlap with the semiconductor layer and part of the drain electrode, so as not to overlap with the source electrode, and so that an end portion of the source electrode on the drain electrode side is apart from an end portion of the second gate electrode on the source electrode side when seen from the top.

According to the present invention, a semiconductor device in which a large current can flow can be provided. In addition, a semiconductor device which can be driven stably at a high driving voltage can be provided. In addition, a semiconductor device capable of high temperature operation can be provided. In addition, a semiconductor device in which the threshold voltage is easily controlled can be provided. In addition, a semiconductor device with reduced power consumption can be provided. In addition, a highly reliable semiconductor device can be provided.

BRIEF DESCRIPTION OF DRAWINGS

In the accompanying drawings:

FIGS. 34A to 34C are high-resolution cross-sectional TEM images and a local Fourier transform image of an oxide semiconductor;

BEST MODE FOR CARRYING OUT THE INVENTION

Figure 1A:
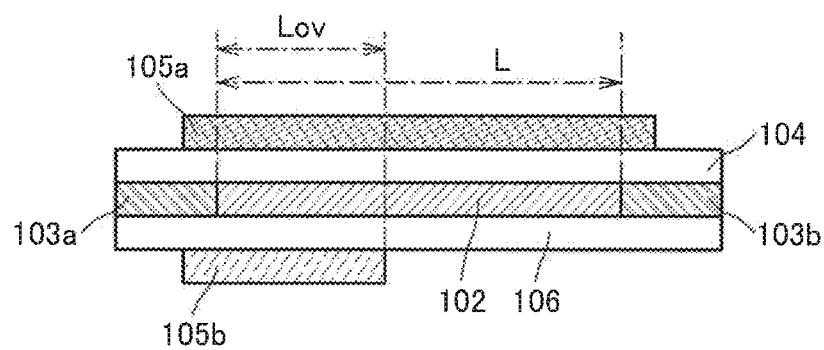
FIGS. 1A to 1C each illustrate a structural example of a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a structural example of a semiconductor device of one embodiment of the present invention is described with reference to drawings. Here, a transistor is described as an example of the semiconductor device.

Structural Example 1

Figure 1B:
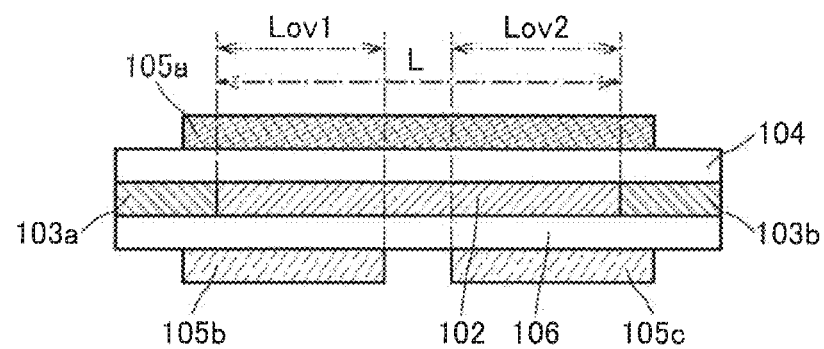
Figure 1C:
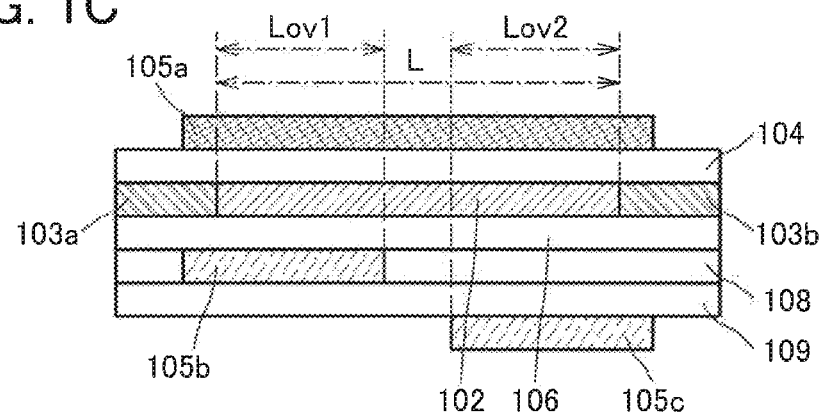

FIGS. 1A to 1C are schematic cross-sectional views in the channel length direction each for illustrating a positional relationship between typical components in a structural example of a transistor of one embodiment of the present invention.

A transistor in FIG. 1A includes a semiconductor layer 102, a first electrode 103a and a second electrode 103b which are electrically connected to the semiconductor layer 102, a first gate electrode 105a overlapping with the semiconductor layer 102 with an insulating layer 104 therebetween, and a second gate electrode 105b provided to oppose the first gate electrode 105a with the semiconductor layer 102 therebetween and overlapping with part of the semiconductor layer 102 with an insulating layer 106 therebetween.

In FIG. 1A, the first gate electrode 105a is positioned above the second gate electrode 105b; however, the positional relationship in a vertical direction is not limited thereto.

In the semiconductor layer 102, a region where a channel is formed contains a semiconductor such as silicon; however, the region preferably contains a semiconductor having a wider band gap than that of silicon. The semiconductor layer 102 preferably contains an oxide semiconductor.

For example, the semiconductor layer 102 preferably contains at least indium (In) or zinc (Zn) as the oxide semiconductor. More preferably, the semiconductor layer 102 contains an oxide represented by an In-M-Zn-based oxide (M is a metal such as Al, Ti, Ga, Ge, Y, Zr, Sn, La, Ce, or Hf).

An oxide semiconductor having a wider band gap than that of silicon is used in the semiconductor layer 102 in which a channel is formed, whereby a change in the electrical characteristics of a transistor can be made extremely small even at a high temperature. That is, by using an oxide semiconductor in the semiconductor layer 102, a transistor which can operate stably at a high temperature can be obtained.

Moreover, an oxide semiconductor having a wider band gap than that of silicon is applied to the semiconductor layer 102, whereby tolerance to hot-carrier degradation can be increased, and a high drain withstand voltage can be given to the transistor. Thus, a transistor which is driven stably at a high driving voltage can be obtained.

Here, the hot-carrier degradation means deterioration of transistor characteristics, e.g., shift in threshold voltage or gate leakage, which is caused as follows: electrons that are accelerated to be rapid are injected in the vicinity of a drain in a channel into a gate insulating layer and become fixed electric charge, trap levels at the interface between the gate insulating layer and the oxide semiconductor are formed, or the like. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and the number of electrons that are accelerated to be so rapid as to go over a barrier to the gate insulating layer is increased. However, the oxide semiconductor in this embodiment has a wide band gap; therefore, the avalanche breakdown is unlikely to occur and resistance to the hot-carrier degradation is higher than that of silicon.

As described above, it can be said that the transistor has a high drain withstand voltage. Therefore, such a transistor is suitable for a power device such as an insulated-gate field-effect transistor (IGFET).

The first electrode 103a serves as a source electrode of the transistor. The second electrode 103b serves as a drain electrode of the transistor.

Here, the first gate electrode 105a is provided to overlap with the semiconductor layer 102 between an end portion of the first electrode 103a and an end portion of the second electrode 103b.

On the other hand, the second gate electrode 105b is provided to overlap with part of the semiconductor layer 102 on the first electrode 103a side. In other words, the semiconductor layer 102 on the second electrode 103b side has a region not overlapping with the second gate electrode 105b (also referred to as an offset region).

Here, as illustrated in FIG. 1A, the distance between the first electrode 103a and the second electrode 103b is referred to as a channel length L, and the length of a region where the semiconductor layer 102 and the second gate electrode 105b overlap with each other in the channel length direction is referred to as an overlap length $L_{ov}$.

The ratio of the overlap length $L_{ov}$ to the channel length L (that is, $L_{ov}/L$) is 0 or more and less than 1, preferably 0 or more and 0.5 or less, more preferably, 0 or more and 0.25 or less. Actually, the ratio varies within a range of ±10%.

A potential to control an on state of the transistor can be applied to the first gate electrode 105a. For example, a potential to turn on the transistor or a potential to turn off the transistor is applied. By applying such a potential, a switching operation of the transistor can be performed.

A potential to control the threshold voltage of the transistor can be applied to the second gate electrode 105b. Preferably, a potential lower than the potential applied to the first electrode 103a serving as the source electrode is applied. By applying such a potential, the threshold voltage of the transistor can be shifted in a positive direction. Particularly, by applying an appropriate potential to the second gate electrode 105b, characteristics of a normally-off transistor can be obtained.

By applying the above potential to each gate electrode of the transistor having such a structure, the threshold voltage of the transistor can be controlled. Moreover, the field-effect mobility of the transistor can be improved and a current between the source and the drain in an on state (also referred to as an on-state current) can be increased. In addition, electric field concentration in the vicinity of the drain can be relieved and withstand voltage between the source and the drain (also referred to as drain withstand voltage) can be improved.

A transistor illustrated in FIG. 1B is different from the transistor illustrated in FIG. 1A in that a third gate electrode 105c is included. The third gate electrode 105c is provided to overlap with part of the semiconductor layer 102 on the second electrode 103b side. In other words, the semiconductor layer 102 has a region not overlapping with the third gate electrode 105c and the second gate electrode 105b (also referred to as an offset region).

Here, as illustrated in FIG. 1B, the two gate electrodes of the second gate electrode 105b and the third gate electrode 105c are provided to oppose the first gate electrode 105a with the semiconductor layer 102 therebetween. Thus, in order to distinguish the overlap lengths between the semiconductor layer 102 and each of the gate electrodes from each other, in the region between the first electrode 103a and the second electrode 103b, the overlap length between the semiconductor layer 102 and the second gate electrode 105b is referred to as $L_{ov1}$, and the overlap length between the semiconductor layer 102 and the third gate electrode 105c is referred to as $L_{ov2}$.

The ratio of the overlap length $L_{ov2}$ of the third gate electrode 105c to the channel length L (that is, $L_{ov2}/L$) is 0 or more and 0.75 or less, preferably 0 or more and 0.5 or less. At this time, the distance between the second gate electrode 105b and the third gate electrode 105c is set to be more than 0 and L or less, preferably L/8 or more and L or less so that the second gate electrode 105b and the third gate electrode 105c do not overlap with each other. Actually, the ratio varies within a range of ±10%.

Here, when the overlap length $L_{ov2}$ between the third gate electrode 105c and the semiconductor layer 102 is longer than or equal to the overlap length $L_{ov1}$ between the second gate electrode 105b and the semiconductor layer 102, the effect of improving the field-effect mobility is increased, which is preferable.

Here, a potential to control an on state of the transistor is preferably applied to the third gate electrode 105c. In particular, it is preferable to apply the same potential as the potential applied to the first gate electrode 105a. At this time, the third gate electrode 105c may be electrically connected to the first gate electrode 105a through a wiring, a plug, or the like which is not illustrated. With such a structure, a wiring supplying potentials to the first gate electrode 105a and the third gate electrode 105c is shared, whereby the circuit configuration can be simplified.

Note that the potential applied to the third gate electrode 105c is not limited to the above potential, and may be a potential higher than or lower than the potential applied to the first gate electrode 105a in consideration of the thickness and the material of the insulating layer 106. Furthermore, a signal which is different in timing of rising or falling the potential from a signal input to the first gate electrode 105a (a signal whose potential level is changed over time) may be input to the third gate electrode 105c.

By using such a driving method, field-effect mobility of the transistor is further improved and the on-state current can be increased.

In a transistor illustrated in FIG. 1C, the third gate electrode 105c is placed more apart from the semiconductor layer 102 than the second gate electrode 105b.

The third gate electrode 105c is provided to overlap with part of the semiconductor layer 102 with the insulating layer 106, an insulating layer 108, and an insulating layer 109 therebetween.

In FIG. 1C, the second gate electrode 105b and the third gate electrode 105c do not overlap with each other; however, the third gate electrode 105c may be provided to overlap with part of the second gate electrode 105b.

Furthermore, here, the third gate electrode 105c is placed more apart from the semiconductor layer 102 than the second gate electrode 105b; however, the second gate electrode 105b may be placed more apart from the semiconductor layer 102 than the third gate electrode 105c.

As described above, the transistor of one embodiment of the present invention can obtain both a large drain current and a high drain withstand voltage, which can be favorably used in a semiconductor device for high-power application. Furthermore, a semiconductor material having a wider band gap than that of silicon is applied to the semiconductor layer, whereby a stable operation can be performed even at a high temperature. In particular, in the transistor of one embodiment of the present invention, a large current can flow, so that self-heating at the time of driving is enhanced in some cases. In the semiconductor device for high-power application, the temperature of usage environment becomes high because of heat generation from other elements in some cases. However, the transistor of one embodiment of the present invention can maintain its stable electrical characteristics even in such high temperature environments, and the reliability of the semiconductor device using the transistor in high temperature environments can be improved.

Furthermore, the transistor of one embodiment of the present invention can obtain a high drain withstand voltage and high field-effect mobility, which can reduce the channel length and the channel width and reduce the area occupied by an element. Thus, the transistor can be preferably applied to the device in which high integration and miniaturization of an element are needed. For example, in an image display device including a plurality of pixels, high definition pixels can be achieved. In addition, the transistor can be preferably applied to an IC such as a memory device or an arithmetic unit in which high integration is needed.

The above is the description of Structural Example 1 of the transistor.

Structural Example 2

Structural examples different from Structural Example 1 are described below. Note that portions similar to those described in Structural Example 1 are not described in some cases.

Figure 2A:
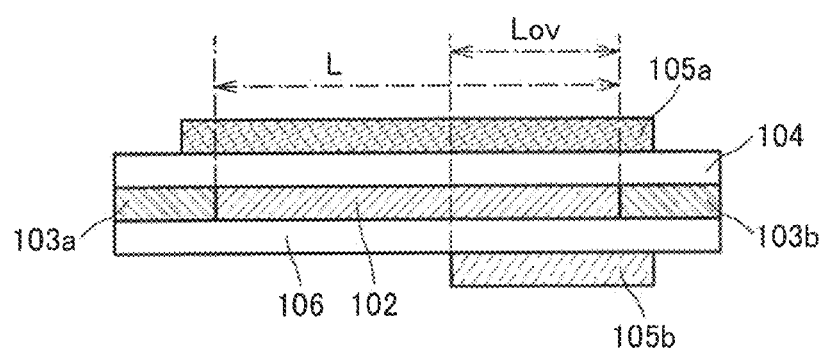
FIGS. 2A and 2B each illustrate a structural example of a semiconductor device of an embodiment.
Figure 2B:
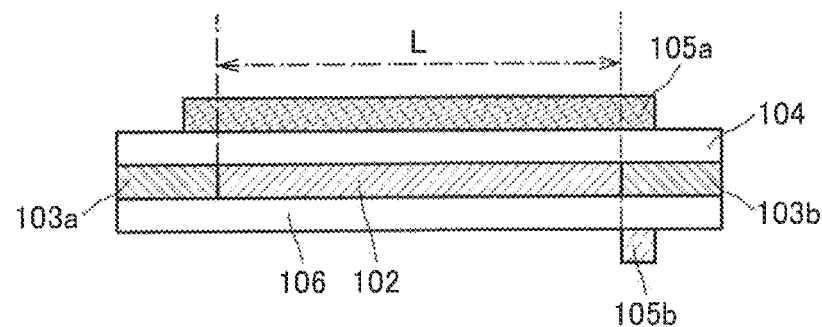

FIGS. 2A and 2B are schematic cross-sectional views in the channel length direction each for illustrating a positional relationship between typical components in a structural example of a transistor of one embodiment of the present invention.

A transistor in FIG. 2A includes a semiconductor layer 102, a first electrode 103a and a second electrode 103b which are electrically connected to the semiconductor layer 102, a first gate electrode 105a overlapping with the semiconductor layer 102 with an insulating layer 104 therebetween, and a second gate electrode 105b provided to oppose the first gate electrode 105a with the semiconductor layer 102 therebetween and overlapping with part of the semiconductor layer 102 with an insulating layer 106 therebetween.

In FIG. 2A, the first gate electrode 105a is positioned above the second gate electrode 105b; however, the positional relationship in a vertical direction is not limited thereto.

The first electrode 103a serves as a source electrode of the transistor. The second electrode 103b serves as a drain electrode of the transistor.

Here, the first gate electrode 105a is provided to overlap with the semiconductor layer 102 between an end portion of the first electrode 103a and an end portion of the second electrode 103b.

On the other hand, the second gate electrode 105b is provided to overlap with part of the semiconductor layer 102 on the second electrode 103b side. In other words, the semiconductor layer 102 on the first electrode 103a side has a region not overlapping with the second gate electrode 105b (also referred to as an offset region).

Specifically, the second gate electrode 105b overlaps with part of the second electrode 103b and part of the semiconductor layer 102 and does not overlap with the first electrode 103a. The second gate electrode 105b is provided so that an end portion of the first electrode 103a on the second electrode 103b side is apart from an end portion of the second gate electrode 105b on the first electrode 103a side when seen from the top.

Here, as illustrated in FIG. 2A, the distance between the first electrode 103a and the second electrode 103b is referred to as a channel length L, and the length of a region where the semiconductor layer 102 and the second gate electrode 105b overlap with each other in the channel length direction is referred to as an overlap length $L_{ov}$.

The ratio of the overlap length $L_{ov}$ to the channel length L (that is, $L_{ov}/L$) is 0 or more and less than 1, preferably 0 or more and 0.5 or less, more preferably, 0 or more and 0.25 or less, further more preferably, 0 or more and 0.1 or less. Actually, the ratio varies within a range of ±10%.

The second gate electrode 105b to which such a potential is applied is placed on the second electrode 103b side, which serves as a drain electrode, to make an offset region. In this case, the amount of shift of the threshold voltage can be equivalent, the field-effect mobility of the transistor can be improved, and the on-state current can be increased, as compared to the case where the offset region is not provided.

When the potential applied to the second gate electrode 105b is kept constant, the longer the overlap length $L_{ov}$ is, the larger the amount of shift of the threshold voltage is. As the overlap length $L_{ov}$ comes close to 0, the field-effect mobility can be improved and the on-state current can be increased. In terms of the on-state current, the overlap length $L_{ov}$ is preferably close to 0; however, the overlap length $L_{ov}$ is preferably set as appropriate in consideration of the driving voltage of the transistor and the desirable amount of shift of the threshold voltage.

Here, a potential higher than the potential applied to the first electrode 103a serving as the source electrode can be applied to the second gate electrode 105b. By applying such a potential, the threshold voltage of the transistor can be shifted in a negative direction.

Alternatively, a potential to control an on state of the transistor can be applied to the second gate electrode 105b. For example, it is preferable to apply the same potential as the potential applied to the first gate electrode 105a. At this time, the second gate electrode 105b may be electrically connected to the first gate electrode 105a through a wiring, a plug, or the like which is not illustrated. With such a structure, a wiring supplying potentials to the first gate electrode 105a and the second gate electrode 105b is shared, whereby the circuit configuration can be simplified.

Note that the potential to control an on state of the transistor, which is applied to the second gate electrode 105b, is not limited to the above potential, and may be a potential higher than or lower than the potential applied to the first gate electrode 105a in consideration of the thickness and the electrical characteristics of the insulating layer 106. Furthermore, a signal which is different in timing of rising or falling the potential from a signal input to the first gate electrode 105a (a signal whose potential level is changed over time) may be input to the second gate electrode 105b.

By applying such a potential to the second gate electrode 105b, a channel region formed in the semiconductor layer 102 is enlarged, so that the field-effect mobility of the transistor can be improved and the on-state current can be increased.

A transistor illustrated in FIG. 2B is different from the transistor illustrated in FIG. 2A in that the overlap length $L_{ov}$ between the second gate electrode 105b and the semiconductor layer 102 is 0. The second gate electrode 105b is provided so that the end portion on the semiconductor layer 102 side is substantially aligned with an end portion of the second electrode 103b as seen from the top.

Even when the overlap length $L_{ov}$ is 0, an electric field generated by the second gate electrode 105b is applied to a region from the second electrode 103b to the semiconductor layer 102 in an oblique direction; thus, the effect similar to the above effect can be obtained.

In this manner, by applying an appropriate potential to the second gate electrode, the transistor of one embodiment of the present invention can have normally-off characteristics. Moreover, an oxide semiconductor is used for the semiconductor layer, whereby a leakage current in an off state (also referred to as an off-state current) can be extremely small. Thus, the power consumption of a semiconductor device provided with the transistor of one embodiment of the present invention can be reduced.

Moreover, the transistor of one embodiment of the present invention has more excellent drain withstand voltage than a transistor in which silicon is used for a semiconductor layer, and thus can be preferably used for the device in which high drain withstand voltage is needed. Moreover, the threshold voltage of the transistor of one embodiment of the present invention can be easily controlled, and a high drain current can flow in the transistor even when the transistor has normally-off characteristics by shifting the threshold voltage; therefore, the transistor of one embodiment of the present invention can be preferably used for the device in which high efficiency and low power consumption are needed. For example, the transistor can be preferably used for a power supply circuit, a power conversion circuit such as a DC-DC converter and an inverter, a transmitting circuit or a receiving circuit for transmitting and receiving a signal, a power receiving circuit which receives power, and the like.

Furthermore, a semiconductor material having a wider band gap than that of silicon is applied to the semiconductor layer, whereby a stable operation can be performed even at a high temperature. In particular, in the transistor of one embodiment of the present invention, a large current can flow, so that self-heating at the time of driving is enhanced in some cases. In the semiconductor device for high-power application, the temperature of usage environment becomes high because of heat generation from other elements in some cases. However, the transistor of one embodiment of the present invention can maintain its stable electrical characteristics even in such high temperature environments, and the reliability of the semiconductor device using the transistor in high temperature environments can be improved.

In addition, the transistor of one embodiment of the present invention can obtain a high drain withstand voltage and high field-effect mobility, which can reduce the channel length and the channel width and reduce the area occupied by an element. Thus, the transistor can be preferably applied to the device in which high integration and miniaturization of an element are needed. For example, in an image display device including a plurality of pixels, high definition pixels can be achieved. In addition, the transistor can be preferably applied to an IC such as a memory device or an arithmetic unit in which high integration is needed.

The above is the description of Structure Example 2.

In Structural Examples 1 and 2, one of the first electrode 103a and the second electrode 103b can serve as a source electrode and the other can serve as a drain electrode. The functions are interchanged with each other in some cases depending on the driving method of the transistor.

[Calculation Verification 1]

In the structures of transistor shown in Structural Example 1, verification results of the effect of layout of each gate electrode on electrical characteristics of the transistor are shown below.

<Calculation Model>

First, models of the transistor used for calculation are illustrated in FIGS. 3A to 3D.

Figure 3A:
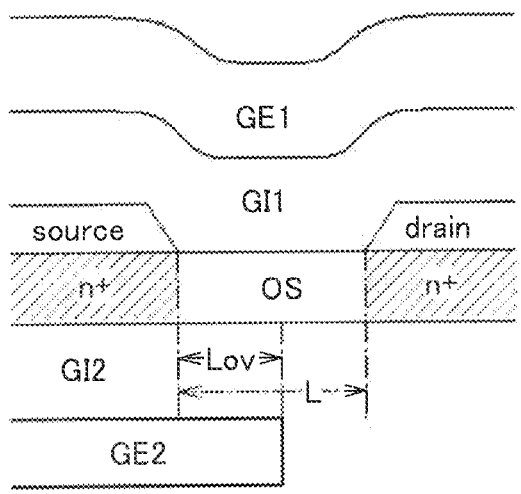
FIGS. 3A to 3D each illustrate a structural model used for calculation of an embodiment.

A transistor in FIG. 3A includes a first gate insulating layer (GI1) over a semiconductor layer (OS) and includes a first gate electrode (GE1) over the first gate insulating layer (GI1). Over the semiconductor layer (OS), a source electrode (Source) and a drain electrode (Drain) are arranged to be apart from each other. In regions of the semiconductor layer (OS) which overlap with the source electrode (Source) and the drain electrode (Drain), regions having high donor density ($n^+$) are formed. A second gate insulating layer (GI2) is placed under the semiconductor layer (OS), and a second gate electrode (GE2) overlapping with the source electrode (Source) and part of the semiconductor layer (OS) is placed under the second gate insulating layer (GI2). That is, the second gate electrode (GE2) is placed only on the source electrode (Source) side. Here, the distance between the source electrode (Source) and the drain electrode (Drain) is referred to as a channel length L, and the length of a region where the second gate electrode (GE2) and the semiconductor layer (OS) overlap with each other between the source electrode (Source) and the drain electrode (Drain) is referred to as $L_{ov}$.

Figure 3B:
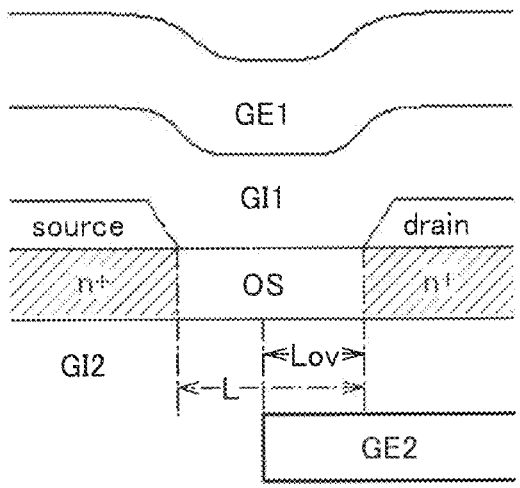

A transistor in FIG. 3B is different from the transistor in FIG. 3A in that the second gate electrode (GE2) is placed to overlap with the drain electrode (Drain) and part of the semiconductor layer (OS). That is, the second gate electrode (GE2) is placed on only the drain electrode (Drain) side. Here, as in FIG. 3A, the length of a region where the second gate electrode (GE2) and the semiconductor layer (OS) overlap with each other between the source electrode (Source) and the drain electrode (Drain) is referred to as $L_{ov}$.

Figure 3C:
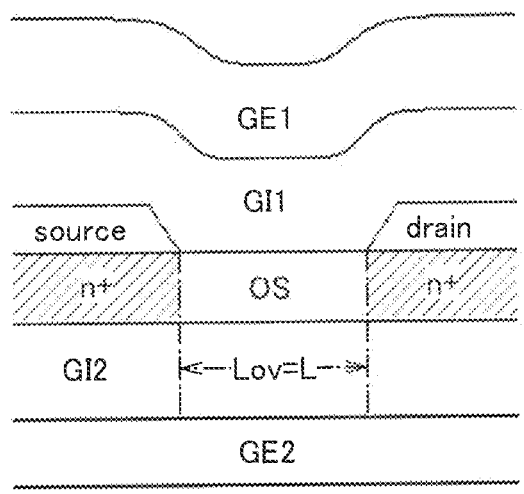

A transistor in FIG. 3C is different from the transistor in FIG. 3A in that the second gate electrode (GE2) is placed to overlap with the source electrode (Source), the drain electrode (Drain), and the semiconductor layer (OS) between an end portion of the source electrode (Source) and an end portion of the drain electrode (Drain). Note that in FIG. 3C, the case where the second gate electrode (GE2) overlaps with part of the source electrode (Source), part of the drain electrode (Drain), and the semiconductor layer (OS) placed in a region therebetween is denoted by "In Whole". Here, $L_{ov}$ which is the length of the region where the second gate electrode (GE2) and the semiconductor layer (OS) overlap with each other is equal to the channel length L.

Figure 3D:
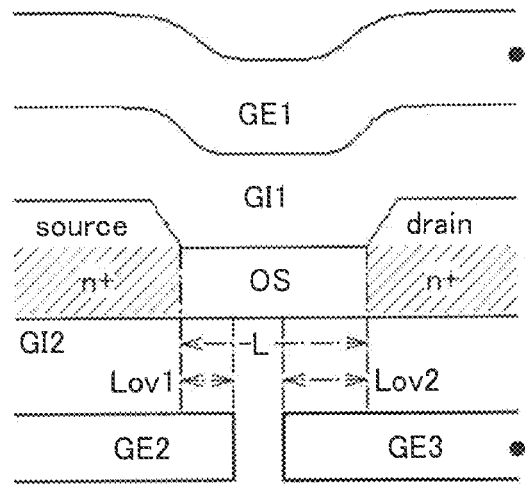

A transistor in FIG. 3D is different from the transistor in FIG. 3A in that a third gate electrode (GE3) overlapping with the drain electrode (Drain) and part of the semiconductor layer (OS) is further included. The third gate electrode (GE3) is electrically connected to the first gate electrode (GE1) in a region not illustrated, and the same potentials are applied to both electrodes. As described above, a driving method for applying the same potentials to two gate electrodes with a semiconductor layer therebetween is referred to as a dual-gate driving. Here, in a region between the source electrode (Source) and the drain electrode (Drain) of the transistor in FIG. 3D, the length of a region where the second gate electrode (GE2) and the semiconductor layer (OS) overlap with each other is referred to as $L_{ov1}$, and the length of a region where the third gate electrode (GE3) and the semiconductor layer (OS) overlap with each other is referred to as $L_{ov2}$.

Calculation using the calculation models is performed on the assumption that a semiconductor used for the semiconductor layer is an oxide semiconductor. For the calculation, device simulation software Sentaurus (manufactured by Synopsys, Inc.) was used.

Calculation conditions are shown in Table 1.

TABLE 1

Calculation Conditions

| | | |
|---|---|---|
| Structural parameters | Channel length (L) | 0.5 μm |
| | Channel width (W) | 1.0 μm |
| Gate insulating layer (GI1, GI2) | Relative permittivity | 4.1 |
| | Thickness | 20 nm |
| Oxide semiconductor layer (OS) | Electron affinity | 4.6 eV |
| | Eg | 3.2 eV |
| | Relative permittivity | 15 |
| | Donor density | 6.6E−09 cm$^{-3}$ |
| | Donor density (under SD) | 5.0E+18 cm$^{-3}$ |
| | Electron mobility | 15.0 cm$^2$/Vs |
| | Hole mobility | 0.01 cm$^2$/Vs |
| | Nc | 5.0E+18 cm$^{-3}$ |
| | Nv | 5.0E+18 cm$^{-3}$ |
| | Thickness | 15.0 nm |
| Gate electrode (GE1) | Work function | 5.0 eV |
| | Applied voltage | −3.0~3.0 V |
| Gate electrode (GE2, GE3) | Work function | 5.0 eV |
| | Thickness | 100 nm |
| | Applied voltage | −1.0 V |
| Source, Drain | Work function | 4.6 eV |
| | Applied voltage (Source) | 0.0 V |
| | Applied voltage (Drain) | 0.1, 3.0 V |

<Position Dependence of Second Gate Electrode>

Figure 4A:
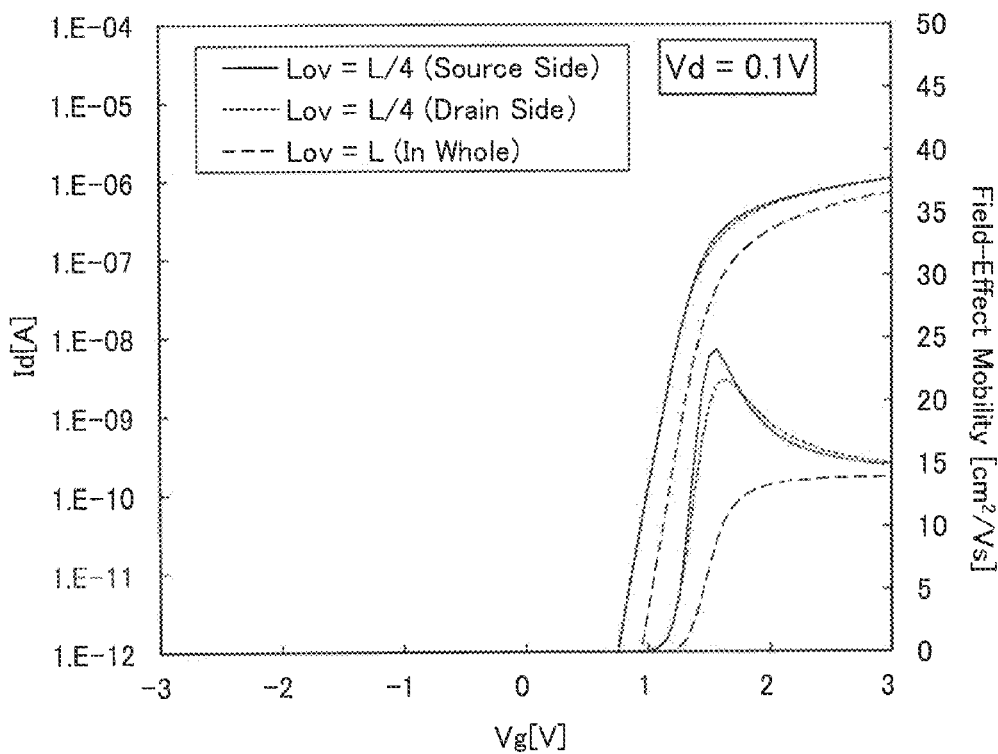
FIGS. 4A and 4B each show calculation results of transistor characteristics of an embodiment.
Figure 4B:
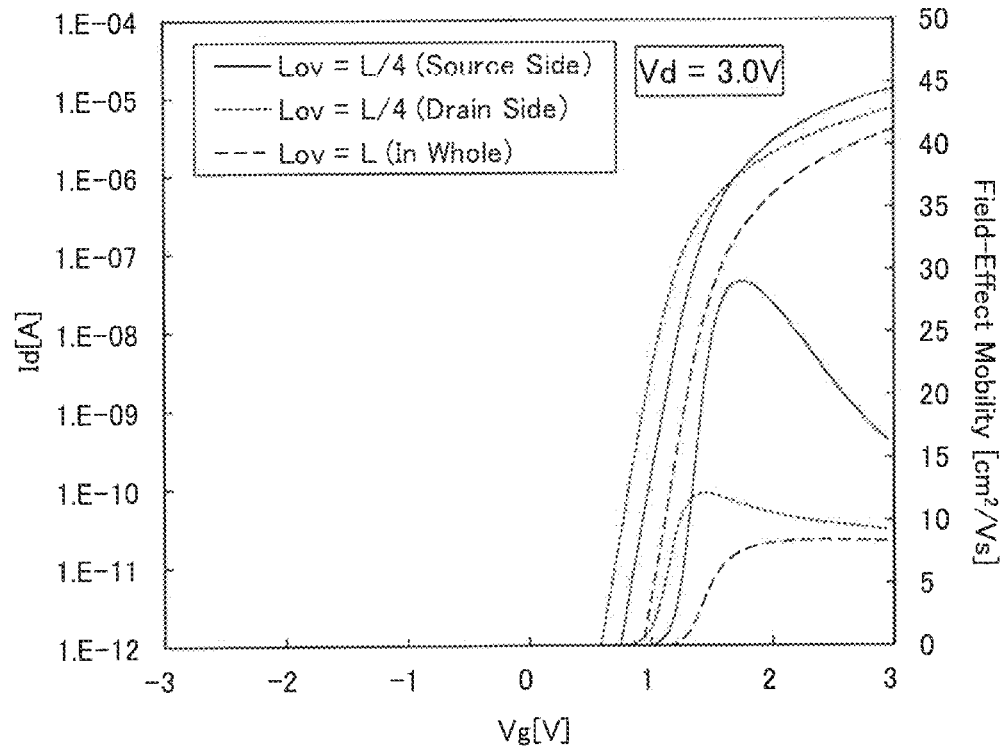

First, comparison results of transistor characteristics by changing the position of the second gate electrode (GE2) as illustrated in FIGS. 3A to 3C are shown in FIGS. 4A and 4B.

In FIG. 4A, calculation results of a relation between a gate-source voltage (hereinafter, referred to as gate voltage $V_g$) and a source-drain current (hereinafter, referred to as drain current $I_d$) (the relation is also referred to as $V_g$-$I_d$ characteristics) when a source-drain voltage (hereinafter, referred to as drain voltage $V_d$) is 0.1 V, and field-effect mobility are each plotted. FIG. 4B shows the results thereof when a drain voltage $V_d$ is 3.0 V. In FIGS. 4A and 4B, a solid line represents the result of the model in which the second gate electrode (GE2) is placed on the source side (FIG. 3A), a dotted line represents the result of the model in which the second gate electrode (GE2) is placed on the drain side (FIG. 3B), and a dashed line represents the result of the model in which the second gate electrode (GE2) is placed in a region from the source electrode side to the drain electrode side (FIG. 3C). Here, in the calculations of the two models in which the second gate electrode (GE2) is placed on the source side or the drain side, $L_{ov}$ is set to L/4.

Here, FIG. 4A shows results under a condition in which the drain voltage is sufficiently small, which corresponds to transistor characteristics in a linear region. On the other hand, FIG. 4B shows results under a condition in which the drain voltage is sufficiently large, which corresponds to transistor characteristics in a saturation region.

As shown in FIGS. 4A and 4B, even in the case where the second gate electrode (GE2) is placed on either the source side or the drain side, the threshold voltage can be shifted in the positive direction sufficiently. Moreover, in the case where the second gate electrode (GE2) is placed on one side (the source side or the drain side), the field-effect mobility is improved compared to the case where the second gate electrode (GE2) is placed to overlap with the semiconductor layer (OS) between the source electrode and the drain electrode. In particular, in the case where the second gate electrode (GE2) is placed on the source side, the field-effect mobility is higher than that in the case where the second gate electrode (GE2) is placed on the drain side. This tendency is remarkable in the saturation region compared to the linear region.

<Overlap Length Dependence of Second Gate Electrode>

Next, in the model in which the second gate electrode (GE2) is placed on the source side (FIG. 3A), comparison results of transistor characteristics by changing $L_{ov}$ are shown in FIGS. 5A and 5B and FIGS. 6A to 6C.

Figure 5A:
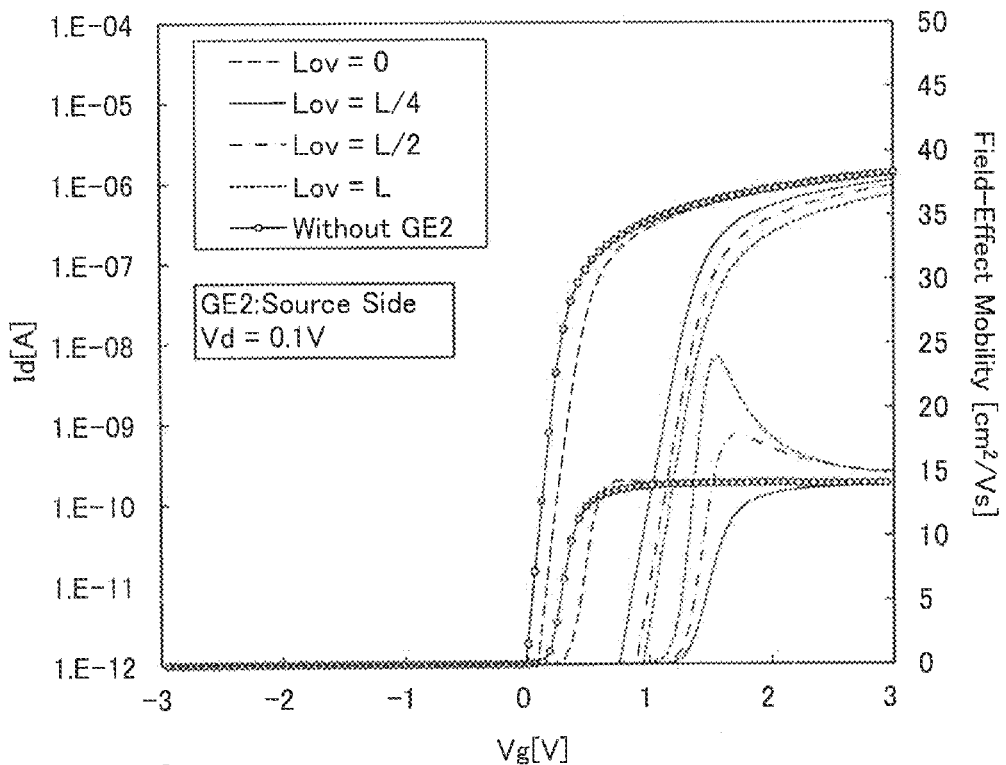
FIGS. 5A and 5B each show calculation results of transistor characteristics of an embodiment.
Figure 5B:
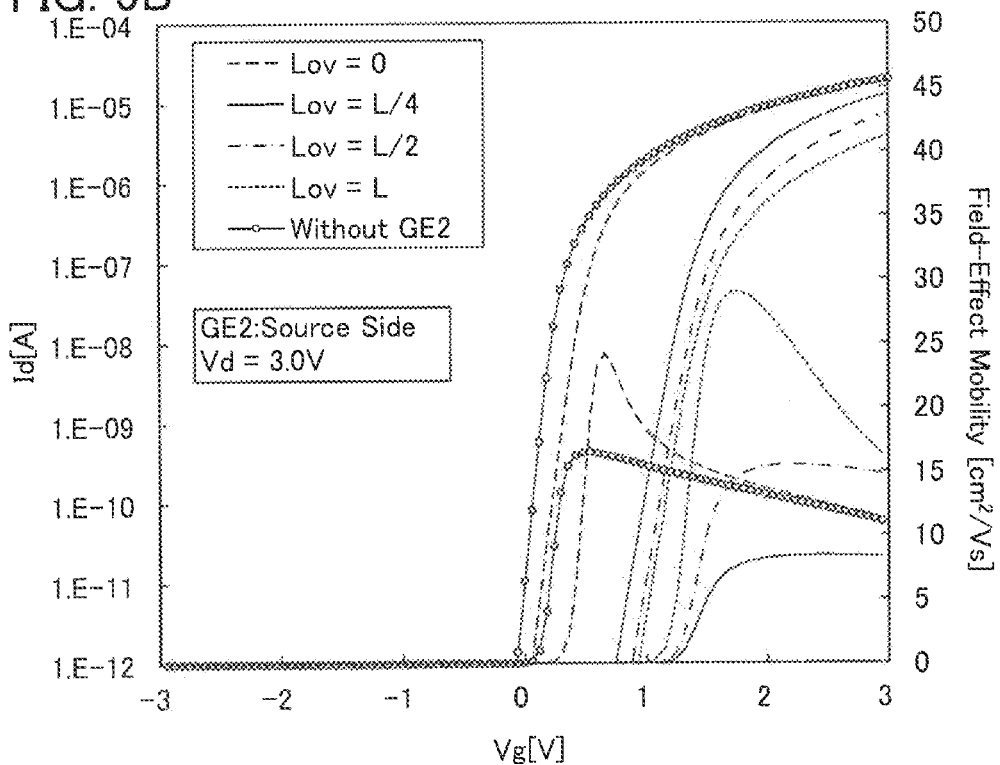

FIG. 5A shows calculation results in a linear region (drain voltage $V_d$ is 0.1 V), and FIG. 5B shows calculation results in a saturation region (drain voltage $V_d$ is 3.0 V).

Here, calculation is performed on the cases where $L_{ov}$ is 0, L/4, L/2, and L. The condition of $L_{ov}$ of 0 corresponds to the case where an end portion of the second gate electrode (GE2) is aligned with an end portion of the source electrode (Source). For comparison, calculation was also performed on the case where the second gate electrode (GE2) is not provided (without GE2).

Figure 6A:
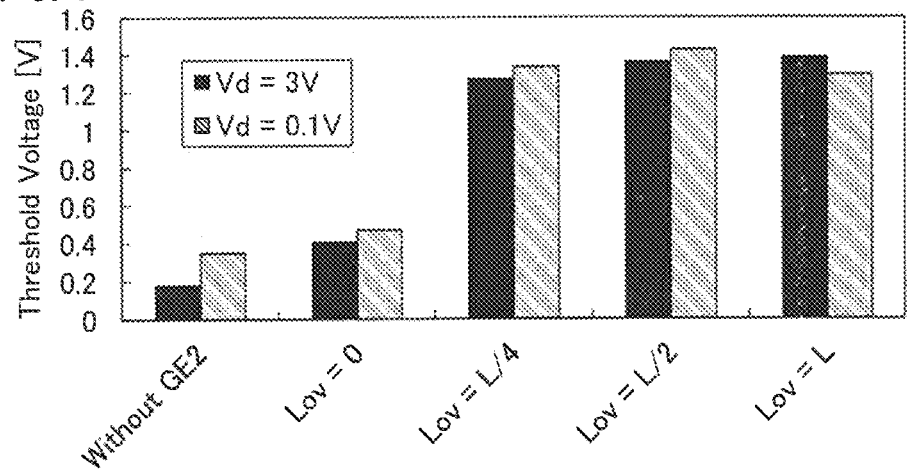
FIGS. 6A to 6C each show calculation results of transistor characteristics of an embodiment.
Figure 6B:
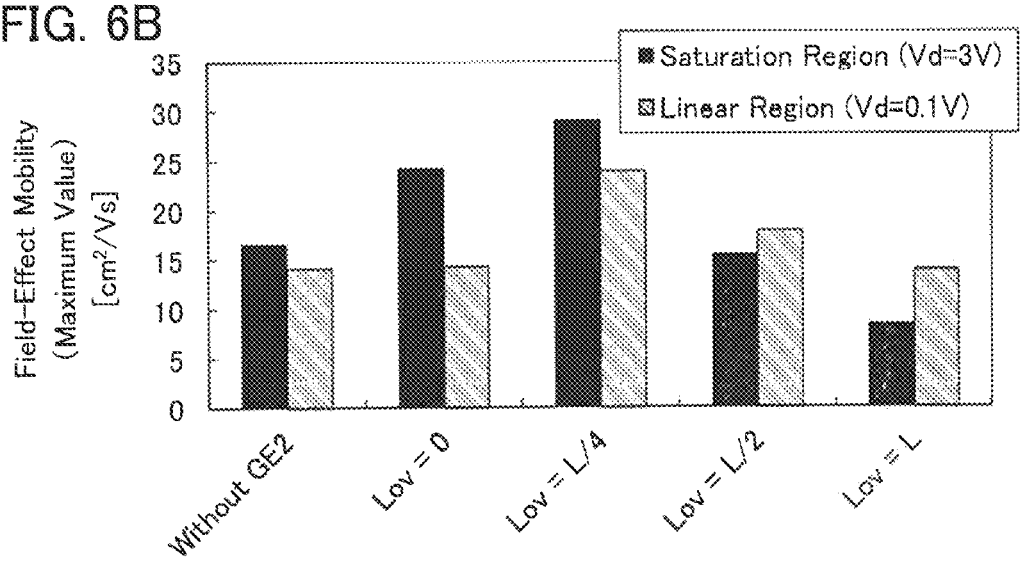
Figure 6C:
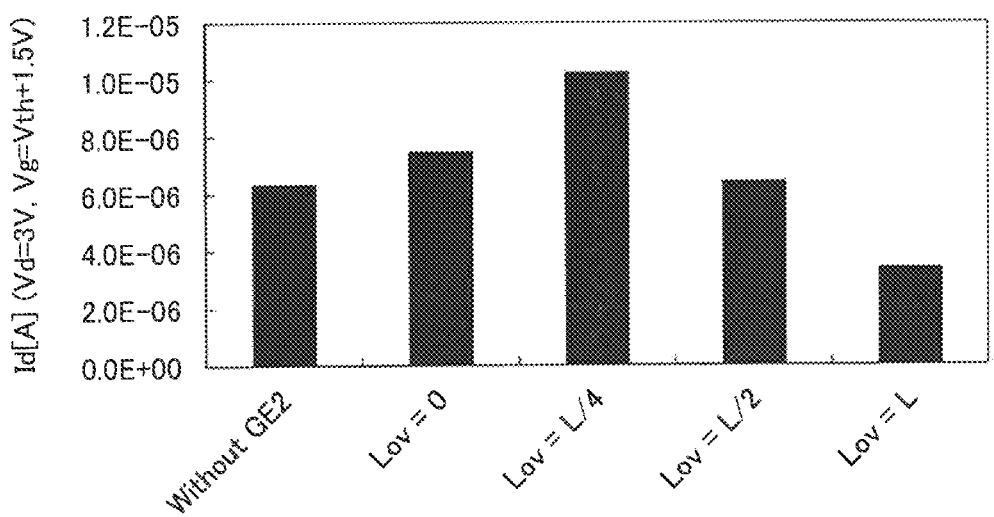

FIG. 6A shows the threshold voltage under each condition, which is calculated from each of the characteristics shown in FIGS. 5A and 5B. FIG. 6B shows a maximum value of the field-effect mobility under each condition. FIG. 6C shows a value of drain current $I_d$ under each condition. Here, in order to compare models under each condition easily, the drain current $I_d$ when the gate voltage $V_g$ is at a voltage higher than the threshold voltage by 1.5 V under a condition in a saturation region ($V_d$=3.0 V) is shown.

As shown in FIG. 6A, the threshold voltage can be shifted in the positive direction by providing the second gate electrode (GE2). Furthermore, as $L_{ov}$ is large, the amount of shift of the threshold voltage tends to be large. Even in the case where $L_{ov}$ is 0, that is, in the case where the second gate electrode (GE2) does not overlap with the semiconductor layer (OS), the threshold voltage can be shifted in the positive direction owing to the second gate electrode (GE2).

As shown in FIG. 6B, the field-effect mobility depends on $L_{ov}$. Specifically, in the case where $L_{ov}$ is L/2 or lower, the field-effect mobility can be improved as compared to the case where the second gate electrode (GE2) is not provided. Under the conditions shown in FIG. 6B, the maximum field-effect mobility is obtained under the condition of $L_{ov}$ of L/4, and the field-effect mobility is gradually lowered under the condition of $L_{ov}$ of 0 and the condition of "without GE2" in this order in the saturation region, and the field-effect mobility is gradually lowered under the condition of $L_{ov}$ of L/2 and the condition of $L_{ov}$ of 0 in this order in the linear region. Thus, in the case where the second gate electrode (GE2) is provided, the field-effect mobility is increased at least when $L_{ov}$ is 0 to L/2, as compared to the case where the second gate electrode (GE2) is not provided. Moreover, when $L_{ov}$ is 0 to L/2, particularly when $L_{ov}$ is close to L/4, the maximum field-effect mobility may be obtained.

The drain current $I_d$ in FIG. 6C reflects the results of the field-effect mobility in FIG. 6B, and among the conditions shown in FIG. 6C, the condition of $L_{ov}$ of L/4 provides the maximum value.

As described above, the second gate electrode to which the potential for controlling the threshold voltage is applied is provided to overlap with the semiconductor layer on the source side of the transistor, and a region of the semiconductor layer not overlapping with the second gate electrode is provided on the drain side, whereby the threshold voltage of the transistor can be controlled, the field-effect mobility can be improved, and a high on-state current can flow.

<Band Structure>

Figure 7:
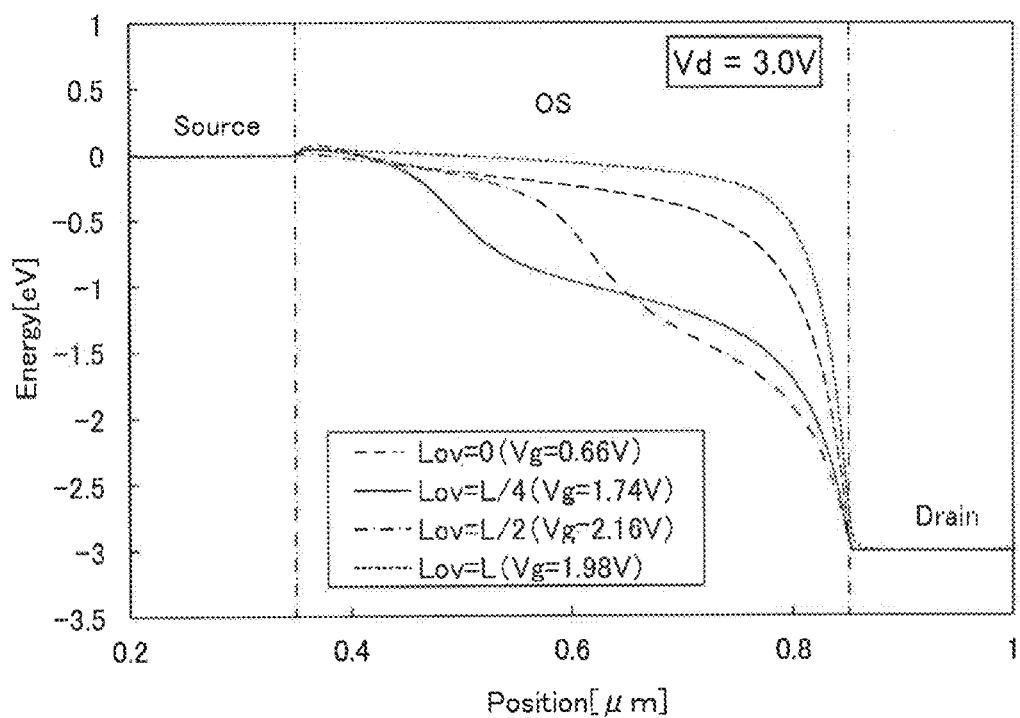
FIG. 7 shows calculation results of band structures of an embodiment.

Next, the comparison results of band structures obtained by varying the position of the second gate electrode (GE2) are shown in FIG. 7. FIG. 7 shows band structures of a valence band of the semiconductor layer (OS) in the region between the source and the drain. Here, band structures under the varied conditions in the saturation region ($V_d$=3.0

V) when the gate voltage $V_g$ at which the highest field-effect mobility ($V_g$ is 0.66 V in the case where $L_{ov}$ is 0, $V_g$ is 1.74 V in the case where $L_{ov}$ is L/4, $V_g$ is 2.16 V in the case where $L_{ov}$ is L/2, and $V_g$ is 1.98 V in the case where $L_{ov}$ is L) is obtained is applied are compared with each other.

FIG. 7 shows band structures of valence bands when the length of $L_{ov}$ is 0, L/4, L/2, and L in the model in which the second gate electrode (GE2) is placed on the source side (FIG. 3A).

Here, in the vicinity of the drain, under any of the conditions where the second gate electrode (GE2) is placed on the source side, the slope of the band is gradual as compared to the condition where the second gate electrode (GE2) is placed to overlap with the semiconductor layer (OS) between the source electrode and the drain electrode. This indicates that electric-field concentration in the vicinity of the drain is relieved and the drain withstand voltage is improved.

As described above, the second gate electrode to which the potential for controlling the threshold voltage is applied is provided to overlap with the semiconductor layer on the source side of the transistor, and a region of the semiconductor layer not overlapping with the second gate electrode is provided on the drain side, whereby the threshold voltage of the transistor can be controlled, the field-effect mobility can be improved, and the drain withstand voltage can be improved.

<Dual-Gate Driving>

Then, the model in which the second gate electrode (GE2) is placed on the source side, which is illustrated in FIG. 3A, is compared with the model in which the third gate electrode (GE3) is further placed on the drain side, which is illustrated in FIG. 3D. As described above, in the transistor in FIG. 3D, the third gate electrode (GE3) is electrically connected to the first gate electrode (GE1) and the transistor is operated so that the same potential is applied to both electrodes (Dual-Gate Driving).

Here, the calculation is performed so that $L_{ov}$ is set to L/4 in the model of the transistor in FIG. 3A, and $L_{ov1}$ is set to L/4 and $L_{ov2}$ is set to L/2 in the model of the transistor in FIG. 3D.

Figure 8A:
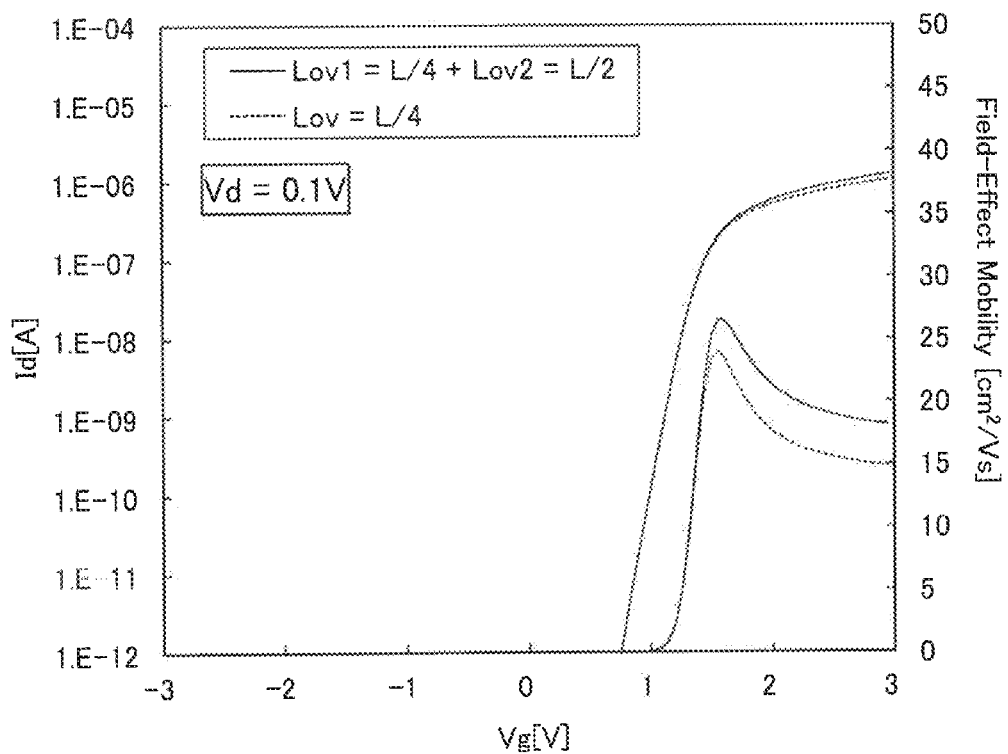
FIGS. 8A and 8B each show calculation results of transistor characteristics of an embodiment.
Figure 8B:
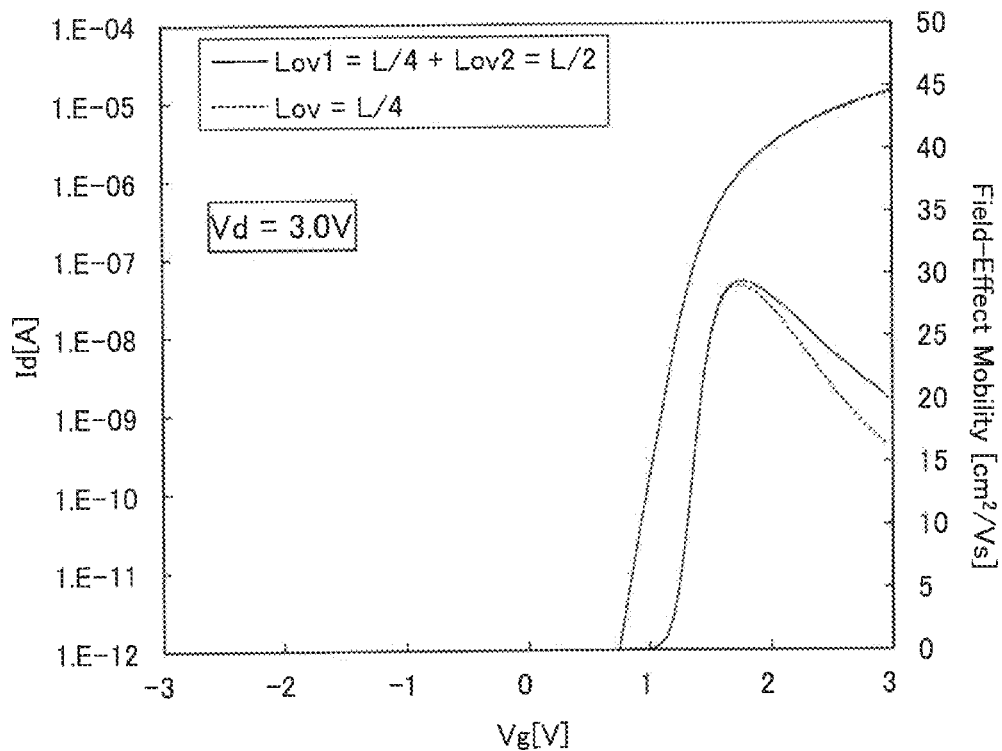

FIGS. 8A and 8B show calculation results of the drain current $I_d$ with respect to the gate voltage $V_g$ and the field-effect mobility. FIG. 8A shows calculation results in the linear region (drain voltage $V_d$ is 0.1 V), and FIG. 8B shows calculation results in the saturation region (drain voltage $V_d$ is 3.0 V).

As shown in FIGS. 8A and 8B, the third gate electrode (GE3) is placed on the drain side and the dual-gate driving is performed, whereby the field-effect mobility tends to be improved in both the linear region and the saturation region.

As described above, in addition to the above structure, the third gate electrode to which the potential for controlling on/off operation of the transistor is applied is provided to overlap with the semiconductor layer on the drain side of the transistor and to be apart from the second gate electrode, whereby the on-state current of the transistor can be further improved.

Here, the overlap length $L_{ov2}$ of the third gate electrode (GE3) and the semiconductor layer (OS) may be set to, for example, 0 or more and 0.75 L or less, preferably 0 or more and 0.5 L or less. In addition, the distance between the second gate electrode (GE2) and the third gate electrode (GE3) may be set, for example, to more than 0 and L or less, preferably L/8 or more and L or less. Note that $L_{ov1}$ and $L_{ov2}$ are not limited thereto, and are set as appropriate in consideration of the desirable electrical characteristics of the transistor and the feature size in the manufacturing process of the transistor.

Here, when the overlap length $L_{ov2}$ of the third gate electrode (GE3) and the semiconductor layer (OS) is more than or equal to the overlap length $L_{ov1}$ of the second gate electrode (GE2) and the semiconductor layer (OS), whereby the field-effect mobility is improved, which is preferable.

The above is the description of Calculation Verification 1.

[Calculation Verification 2]

In the structures of transistor shown in Structural Example 2, verification results of the effect of layout of each gate electrode on electrical characteristics of the transistor are shown below.

<Calculation Model>

First, models of the transistor used for calculation are illustrated in FIGS. 9A to 9D.

Figure 9A:
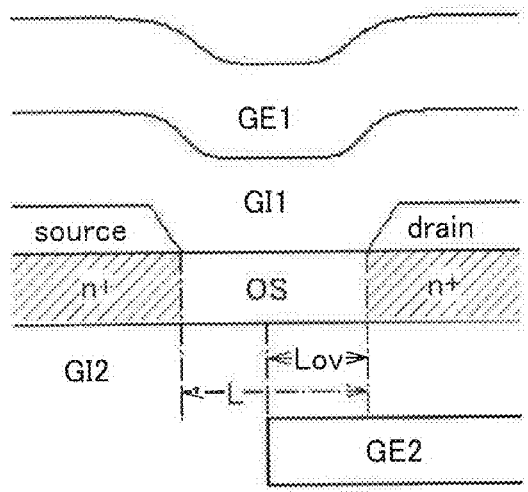
FIGS. 9A to 9D each illustrate a structural model used for calculation of an embodiment.

A transistor in FIG. 9A includes a first gate insulating layer (GI1) over a semiconductor layer (OS) and includes a first gate electrode (GE1) over the first gate insulating layer (GI1). Over the semiconductor layer (OS), a source electrode (Source) and a drain electrode (Drain) are arranged to be apart from each other. In regions of the semiconductor layer (OS) which overlap with the source electrode (Source) and the drain electrode (Drain), regions having high donor density (n$^+$) are formed. A second gate insulating layer (GI2) is placed under the semiconductor layer (OS), and a second gate electrode (GE2) overlapping with the drain electrode (Drain) and part of the semiconductor layer (OS) is placed under the second gate insulating layer (GI2). That is, the second gate electrode (GE2) is placed only on the drain electrode (Drain) side. Here, the distance between the source electrode (Source) and the drain electrode (Drain) is referred to as a channel length L, and the length of a region where the second gate electrode (GE2) and the semiconductor layer (OS) overlap with each other between the source electrode (Source) and the drain electrode (Drain) is referred to as the overlap length $L_{ov}$.

Calculation conditions are shown in Table 2.

TABLE 2

| Calculation Conditions | | |
|---|---|---|
| Structural parameters | Channel length (L) | 1.0, 2.0, μm |
| | | 5.0, 10.0 |
| | Channel width (W) | 1.0 μm |
| Gate insulating layer (GI1) | Relative permittivity | 4.1 |
| | Thickness | 20 nm |
| Gate insulating layer (GI2) | Relative permittivity | 4.1 |
| | Thickness | 300 nm |
| Oxide semiconductor layer (OS) | Electron affinity | 4.6 eV |
| | Eg | 3.2 eV |
| | Relative permittivity | 15 |
| | Donor density | 6.6E−09 cm$^{-3}$ |
| | Donor density (under SD) | 5.0E+18 cm$^{-3}$ |
| | Electron mobility | 15.0 cm$^2$/Vs |
| | Hole mobility | 0.01 cm$^2$/Vs |
| | Nc | 5.0E+18 cm$^{-3}$ |
| | Nv | 5.0E+18 cm$^{-3}$ |
| | Thickness | 15.0 nm |
| Gate electrode (GE1) | Work function | 5.0 eV |
| | Applied voltage | −3.0~3.0 V |
| Gate electrode (GE2) | Work function | 5.0 eV |
| | Thickness | 100 nm |
| | Applied voltage | −15.0 V |
| Source, Drain | Work function | 4.6 eV |
| | Applied voltage (Source) | 0.0 V |
| | Applied voltage (Drain) | 0.1, 3.0 V |

Figure 9B:
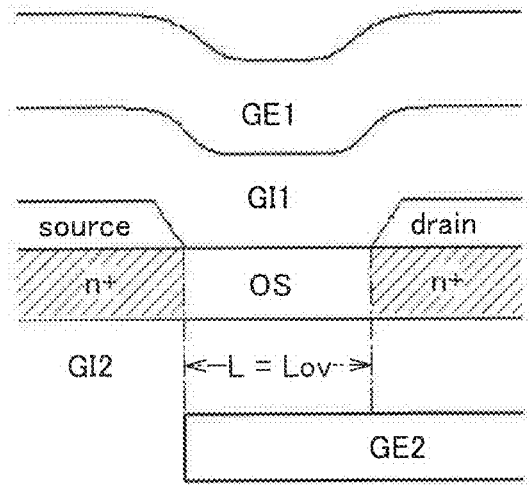

A transistor in FIG. 9B is different from the transistor in FIG. 9A in that the length of a region in which the second gate electrode (GE2) and the semiconductor layer (OS) overlap with each other (overlap length) $L_{ov}$ corresponds to the channel length L.

Figure 9C:
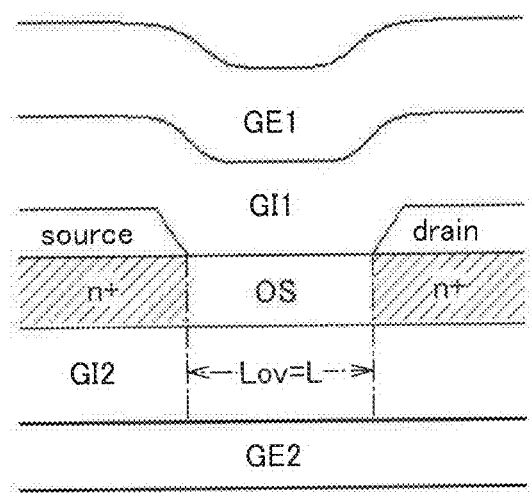

A transistor in FIG. 9C is different from the transistor in FIG. 9A in that the second gate electrode (GE2) is placed to overlap with the source electrode (Source), the drain electrode (Drain), and the semiconductor layer (OS) between an end portion of the source electrode (Source) and an end portion of the drain electrode (Drain). Note that in FIG. 9C, as in the above, the case where the second gate electrode (GE2) overlaps with part of the source electrode (Source), part of the drain electrode (Drain), and the semiconductor layer (OS) placed in a region therebetween is denoted by "In Whole". Here, $L_{ov}$ which is the length of the region where the second gate electrode (GE2) and the semiconductor layer (OS) overlap with each other is equal to the channel length L.

Figure 9D:
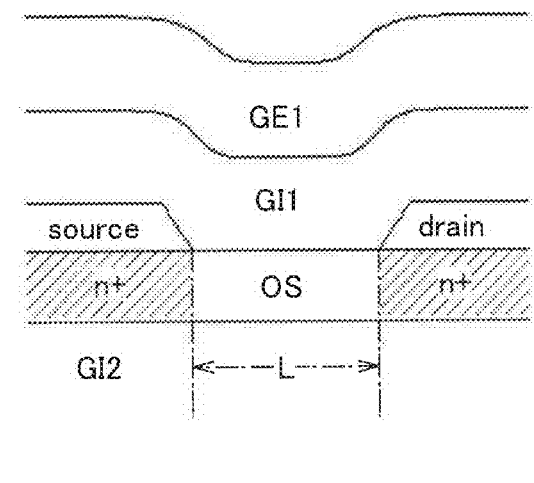

A transistor in FIG. 9D is different from the transistor in FIG. 9A in that the second gate electrode (GE2) is not provided.

<Overlap Length Dependence of Second Gate Electrode>

Transistor characteristics are calculated by changing the overlap length $L_{ov}$ (hereinafter, also simply referred to as $L_{ov}$) of the second gate electrode (GE2) and the semiconductor layer (OS) in accordance with the models in FIGS. 9A to 9D. The calculation is performed under four conditions where L is set to 1.0 μm, 2.0 μm, 5.0 μm, and 10 μm. $L_{ov}$ is set from 0 to L, and the calculation is performed in increments of L/4. Moreover, the calculation is also performed on the model in which the second gate electrode (GE2) is provided to overlap with the source electrode and the drain electrode (FIG. 9C) and the model in which the second gate electrode (GE2) is not provided (FIG. 9D).

FIGS. 10A and 10B and FIGS. 11A and 11B show calculation results under the condition where the channel length L is 10 μm as an example.

Figure 10A:
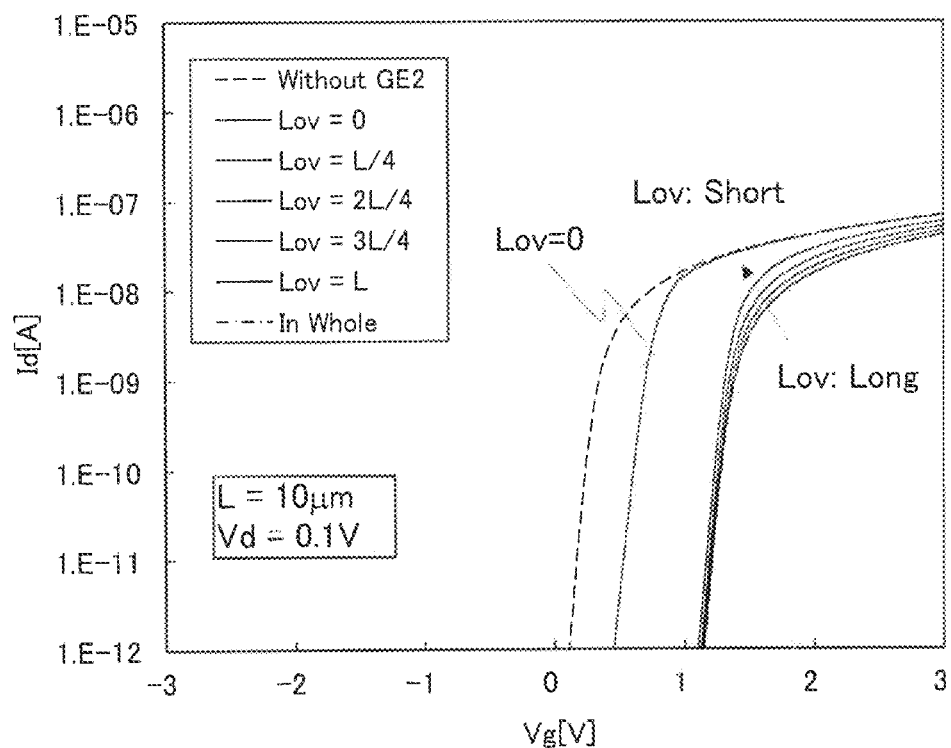
FIGS. 10A and 10B each show calculation results of transistor characteristics of an embodiment.
Figure 10B:
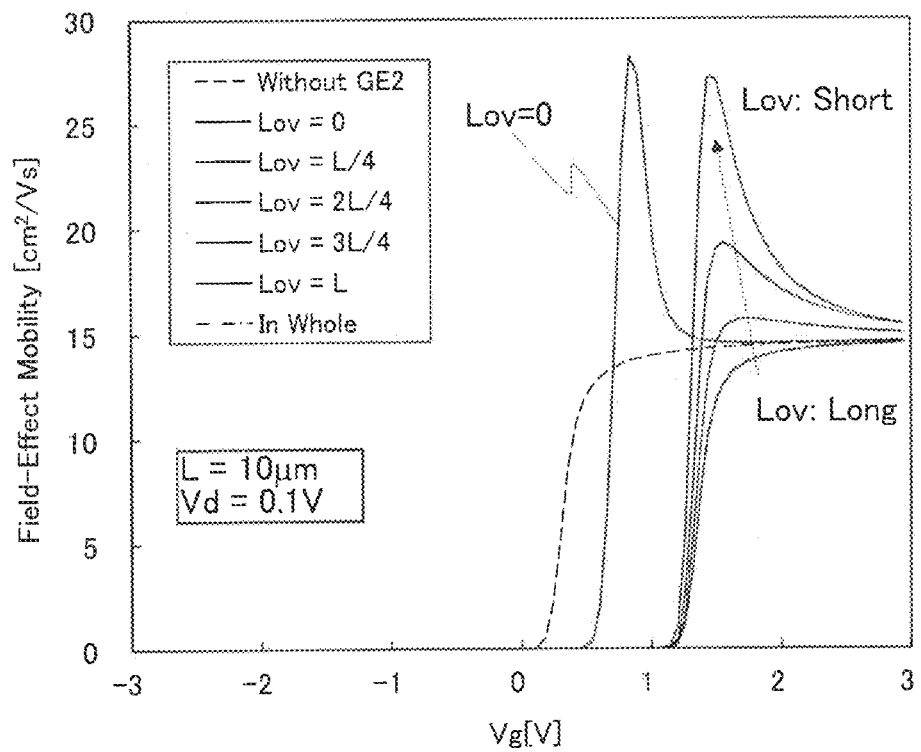
Figure 11A:
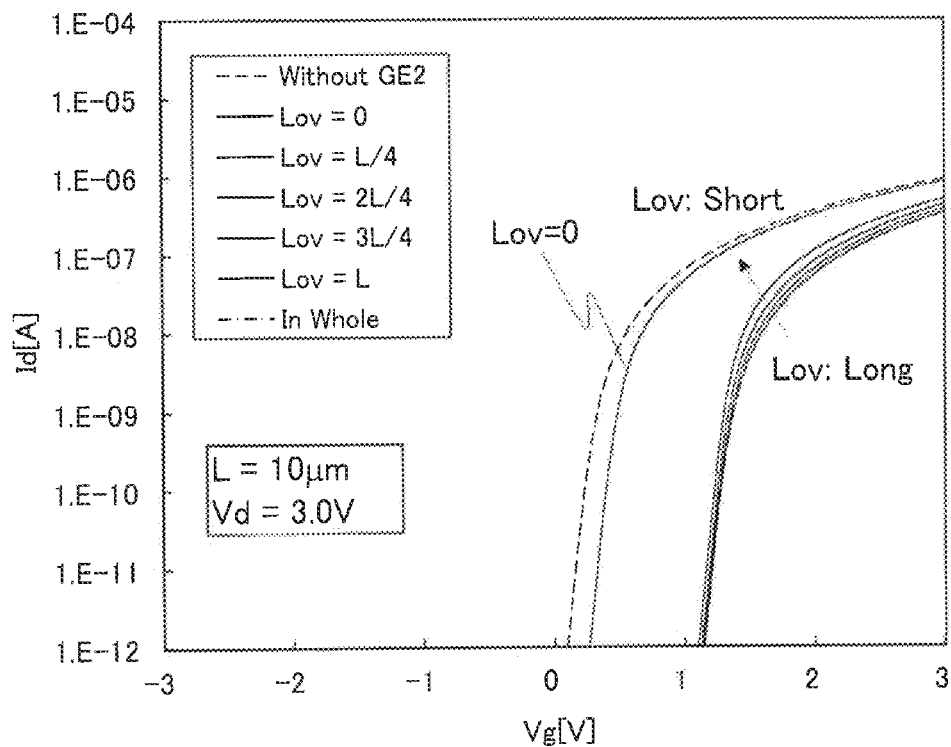
FIGS. 11A and 11B each show calculation results of transistor characteristics of an embodiment.
Figure 11B:
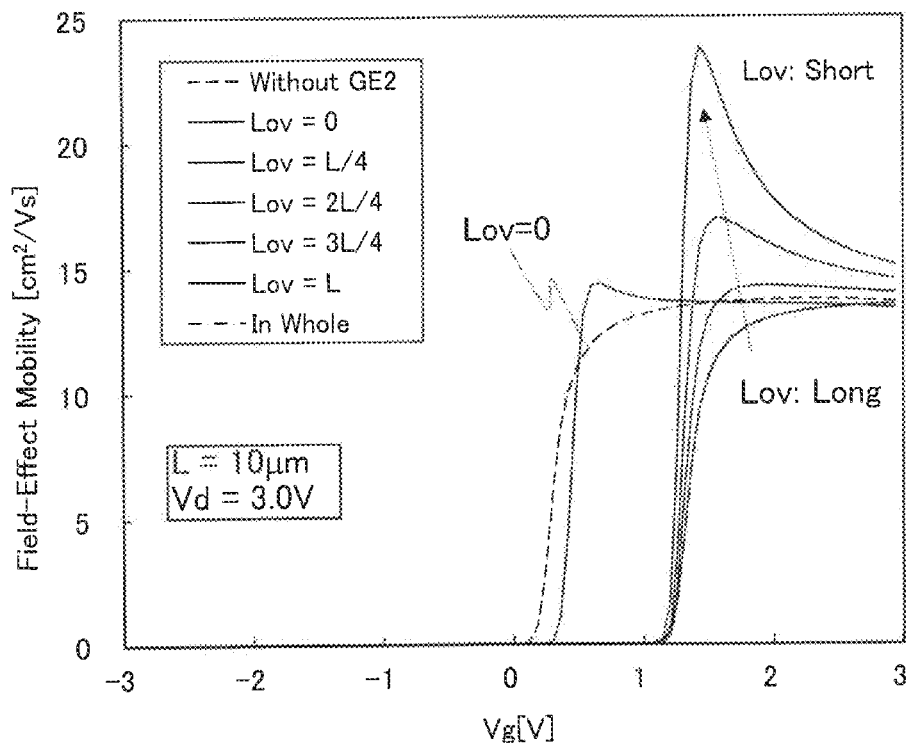

FIG. 10A shows calculation results of a relation between the gate voltage $V_g$ and the drain current $I_d$ (the relation is also referred to as $V_g$-$I_d$ characteristics) in a transistor whose channel length L is 10 μm when the drain voltage $V_d$ is 0.1 V. FIG. 10B shows a relation between the gate voltage $V_g$ and the field-effect mobility, which is estimated from $V_g$-$I_d$ characteristics of FIG. 10A. FIGS. 11A and 11B show the calculation results thereof when a drain voltage $V_d$ is 3.0 V. In the drawings, a dashed-dotted line represents the result of the model in which the second gate electrode (GE2) is provided to overlap with the source electrode and the drain electrode (FIG. 9C, "In Whole"), and a dashed line represents the result of the model in which the second gate electrode (GE2) is not provided (FIG. 9D, "Without GE2").

Here, in each of FIGS. 10A and 10B and FIGS. 11A and 11B, which show $I_d$-$V_g$ characteristics and the field-effect mobility, the curve under the condition where $L_{ov}$ is L is substantially aligned with the curve under the condition where the second gate electrode (GE2) is placed to overlap with the source electrode (Source), the drain electrode (Drain), and the semiconductor layer (OS) between an end portion of the source electrode (Source) and an end portion of the drain electrode (Drain); thus, the curves are shown together.

Here, FIGS. 10A and 10B show results under a condition in which the drain voltage is sufficiently small, and correspond to transistor characteristics in a linear region. On the other hand, FIGS. 11A and 11B shows results under a condition in which the drain voltage is sufficiently large, and correspond to transistor characteristics in a saturation region.

FIGS. 12A to 12D and FIGS. 13A to 13D each show a relation between any of various characteristics of the transistor and each $L_{ov}$ [μm] condition, which is estimated at every channel length L. FIGS. 12A to 12D each show results obtained when the drain voltage is 0.1 V, and FIGS. 13A to 13D each show results obtained when the drain voltage is 3.0 V.

Figure 12A:
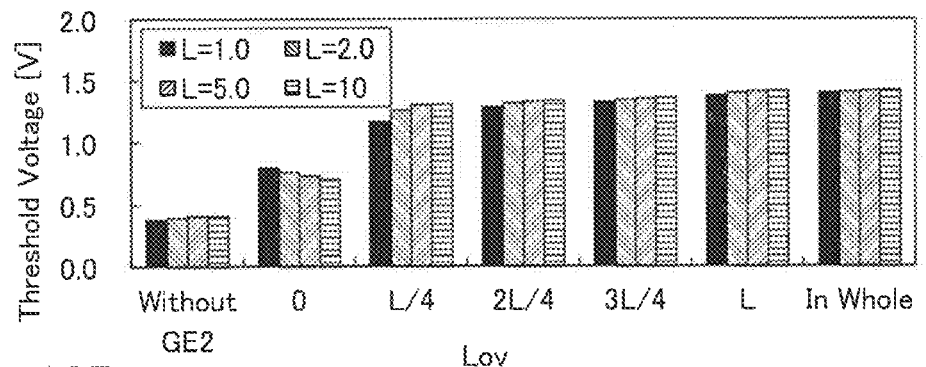
FIGS. 12A to 12D each show calculation results of transistor characteristics of an embodiment.
Figure 12B:
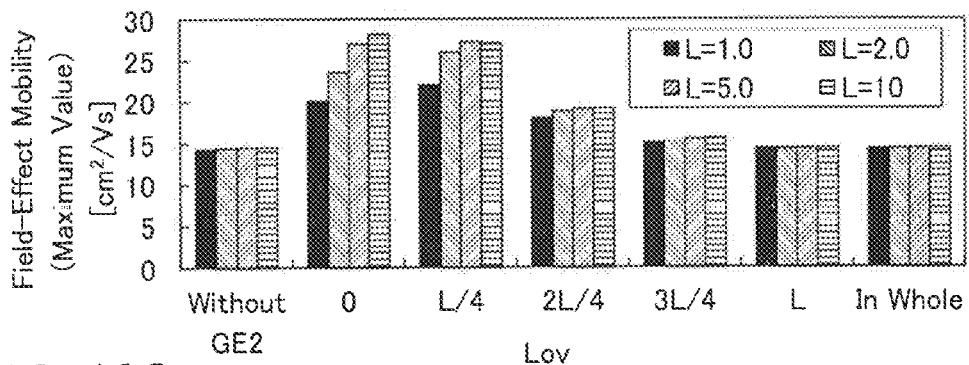
Figure 12C:
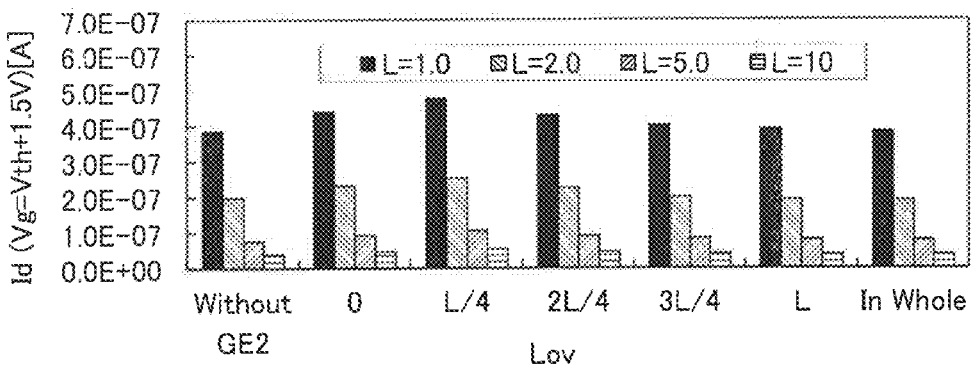
Figure 12D:
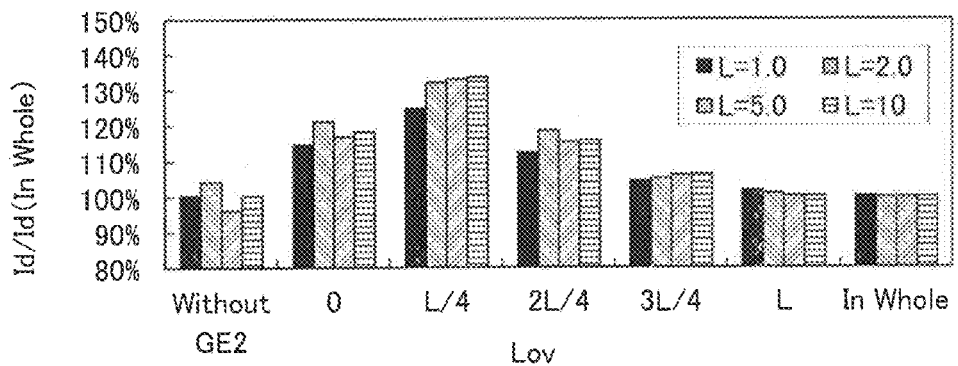
Figure 13A:
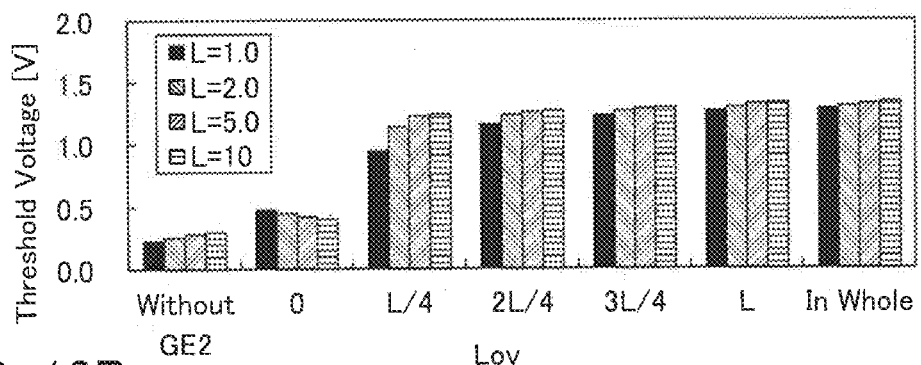
FIGS. 13A to 13D each show calculation results of transistor characteristics of an embodiment.
Figure 13B:
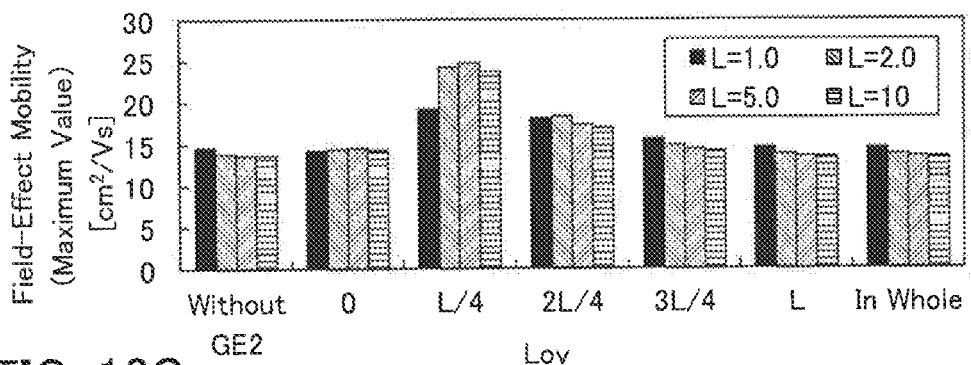
Figure 13C:
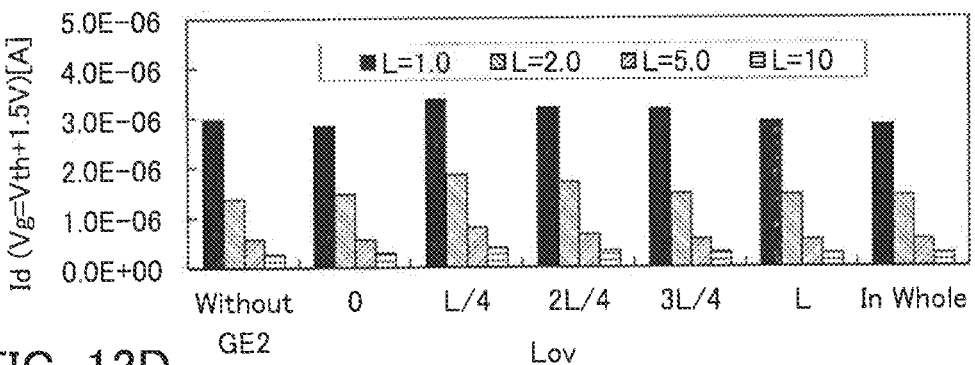

FIG. 12A and FIG. 13A each show a threshold voltage value under each $L_{ov}$ condition. FIG. 12B and FIG. 13B each show a maximum value of the field-effect mobility under each $L_{ov}$ condition. FIG. 12C and FIG. 13C each show a value of drain current $I_d$ under each $L_{ov}$ condition. Here, in order to compare models under each condition easily, the drain current $I_d$ when the gate voltage $V_g$ is at a voltage higher than the threshold voltage by 1.5 V is shown. In order to compare the results between the different conditions of the channel length easily, FIG. 12D and FIG. 13D each show the proportion of the drain current $I_d$ under each condition when the drain current $I_d$ ($I_d$ (In Whole)) under the condition where the second gate electrode (GE2) is placed to overlap with the source electrode (Source), the drain electrode (Drain), and the semiconductor layer (OS) between an end portion of the source electrode (Source) and an end portion of the drain electrode (Drain) is regarded as 100%.

FIGS. 10A and 10B, FIGS. 11A and 11B, FIGS. 12A to 12D, and FIGS. 13A to 13D show that, as the overlap length $L_{ov}$ of the second gate electrode (GE2) and the semiconductor layer (OS) is large, the threshold voltage can be shifted in the positive direction. Even in the case where $L_{ov}$ is 0, the threshold voltage is shifted in the positive direction as compared to the case where the second gate electrode (GE2) is not provided. The threshold voltage is substantially saturated when $L_{ov}$ is L/4, and tends to be increased gently as $L_{ov}$ is large.

Figure 13D:
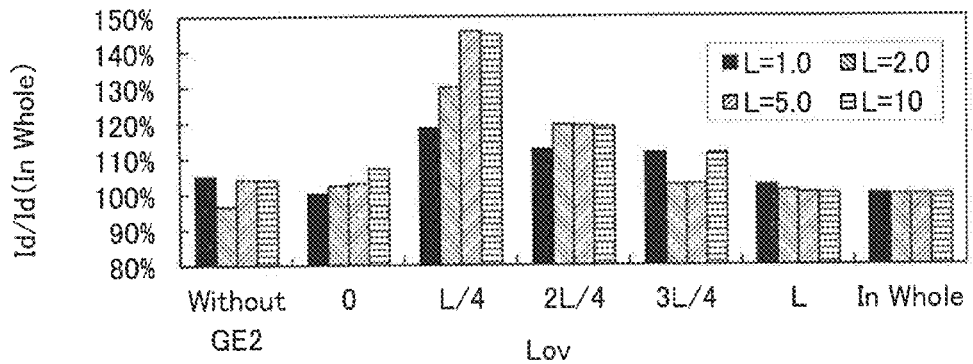

Furthermore, the field-effect mobility and the drain current $I_d$ tend to increase as $L_{ov}$ is close to 0. Under the condition where the drain voltage $V_d$ is small (in the linear region), the maximum field-effect mobility is obtained when $L_{ov}$ is 0. On the other hand, under the condition where the drain voltage $V_d$ is large (in the saturation region), the maximum field-effect mobility is obtained when $L_{ov}$ is L/4. The maximum drain current $I_d$ is obtained when $L_{ov}$ is L/4 regardless of the drain voltage Va. As shown in FIG. 13D, under the condition where the channel length is large (L is 5 μm or 10 μm), the proportion of drain current $I_d$ that is increased in the saturation region is higher than under the other conditions.

As described above, when even a small region where the second gate electrode (GE2) and the semiconductor layer (OS) do not overlap with each other (an offset region) is provided on the source side, the field-effect mobility and the drain current can be improved as compared to the case where the second gate electrode (GE2) is placed to overlap with the semiconductor layer (OS) between an end portion of the source electrode (Source) and an end portion of the drain electrode (Drain).

Moreover, in the case where the second gate electrode (GE2) is placed on the drain electrode (Drain) side, the overlap length $L_{ov}$ of the second gate electrode (GE2) and the semiconductor layer (OS) is larger than 0, whereby the threshold voltage can be shifted in a manner similar to that of the case where the second gate electrode (GE2) is placed to overlap with the semiconductor layer (OS) between an end portion of the source electrode (Source) and an end portion of the drain electrode (Drain). As the overlap length $L_{ov}$ comes close to 0, the field-effect mobility and the drain current $I_d$ can be increased.

<Detailed Evaluation of Overlap Length Dependence>

Next, the conditions of the overlap length $L_{ov}$ is set in more detail, and the $L_{ov}$ dependence of the electrical characteristics of the transistor is evaluated in more detail. Specifically, the calculation is performed in increments of L×1/20 with respect to the channel length L. Here, L is set to 10 μm and $V_d$ is set to 3.0 V.

Figure 14A:
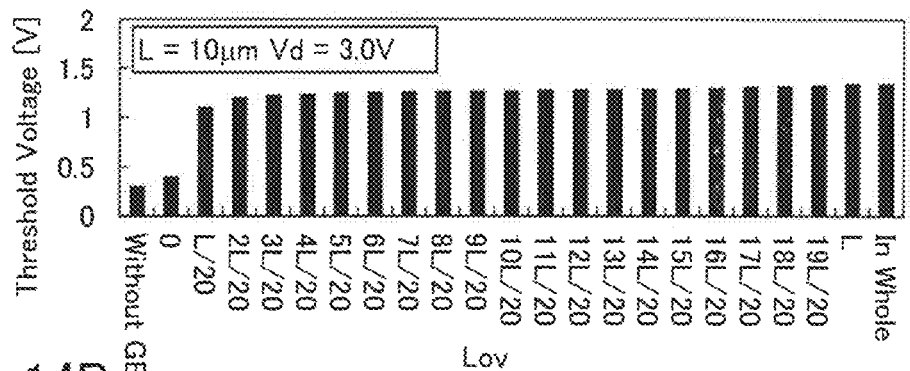
FIGS. 14A to 14D each show calculation results of transistor characteristics of an embodiment.
Figure 14B:
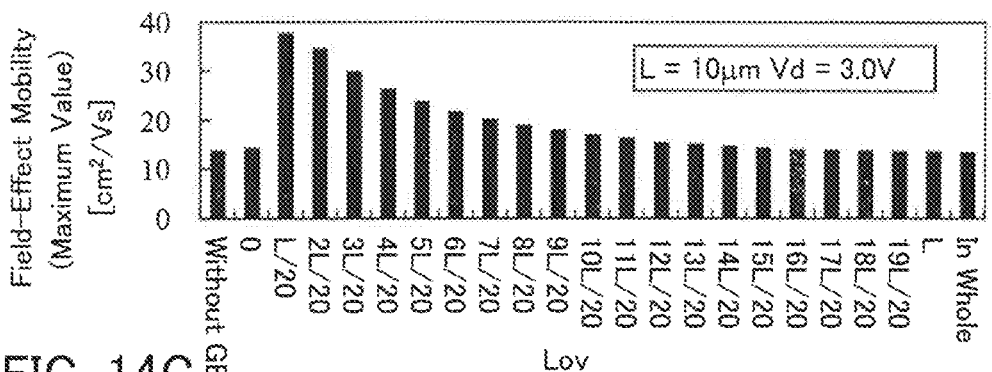
Figure 14C:
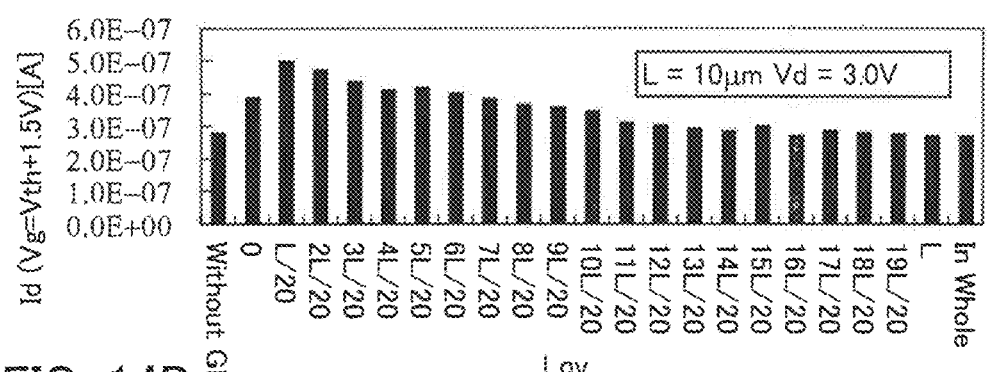
Figure 14D:
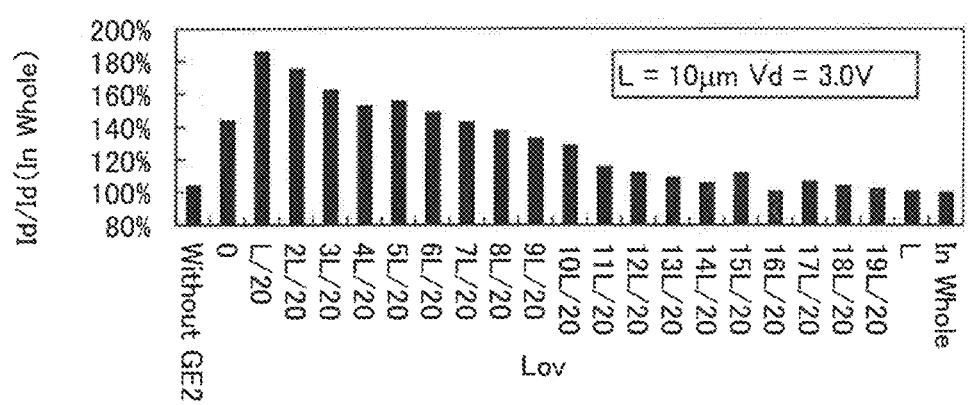

FIGS. 14A to 14D each show calculation results of a relation between any of various characteristics of the transistor and $L_{ov}$. FIG. 14A shows a threshold voltage value under each $L_{ov}$ condition, FIG. 14B shows a maximum value of the field-effect mobility under each $L_{ov}$ condition, and FIG. 14C shows a value of drain current $I_d$ under each $L_{ov}$ condition. FIG. 14D shows the proportion of the drain current $I_d$ under each condition when the drain current $I_d$ ($I_d$ (In Whole)) under the condition where the second gate electrode (GE2) is placed to overlap with the source electrode (Source), the drain electrode (Drain), the semiconductor layer (OS) between an end portion of the source electrode (Source) and an end portion of the drain electrode (Drain) is regarded as 100%.

As shown in FIG. 14A, there is a large difference in the amount of shift of the threshold voltage between the condition where $L_{ov}$ is 0 and the condition where $L_{ov}$ is L/20, the threshold voltage is increased gently as $L_{ov}$ is larger than L/20. Under the condition, the threshold voltage tends to be substantially saturated under the condition where $L_{ov}$ is L×2/20.

As shown in FIGS. 14B to 14D, the field-effect mobility and the drain current $I_d$ tend to increase as $L_{ov}$ is close to 0, and tend to decrease when $L_{ov}$ reaches 0. From these results, it is probable that when $L_{ov}$ is 0 to L/20, particularly when $L_{ov}$ is close to 0, the maximum field-effect mobility and the maximum drain current $I_d$ are obtained. Even in the case where the small offset region is provided on the source side (Source) (e.g., $L_{ov}$ is L×19/20), the field-effect mobility and the drain current $I_d$ can be increased as compared to the case ($L_{ov}$ is "In Whole") where the second gate electrode (GE2) is placed to overlap with the semiconductor layer (OS) between an end portion of the source electrode (Source) and an end portion of the drain electrode (Drain).

From these results, it is found that when an end portion of the second gate electrode (GE2) on the semiconductor layer (OS) side protrudes from an end portion of the drain electrode (Drain) slightly, the threshold voltage can be shifted in a manner similar to that of the case where the second gate electrode (GE2) is placed to overlap with the semiconductor layer (OS) between an end portion of the source electrode (Source) and an end portion of the drain electrode (Drain). Moreover, when the end portion of the second gate electrode (GE2) on the semiconductor (OS) side protrudes from the end portion of the drain electrode (Drain) and is close to the end portion of the drain electrode (Drain), the effect for increasing the field-effect mobility and the drain current $I_d$ is enhanced.

The above is the description of Calculation Verification 2.

At least part of this embodiment can be implemented in combination with any of the other embodiments described in this specification as appropriate.

This embodiment can be implemented in combination with any of the other embodiments described in this specification as appropriate.

Embodiment 2

In this embodiment, specific structural examples of a semiconductor device of one embodiment of the present invention and a manufacturing method example thereof are described with reference to drawings. Here, a transistor is described as an example of the semiconductor device. Note that portions similar to those described above are not described in some cases.

Structural Example

Figure 15A:
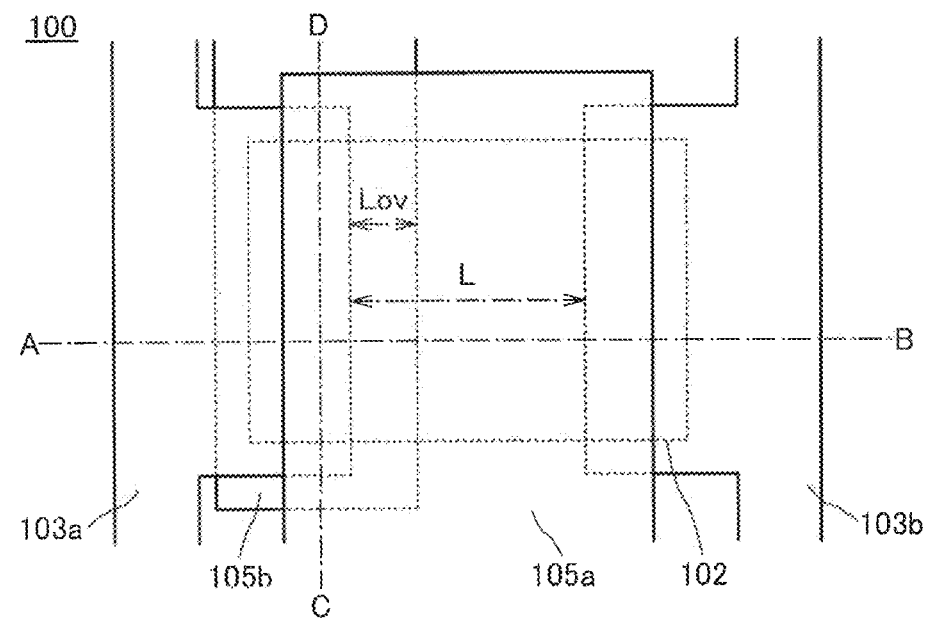
FIGS. 15A to 15C illustrate a structural example of a semiconductor device of an embodiment.
Figure 15B:
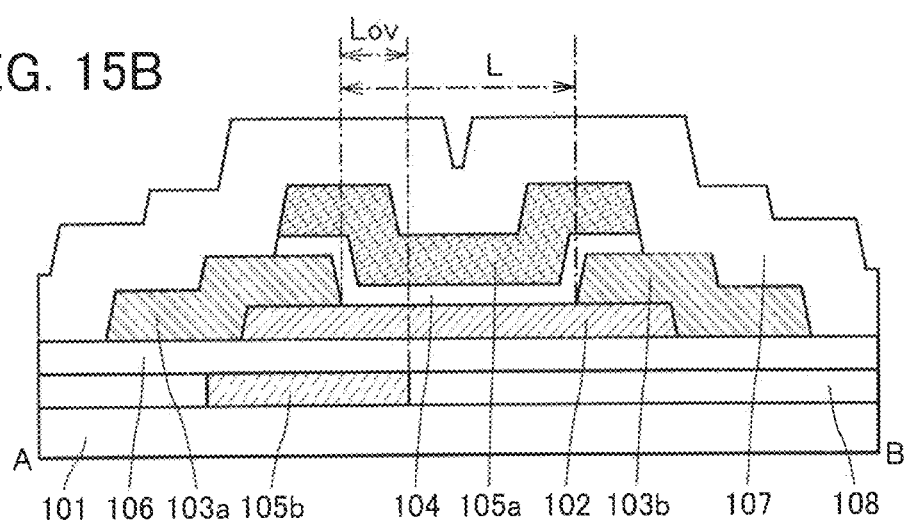
Figure 15C:
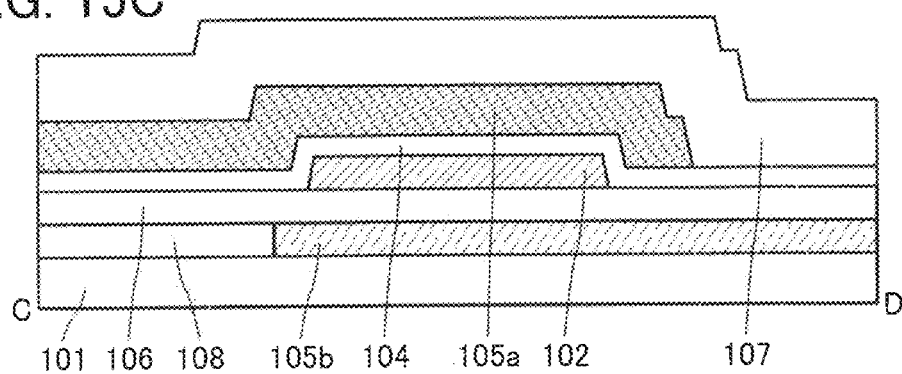

FIG. 15A is a schematic top view of a transistor 100 described in this structural example FIG. 15B is a schematic cross-sectional view taken along line A-B in FIG. 15A, and FIG. 15C is a schematic cross-sectional view taken along line C-D in FIG. 15A. Some components are not illustrated in FIG. 15A for clarity.

The transistor 100 provided over a substrate 101 includes an island-shaped semiconductor layer 102, a first electrode 103a and a second electrode 103b each electrically connected to the semiconductor layer 102, a first gate electrode 105a and a second gate electrode 105b each overlapping with the semiconductor layer 102, an insulating layer 104 between the first gate electrode 105a and the semiconductor layer 102, and an insulating layer 106 between the second gate electrode 105b and the semiconductor layer 102. In addition, an insulating layer 107 covering the insulating layer 106, the first electrode 103a, the second electrode 103b, the first gate electrode 105a, and the like is provided.

The first electrode 103a serves as one of a source electrode and a drain electrode of the transistor 100. The second electrode 103b functions as the other of the source electrode and the drain electrode of the transistor 100.

Here, as illustrated in FIGS. 15A and 15B, the distance between the first electrode 103a and the second electrode 103b in a portion overlapping with the semiconductor layer 102 is referred to as a channel length L of the transistor 100.

In a region sandwiched between the first electrode 103a and the second electrode 103b, the first gate electrode 105a is provided to cover the semiconductor layer 102. Furthermore, the first gate electrode 105a is provided to overlap with part of the first electrode 103a and part of the second electrode 103b.

The second gate electrode 105b is provided to overlap with part of the semiconductor layer 102 on the first electrode 103a side in the region sandwiched between the first electrode 103a and the second electrode 103b.

Here, as illustrated in FIGS. 15A and 15B, the distance between an end portion of the first electrode 103a and an end portion of the second gate electrode 105b in a region overlapping with the semiconductor layer 102 is referred to as an overlap length $L_{ov}$. At this time, the second gate electrode 105b is provided so that the overlap length $L_{ov}$ is shorter than at least the channel length L. Thus, a region not overlapping with the second gate electrode 105b (an offset region) is provided in the semiconductor layer 102 on the second electrode 103b side.

In addition, an insulating layer 108 is provided in contact with side surfaces of the second gate electrode 105b. Furthermore, it is preferable that top surfaces of the second gate electrode 105b and the insulating layer 108 be planarized and the heights thereof be substantially aligned with each other. By planarizing at least a bottom surface of the semiconductor layer 102, the semiconductor layer 102 has high uniformity in thickness and quality, so that the stability and the variation in the electrical characteristics of the transistor 100 can be improved.

The insulating layer 108 preferably includes a film from which oxygen is released by heating. For example, an insulating film including an oxygen-excess region is included. The insulating film including the oxygen-excess region is preferably, for example, an oxide insulating film containing oxygen at a higher proportion than oxygen in the stoichiometric composition. Such an oxide insulating film releases part of oxygen by heating.

In the transistor 100, the semiconductor layer 102 has a region not overlapping with the second gate electrode 105b; thus, by the heat treatment in the manufacturing process of the transistor 100, oxygen released from the insulating layer 108 is supplied to the semiconductor layer 102 through the insulating layer 106, so that oxygen vacancies in the semiconductor layer 102 can be filled and reduced.

As illustrated in FIG. 15C, in a cross section of the transistor 100 in the channel width direction, the semiconductor layer 102 is surrounded by the first gate electrode 105a and the second gate electrode 105b. The first gate electrode 105a is provided to cover not only the top surface of the semiconductor layer 102 but also the end portions of the semiconductor layer 102 in the channel width direction. With such a structure, an electric field from the first gate electrode 105a is applied to the semiconductor layer 102 not only in the vertical direction but also in the lateral direction; thus, a region where a channel is formed in the semiconductor layer 102 is increased and the on-state current of the transistor 100 can be further increased.

[Components]

Components of the transistor 100 are described below.

<Semiconductor Layer>

In the case of using an oxide semiconductor as the semiconductor layer 102, an oxide semiconductor containing at least one of indium and zinc is preferably used. Typically, an In—Ga—Zn-based metal oxide or the like can be given. An oxide semiconductor having a wider band gap and a lower carrier density than silicon is preferably used because off-state leakage current can be reduced.

The semiconductor layer 102 may be a single layer of an oxide semiconductor film or a stacked layer of oxide semiconductor films having different compositions.

For example, two oxide semiconductor films are stacked and one of the oxide semiconductor films that is close to the first gate electrode 105a contains a material in which the energy at the conduction band bottom is higher than the other oxide semiconductor film that is a lower layer. Alternatively, three oxide semiconductor films are stacked and one of the three oxide semiconductor films in the middle layer contains a material in which the energy at the conduction band bottom is lower than the other oxide semiconductor films. With such a structure, a channel is mainly formed in the oxide semiconductor film in which the energy at the bottom conduction band is the lowest.

In the case where an In-M-Zn oxide is used for the oxide semiconductor film, as the atomic ratio of In to M in the film becomes higher, the energy at the conduction band bottom can be further reduced. As the proportion of Zn becomes higher, the stability of the crystal structure can be increased. As the proportion of M becomes higher, release of oxygen from the oxide semiconductor film can be suppressed.

An oxide semiconductor film is provided to be in contact with an oxide semiconductor film in which a channel is mainly formed and which serves as a main current path and to contain the same constituent element; thus, the generation of interface states of the films can be inhibited and the reliability of the electrical characteristics of the transistor can be improved. Moreover, a material in which the proportion of M in an atomic ratio is high is used for the oxide semiconductor film which is provided in contact with the oxide semiconductor film in which the channel is mainly formed, so that the oxygen vacancies in the oxide semiconductor film in which the channel is mainly formed can be reduced.

Note that details of a preferable mode and a forming method of an oxide semiconductor that can be used for the semiconductor layer 102 are described in an embodiment below.

As a semiconductor other than the oxide semiconductor, in addition to silicon, a semiconductor which has a wider band gap than silicon, such as silicon carbide, gallium nitride, or diamond can be used.

A case in which an oxide semiconductor is used for the semiconductor layer 102 is described below unless otherwise specified.

<Substrate>

There is no particular limitation on the property of a material and the like of the substrate 101 as long as the material has heat resistance enough to withstand at least heat during the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 101.

Still alternatively, a component in which a semiconductor element is provided over a variety of semiconductor substrates or SOI substrates may be used as the substrate 101. In this case, the transistor 100 is formed over the substrate 101 with an interlayer insulating layer provided therebetween. The transistor 100 in this case may have a structure in which at least one of the first gate electrode 105a, the second gate electrode 105b, the first electrode 103a, and the second electrode 103b is electrically connected to the above semiconductor element by a connection electrode buried in the interlayer insulating layer. Forming the transistor 100 over the semiconductor element with the interlayer insulating layer therebetween can reduce an occupation area as compared to the case where the transistor 100 and the semiconductor element are formed over the same surface.

<Gate Electrode>

The first gate electrode 105a and the second gate electrode 105b can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used. Furthermore, the first gate electrode 105a and the second gate electrode 105b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The first gate electrode 105a and the second gate electrode 105b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the first gate electrode 105a and the insulating layer 104 or between the second gate electrode 105b and the insulating layer 106. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 102, specifically an In—Ga—Zn-based oxynitride semiconductor film having a nitrogen concentration higher than or equal to 7 at. %, is used.

<Gate Insulating Layer>

The insulating layers 104 and 106 each serve as a gate insulating layer.

The insulating layers 104 and 106 may be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

The insulating layers 104 and 106 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide.

When the specific material is used for the gate insulating layer, electrons are trapped in the gate insulating layer under the specific conditions and the threshold voltage can be increased. For example, like a stacked-layer film of silicon oxide and hafnium oxide, part of the gate insulating layer uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the semiconductor layer to the gate electrode, and some of the electrons are trapped by the electron trap states.

In the transistor in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the transistor.

For example, the treatment is preferably performed at any step before factory shipment, such as after the formation of a wire metal connected to the source electrode or the drain electrode of the transistor, after the preceding process (wafer processing), after a wafer-dicing step, after packaging, or the like. In any case, it is preferable that the transistor be not exposed to a temperature higher than or equal to 125° C. for one hour or more after that.

<First Electrode and Second Electrode>

The first electrode 103a and the second electrode 103b are formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

<Insulating Layer>

The insulating layers 106 and 108 each may have a function of preventing diffusion of impurities contained in the substrate 101 in addition to a function of supplying oxygen to the semiconductor layer 102.

The insulating layers 106 and 108 are each preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C.

With the use of the oxide insulating film as the insulating layers 106 and 108, oxygen is supplied to the semiconductor layer 102 through heat treatment or the like in the manufacturing process, which makes it possible to reduce oxygen vacancies in the semiconductor layer 102.

For the insulating layer 107, the material relatively impermeable to oxygen can be used. Furthermore, it is preferable that the insulating layer 107 be relatively impermeable to hydrogen or water. As the material relatively impermeable to oxygen, which can be used for the insulating layer 107, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used. In particular, a material impermeable to oxygen, hydrogen, and water can be used. With the use of such a material for the insulating layer 107, it is possible to inhibit both diffusion of oxygen released from the insulating layers 106 and 108 to the outside and entry of hydrogen, water, or the like from the outside into the semiconductor layer 102 or the like.

Note that a layer which releases oxygen in a manner similar to that of the insulating layer 106 may be provided under the insulating layer 107. In the case of providing a component such as a wiring over the insulating layer 107, an insulating layer serving as a planarization layer may be provided over the insulating layer 107.

The above is the description of each of the components.

MODIFICATION EXAMPLE

Structural Examples of a transistor that are partly different from the structure of the transistor 100 are described below. Note that description of the portions already described is omitted and different portions are described in detail. Even when positions and shapes of components are different from those in the above example, the same reference numerals are used as long as the components have the same functions as those in the above example, and detailed description thereof is omitted in some cases.

Modification Example 1

Figure 16A:
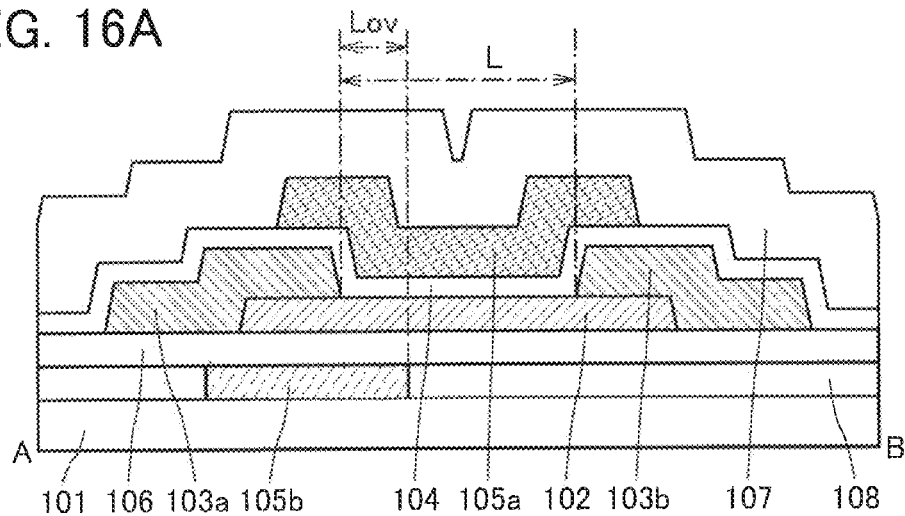
FIGS. 16A to 16C each illustrate a structural example of a semiconductor device of an embodiment.

FIG. 16A is a schematic cross-sectional view of a transistor described as an example below. Note that a schematic top view can be referred to FIG. 15A. A transistor illustrated in FIG. 16A is different from the transistor 100 in the shape of the insulating layer 104. Specifically, part of the insulating layer 104 is in contact with the insulating layer 106, and part of the insulating layer 104 covers top surfaces of the first electrode 103a and the second electrode 103b.

With such a structure, the insulating layer 104 can serve as an etching stopper at the time of processing the gate electrode 105a, so that unintended thinning of the first electrode 103a and the second electrode 103b in the etching process can be inhibited.

Modification Example 2

A semiconductor device of one embodiment of the present invention preferably includes an oxide layer, which contains as its constituent element at least one of the metal elements constituting an oxide semiconductor layer, between the oxide semiconductor layer and an insulating layer that overlaps with the oxide semiconductor layer. In this way, a trap state is prevented from being formed in the interface between the oxide semiconductor layer and the insulating layer that overlaps with the oxide semiconductor layer.

That is, one embodiment of the present invention preferably has a structure in which at least a top surface, a bottom surface, or both of them in a channel formation region are in contact with an oxide layer serving as a barrier film that prevents formation of an interface state at an interface with the oxide semiconductor layer. With this structure, formation of oxygen vacancies and entry of impurities which cause generation of carriers in the oxide semiconductor layer and the interface can be prevented. Thus, a highly purified intrinsic oxide semiconductor layer can be obtained. Obtaining a highly purified intrinsic oxide semiconductor layer refers to purifying or substantially purifying the oxide semiconductor layer to be an intrinsic or substantially intrinsic oxide semiconductor layer. In this way, a change in electrical characteristics of a transistor including the oxide semiconductor layer can be prevented, and a highly reliable semiconductor device can be provided.

Note that in this specification and the like, when an oxide semiconductor layer is referred to as being substantially intrinsic, the carrier density thereof is lower than $1\times10^{17}/cm^3$, lower than $1\times10^{15}/cm^3$, or lower than $1\times10^{13}/cm^3$. With a highly purified intrinsic oxide semiconductor layer, the transistor can have stable electrical characteristics.

More specifically, the following structures can be employed for example.

Figure 16B:
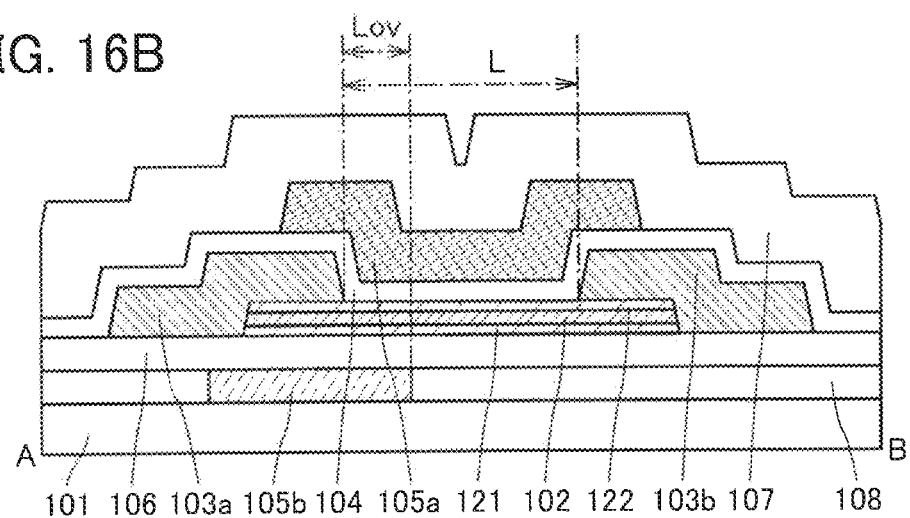

FIG. 16B is a schematic cross-sectional view of a transistor described as an example below. Note that a schematic top view can be referred to FIG. 15A. A transistor illustrated in FIG. 16B is mainly different from the transistor in Modification Example 1 in that the first oxide layer 121 and the second oxide layer 122 are included.

The first oxide layer 121 is provided between the insulating layer 106 and the semiconductor layer 102.

The second oxide layer 122 is provided between the semiconductor layer 102 and the insulating layer 104. Specifically, the top surface of the second oxide layer 122 is in contact with the bottom surfaces of the first electrode 103a and the second electrode 103b and the bottom surface of the insulating layer 104.

The first oxide layer 121 and the second oxide layer 122 each contain an oxide containing one or more metal elements that are also contained in the semiconductor layer 102.

Note that the boundary between the semiconductor layer 102 and the first oxide layer 121 or the boundary between the semiconductor layer 102 and the second oxide layer 122 is not clear in some cases.

For example, the first oxide layer 121 and the second oxide layer 122 contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has an energy level of the conduction band minimum closer to the vacuum level than that of the semiconductor layer 102 is used. Typically, the difference between the energy of the conduction band minimum of the first oxide layer 121 or the second oxide layer 122 and the energy of the conduction band minimum of the semiconductor layer 102 is preferably 0.05 eV or higher, 0.07 eV or higher, 0.1 eV or higher, or 0.15 eV or higher and 2 eV or lower, 1 eV or lower, 0.5 eV or lower, or 0.4 eV or lower.

An oxide having a Ga (serving as a stabilizer) content higher than that of the semiconductor layer 102 is used for the first oxide layer 121 and the second oxide layer 122, between which the semiconductor layer 102 is sandwiched, in which case release of oxygen from the semiconductor layer 102 can be inhibited.

When an In—Ga—Zn-based oxide in which the atomic ratio of In to Ga and Zn is 1:1:1 or 3:1:2 is used for the semiconductor layer 102, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the first oxide layer 121 or the second oxide layer 122. Note that the atomic ratio of each of the semiconductor layer 102, the first oxide layer 121, and the second oxide layer 122 may vary within a range of ±20% of any of the above-described atomic ratios as an error. For the first oxide layer 121 and the second oxide layer 122, materials with the same composition or material with different compositions may be used.

Further, when an In-M-Zn-based oxide is used for the semiconductor layer 102, an oxide containing metal elements in the atomic ratio satisfying the following conditions is preferably used for a target for forming the semiconductor film serving as the semiconductor layer 102. Given that the atomic ratio of the metal elements in the target is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the first oxide layer 121 and the second oxide layer 122, an oxide containing metal elements in the following atomic ratio is preferably used for a target for forming oxide films serving as the first oxide layer 121 and the second oxide layer 122. Given that the atomic ratio of the metal elements in the target is In:M:Zn=$x_2$:$y_2$:$z_2$, it is preferable that $x_2/y_2$ be less than $x_1/y_1$, and $z_2/y_2$ be greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

By using a material in which the energy level of the conduction band minimum is closer to the vacuum level than that of the semiconductor layer 102 is for the first oxide layer 121 and the second oxide layer 122, a channel is mainly formed in the semiconductor layer 102, so that the semiconductor layer 102 serves as a main current path. When the semiconductor layer 102 in which a channel is formed is sandwiched between the first oxide layer 121 and the second oxide layer 122 containing the same metal element as described above, formation of interface states between these layers is suppressed, and thus reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. In order to obtain the required semiconductor characteristics of the transistor, it is preferable that the carrier density, the impurity concentration, the defect density, the atomic ratio of a metal element to oxygen, the interatomic distance, the density, and the like of each of the semiconductor layer 102, the first oxide layer 121, and the second oxide layer 122 be set to appropriate values.

Here, the thickness of the semiconductor layer 102 is preferably larger than that of the first oxide layer 121. The thicker the semiconductor layer 102 is, the larger the on-state current of the transistor is. The thickness of the first oxide layer 121 may be set as appropriate as long as formation of an interface state at an interface with the semiconductor layer 102 is inhibited. For example, the thickness of the semiconductor layer 102 is larger than that of the first oxide layer 121, preferably 2 times or more, further preferably 4 times or more, still further preferably 6 times or more as large as that of the first oxide layer 121. Note that the above does not apply in the case where the on-state current of the transistor does not need to be increased, and the thickness of the first oxide layer 121 may be thicker than the semiconductor layer 102.

The thickness of the second oxide layer 122 may be set as appropriate, in a manner similar to that of the first oxide layer 121, as long as formation of an interface state at an interface with the semiconductor layer 102 is inhibited. For example, the thickness of the second oxide layer 122 may be set smaller than or equal to that of the first oxide layer 121. The second oxide layer 122 preferably has a small thickness because the thick second oxide layer 122 might make it difficult for an electric field by the first gate electrode 105a to extend to the semiconductor layer 102. For example, the second oxide layer 122 may be thinner than the semiconductor layer 102. Note that the thickness of the second oxide layer 122 is not limited to the above, and may be set as appropriate depending on a driving voltage of the transistor in consideration of the withstanding voltage of the insulating layer 104 and the like.

Here, in the case where the semiconductor layer 102 is in contact with an insulating layer including a different constituent element (e.g., an insulating layer including a silicon oxide film), an interface state is sometimes formed at the interface of the two layers and the interface state forms a channel In that case, a second transistor having a different threshold voltage appears, so that an apparent threshold voltage of the transistor is varied. In the transistor having this structure, however, the first oxide layer 121 containing one of more kinds of metal elements constituting the semiconductor layer 102 is provided, which makes it difficult for an interface state to be formed at the interface between the first oxide layer 121 and the semiconductor layer 102. Thus, providing the first oxide layer 121 makes it possible to reduce variations and fluctuation in the electrical characteristics of the transistor, such as threshold voltage.

When a channel is formed at the interface between the insulating layer 104 and the semiconductor layer 102, interface scattering occurs at the interface and the field-effect mobility of the transistor is reduced. In the transistor having this structure, however, since the second oxide layer 122 contains one or more kinds of metal elements constituting the semiconductor layer 102, scattering of carriers is less likely to occur at an interface between the semiconductor layer 102 and the second oxide layer 122, and thus the field-effect mobility of the transistor can be increased.

Modification Example 3

Figure 16C:
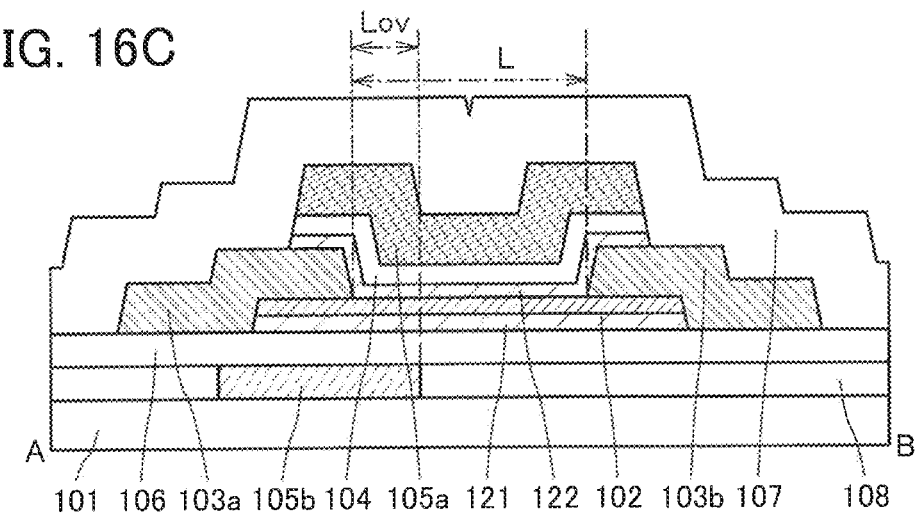

FIG. 16C is a schematic cross-sectional view of a transistor described below as an example Note that FIG. 15A can be referred to for the schematic top view. The transistor in FIG. 16C is mainly different from the transistor in Modification Example 2 in the shape of the second oxide layer 122.

The bottom surface of the second oxide layer 122 is in contact with the top surfaces of the first electrode 103a and the second electrode 103b. Furthermore, the second oxide layer 122 is in contact with the top surface of the semiconductor layer 102 in a region where the first electrode 103a and the second electrode 103b are not provided.

In the structure shown in FIG. 16C, the second oxide layer 122, the insulating layer 104, and the first gate electrode 105a are processed with the use of the same photomask so that the top surface shapes of the second oxide layer 122 and the insulating layer 104 are substantially the same as that of the first gate electrode 105a.

Note that in this specification and the like, the expression "top surface shapes (of two or more layers) are substantially the same" means that outlines of stacked two or more layers at least partly overlap with each other. For example, what is expressed by the expression includes an upper layer and a lower layer that are processed with the use of the same mask pattern or partly processed with the use of the same mask pattern. In some cases, however, the outlines of such upper and lower layers do not completely overlap with each other; for example, the edge of the upper layer may be on an inner/outer side than the edge of the lower layer. The expression "top surface shapes (of two or more layers) are substantially the same" may also apply to such cases.

With such a structure, the contact area between the semiconductor layer 102 in which the channel is formed and each of the first electrode 103a and the second electrode 103b can be increased, so that the contact resistance thereof can be reduced. As a result, the on-state current of the transistor can be increased.

The above is the description of the modification example.

[Example of Manufacturing Method]

An example of a method for manufacturing the transistor 100 illustrated in FIGS. 15A to 15C is described below with reference to the drawings. FIGS. 17A to 17E are schematic cross-sectional views each illustrating a stage in a method for manufacturing the transistor 100.

<Formation of Second Gate Electrode>

First, a conductive film is formed over the substrate 101. A resist mask is formed over the conductive film by photolithography or the like, an unnecessary portion of the conductive film is removed by etching, and then the resist mask is removed. In this manner, the second gate electrode 105b can be formed.

The conductive film can be formed by a sputtering method, an evaporation method, a chemical vapor deposition (CVD) method, or the like, for example.

An insulating layer serving as a barrier layer may be formed over the substrate 101 before the formation of the conductive film.

In the case of a structure in which the third gate electrode 105c is provided, which is exemplified in Embodiment 1, the third gate electrode 105c can be formed in the same step and at the same time as the second gate electrode 105b. The second gate electrode 105b and the third gate electrode 105c may be formed separately in different steps. For example, the second gate electrode 105b or the third gate electrode 105c may be formed under the insulating layer 108.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. In the case of performing exposure by scanning with a beam such as an electron beam, a photomask is not needed.

Figure 17A:
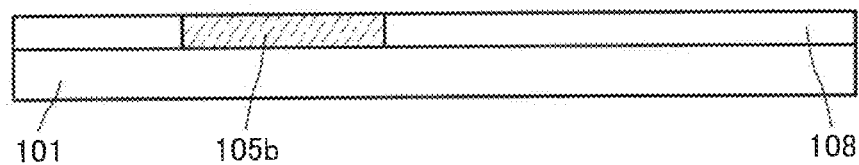
FIGS. 17A to 17E illustrate an example of a method for manufacturing a semiconductor device of an embodiment.

Then, an insulating film is formed. The insulating film is preferably formed to be thicker than the second gate electrode 105b. Then, the insulating film is subjected to planarization treatment using a chemical mechanical polishing (CMP) method or the like so as to expose the top surface of the second gate electrode 105b, whereby the insulating layer 108 can be formed (FIG. 17A).

The insulating film to be the insulating layer 108 can be formed by a sputtering method, a CVD method, a molecular beam epitaxy (MBE) method, an atomic layer deposition (ALD) method, a pulsed laser deposition (PLD) method, or the like.

In order to make the insulating layer 108 excessively contain oxygen, an insulating film to be the insulating layer 108 may be formed in an oxygen atmosphere, for example. Alternatively, the insulating film may excessively contain oxygen in such a manner that oxygen is introduced into the insulating film that has been formed. Both the methods may be combined.

For example, oxygen (at least including any of oxygen radicals, oxygen atoms, and oxygen ions) is introduced into the insulating film that has been formed, whereby a region excessively containing oxygen is formed. Oxygen can be introduced by an ion implantation method, an ion doping method, a plasma immersion ion implantation method, plasma treatment, or the like.

A gas containing oxygen can be used for oxygen introducing treatment. As the gas containing oxygen, oxygen, dinitrogen monoxide, nitrogen dioxide, carbon dioxide, carbon monoxide, and the like can be used. Furthermore, a dilution gas such as a rare gas may be included in the gas containing oxygen for the oxygen introduction treatment.

Here, the method for forming the second gate electrode 105b before the formation of the insulating film is described; however, the insulating film to be the insulating layer 108 may be formed before the formation of the second gate electrode 105b. In this case, the insulating film is formed over the substrate 101, a resist mask is formed by a photolithography method or the like, an unnecessary portion of the insulating film is removed by etching, and a depressed portion is formed at a position where the second gate electrode 105b is provided. After that, a conductive film is formed to fill the depressed portion and planarization treatment is performed to expose the top surface of the insulating film, whereby the insulating layer 108 and the second gate electrode 105b can be formed.

<Formation of Insulating Layer>

Next, the insulating layer 106 is formed. The insulating layer 106 can be formed by a sputtering method, a CVD method, an MBE method, an ALD method, a PLD method, or the like.

The insulating layer 106 preferably contains excess oxygen in a manner similar to that of the insulating layer 108.

<Formation of Semiconductor Layer>

Figure 17B:
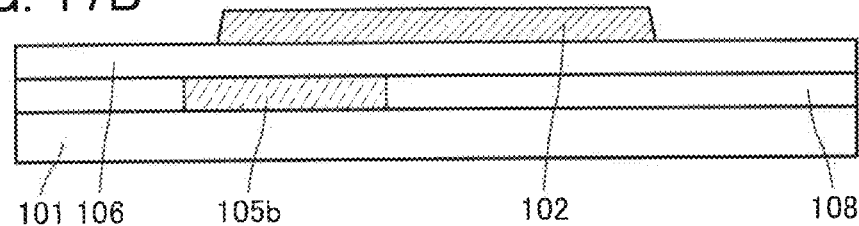

Next, a semiconductor film is formed over the insulating layer 106. A resist mask is formed over the semiconductor film by photolithography or the like, an unnecessary portion of the semiconductor film is removed by etching, and then the resist mask is removed. Thus, the island-shaped semiconductor layer 102 can be formed (FIG. 17B).

The semiconductor film can be formed by a sputtering method, a CVD method, an MBE method, an ALD method, a PLD method, or the like. Alternatively, a technique for formation of a thin film using a liquid material, such as a sol-gel method, a spray method, or a mist method, can be used. The semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

A heat treatment may be performed after the formation of the semiconductor film. The heat treatment may be performed at 250° C. or higher and 650° C. or lower, preferably 300° C. or higher and 500° C. or lower, in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating layer 108 or the insulating layer 106 to the semiconductor film (or the semiconductor layer 102), which enables a reduction in oxygen vacancies in the oxide semiconductor included in the semiconductor layer 102. The heat treatment may be performed directly after the formation of the semiconductor film or may be performed after the semiconductor film is processed into the island-shaped semiconductor layer 102.

Before the formation of a resist film to be a resist mask, an organic resin film having a function of improving the adhesion between a processed film (in this case, the semiconductor film) and the resist film may be formed. The organic resin film can be formed to cover a step under the film by a method such as a spin coating method, and thus can reduce variation in thickness of the resist mask over the organic resin film. In the case of minute processing, in particular, a material serving as a film having a function of preventing reflection of light for the exposure is preferably used for the organic resin film. Examples of the organic resin film having such a function include a bottom anti-reflection coating (BARC) film. The organic resin film may be removed at the same time as the resist mask or after the removal of the resist mask.

As the mask used for etching the semiconductor film, a hard mask made of an inorganic film or a metal film may be used. For example, an inorganic film or a metal film is formed over the semiconductor film and the inorganic film or the metal film is etched using a resist mask to be processed into an island shape, whereby the hard mask is formed. Then, the semiconductor film is etched using the hard mask as a mask and the hard mask is removed, so that an island-shaped semiconductor layer may be formed. In the case of minute processing, in particular, by using the hard mask, a reduction in pattern width in accordance with side-etching of the resist and the like can be suppressed and the stable shape can be obtained; thus, variation in the electrical characteristics of the transistor 100 can be reduced.

<Formation of First Electrode and Second Electrode>

Figure 17C:
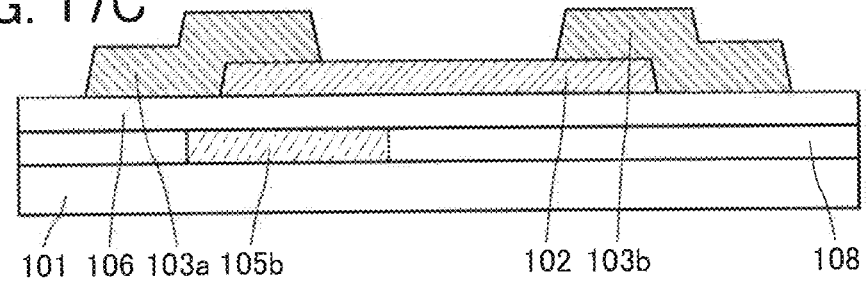

Next, a conductive film is formed over the insulating layer 106 and the semiconductor layer 102. A resist mask is formed over the conductive film by photolithography or the like, an unnecessary portion of the conductive film is removed by etching, and then the resist mask is removed. In this manner, the first electrode 103a and the second electrode 103b can be formed (FIG. 17C).

The conductive film can be formed by a sputtering method, an evaporation method, a CVD method, or the like.

Here, in some cases, part of the upper portion of the semiconductor layer 102 is etched in the etching of the conductive film to reduce the thickness of a portion where the first electrode 103a and the second electrode 103b do not overlap with the semiconductor layer 102. For this reason, the semiconductor film serving as the semiconductor layer 102 is preferably formed to have a large thickness in advance in consideration of the thickness to be etched.

<Formation of Gate Insulating Layer and First Gate Electrode>

Next, an insulating film is formed over the semiconductor layer 102, the first electrode 103a, the second electrode 103b, and the insulating layer 106. In addition, a conductive film is formed over the insulating film.

The insulating film later serves as the insulating layer 104. The insulating film can be formed by a sputtering method, a CVD method, an MBE method, an ALD method, a PLD method, or the like. In particular, it is preferable that the insulating film be formed by a CVD method, more preferably a plasma CVD method because coverage can be improved.

The conductive film later serves as the first gate electrode 105a. The conductive film can be formed by a sputtering method, an evaporation method, a CVD method, or the like, for example.

Figure 17D:
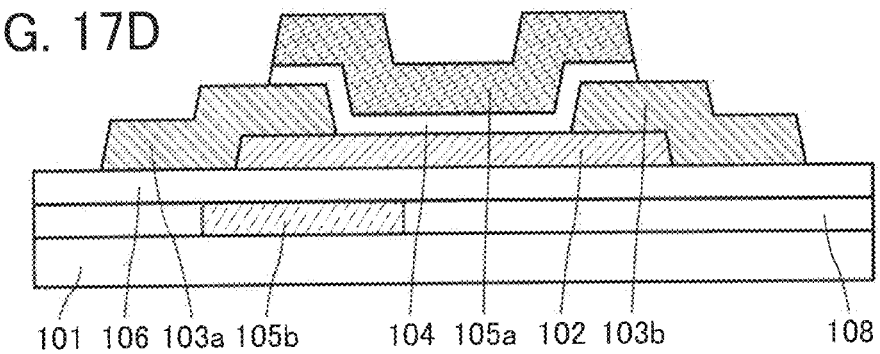

Next, a resist mask is formed over the conductive film by a photolithography method or the like. After that, unnecessary portions of the conductive film and the insulating film are removed in this order. Then, the resist mask is removed; thus, the first gate electrode 105a and the insulating layer 104 can be formed (FIG. 17D).

Alternatively, the resist mask is removed after the first gate electrode 105a is formed by etching the conductive film, and then the insulating layer 104 may be processed using the first gate electrode 105a as a hard mask.

<Formation of Insulating Layer>

Figure 17E:
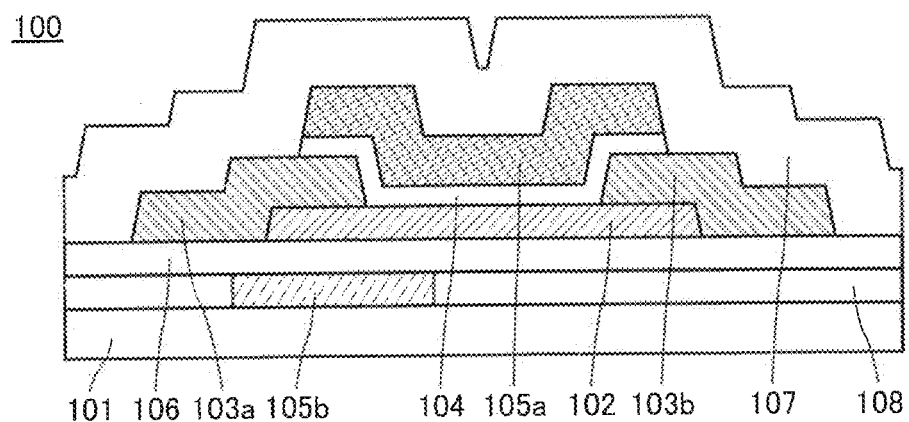

Next, the insulating layer 107 is formed over the first electrode 103a, the second electrode 103b, the first gate electrode 105a, the insulating layer 104, and the insulating layer 106 (FIG. 17E).

The insulating layer 107 can be formed by a sputtering method, a CVD method, an MBE method, an ALD method, a PLD method, or the like. In particular, the insulating layer 107 is preferably formed by a CVD method, more preferably by a plasma CVD method, because coverage can be favorable.

Through the above steps, the transistor 100 can be manufactured.

<Heat Treatment>

A heat treatment may be performed after the insulating layer 107 is formed. Through the heat treatment, oxygen can be supplied from the insulating layer 106, the insulating layer 108, and the insulating layer 107 to the semiconductor layer 102 to reduce oxygen vacancies in the semiconductor layer 102. At this time, oxygen released from the insulating layer 106, the insulating layer 108, and the semiconductor layer 102 is effectively confined in the insulating layer 107, and release of oxygen to the outside is suppressed. Thus, the amount of oxygen released from the insulating layer 106 or the insulating layer 108 and supplied to the semiconductor layer 102 can be increased, so that the oxygen vacancies in the semiconductor layer 102 can be effectively reduced.

The above is the description of the manufacturing method example of the transistor 100.

At least part of this embodiment can be implemented in combination with any of the other embodiments described in this specification as appropriate.

Embodiment 3

In this embodiment, structural examples of a transistor with a structure partly different from that of the transistor 100 described in Embodiment 2 as an example is described with reference to drawings. Note that description of the portions already described is omitted and different portions are described in detail. Even when positions and shapes of components are different from those in the above example, the same reference numerals are used as long as the components have the same functions as those in the above example, and detailed description thereof is omitted in some cases.

Structural Example 1

Figure 18A:
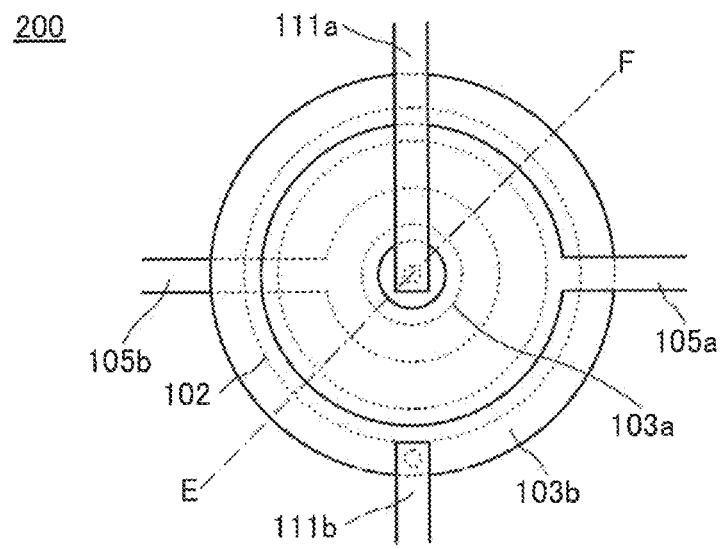
FIGS. 18A and 18B illustrate a structural example of a semiconductor device of an embodiment.
Figure 18B:
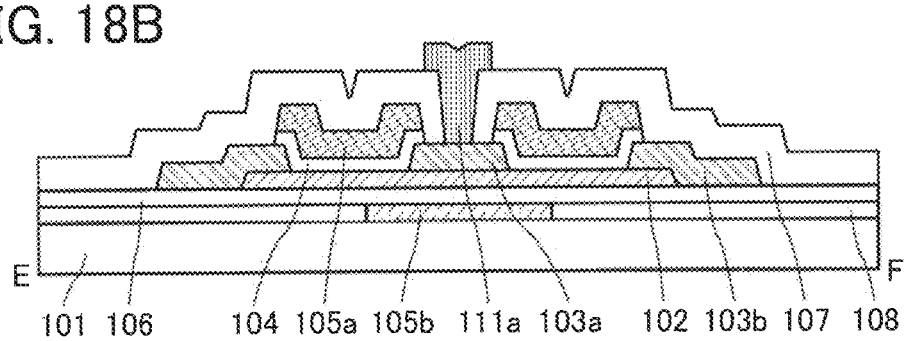

FIG. 18A is a schematic top view of a transistor 200 described in this structural example FIG. 18B is a schematic cross-sectional view taken along line E-F in FIG. 18A.

The transistor 200 is mainly different from the transistor 100 exemplified in Embodiment 2 in the top surface shapes of the semiconductor layer 102, the first electrode 103a, the second electrode 103b, the insulating layer 104, the first gate electrode 105a, and the second gate electrode 105b and in that a wiring 111a and a wiring 111b over the insulating layer 107 are further provided.

The island-shaped semiconductor layer 102 has a circular top surface. The second electrode 103b has a ring-shaped top surface having an opening in a region overlapping with the semiconductor layer 102. The first electrode 103a is located inside the opening of the second electrode 103b. The second gate electrode 105b has a circular top surface to overlap with at least part of the first electrode 103a and part of the semiconductor layer 102, and part of the second gate electrode 105b is led to the outside of the second electrode 103b when seen from the top. The first gate electrode 105a has a ring-shaped top surface to overlap with part of the first electrode 103a, part of the second electrode 103b, and part of the semiconductor layer 102, and part of the first gate electrode 105a is led to the outside of the second electrode 103b when seen from the top. The first gate electrode 105a has an opening in a region overlapping with the first electrode 103a. The first electrode 103a is electrically connected to the wiring 111a through an opening of the insulating layer 107 provided in a region overlapping with the opening of the first gate electrode 105a. The second electrode 103b is electrically connected to the wiring 111b through the opening of the insulating layer 107 provided over the second electrode 103b.

As described above, the second electrode 103b is provided to surround the first electrode 103a, whereby the channel width with respect to the occupation area of the transistor 200 can be large as compared to the case where these electrodes are placed in parallel. Thus, a larger drain current can be obtained. Such a structure can be preferably used in a power device for high-power application.

Furthermore, the semiconductor layer 102 and the first electrode 103a each has a circular top surface and the second electrode 103b has a ring-shaped top surface to surround the semiconductor layer 102 and the first electrode 103a, whereby the channel length L can be uniform in the circumference direction. The top surface shape of the semiconductor layer 102 is not limited thereto, and can be a polygonal shape including a square shape and a rectangular shape, an elliptical shape, or a polygonal shape with round corners. At this time, the shapes and positions of the first electrode 103a and the second electrode 103b may be set so as to keep the distance between the first electrode 103a and the second electrode 103b (channel length L) constant.

Structural Example 2

Figure 19A:
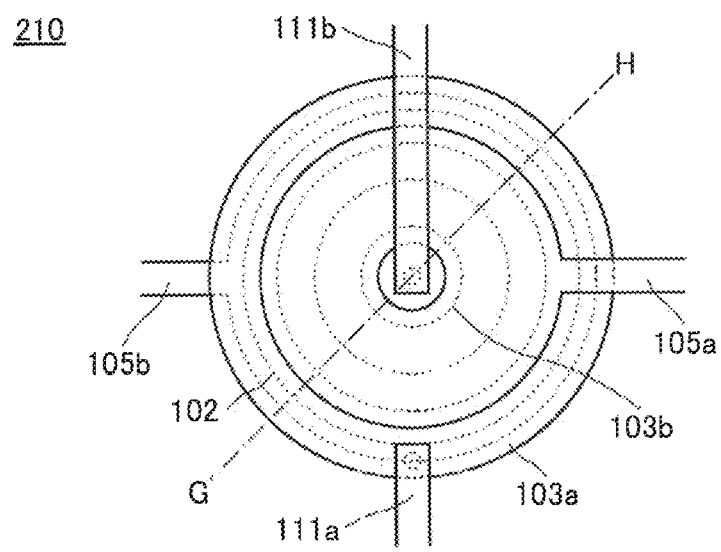
FIGS. 19A and 19B illustrate a structural example of a semiconductor device of an embodiment.
Figure 19B:
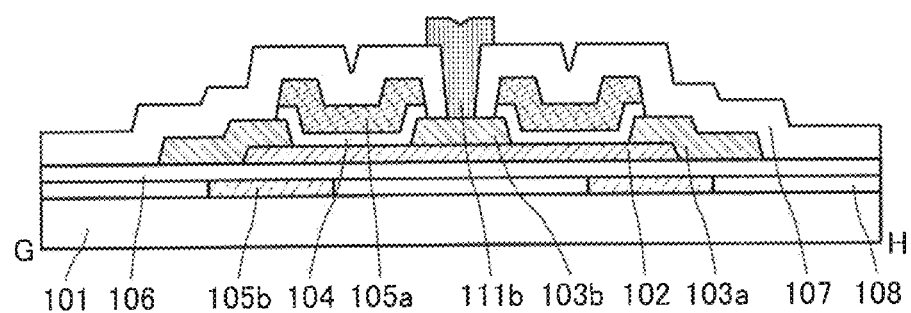

FIG. 19A is a schematic top view of a transistor 210 described in this structural example FIG. 19B is a schematic cross-sectional view taken along line G-H in FIG. 19A.

The transistor 210 is mainly different from the transistor 200 in Structural Example 1 in that functions of the first electrode 103a and the second electrode 103b are switched with each other and in the position and top surface shape of the second gate electrode 105b.

The second gate electrode 105b has a ring-shaped top surface, and an inner end portion of the second gate electrode 105b overlaps with the semiconductor layer 102 and an outer end portion thereof overlaps with the first electrode 103a.

Also with such a structure, the channel width with respect to the occupation area of the transistor 210 can be large, so that a larger drain current can be obtained.

Structural Example 3

Figure 20A:
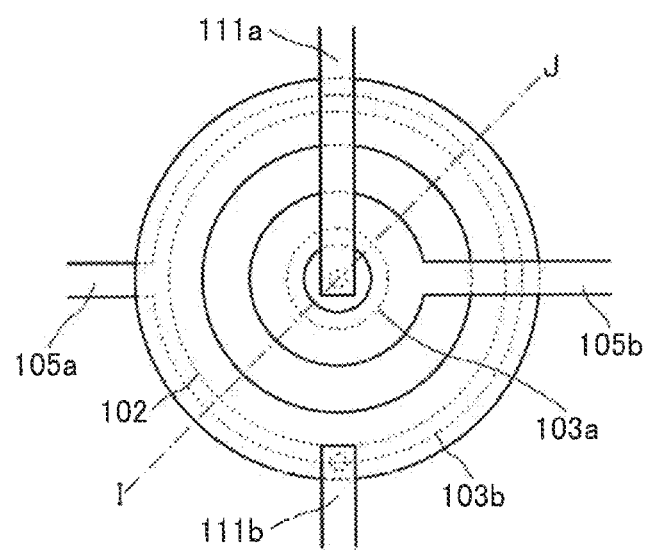
FIGS. 20A and 20B illustrate a structural example of a semiconductor device of an embodiment.
Figure 20B:
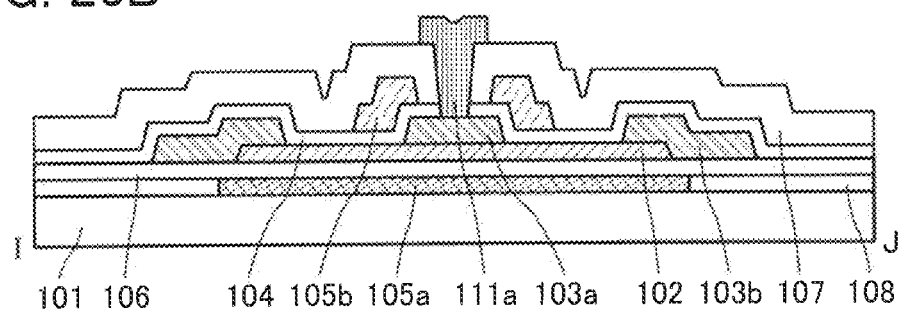

FIG. 20A is a schematic top view of a transistor 220 described in this structural example FIG. 20B is a schematic cross-sectional view taken along line I-J in FIG. 20A.

The transistor 220 is mainly different from the transistor 200 in Structural Example 1 in that the first gate electrode 105a is positioned under the semiconductor layer 102 (on the substrate 101 side) and the second gate electrode 105b is positioned over the semiconductor layer 102.

The first gate electrode 105a is provided closer to the substrate 101 side than the semiconductor layer 102 with the insulating layer 106 between the first gate electrode 105a and the semiconductor layer 102. The first gate electrode 105a has a circular top surface which has a larger radius than that of the semiconductor layer 102, and is provided to overlap with the first electrode 103a, the semiconductor layer 102, and part of the second electrode 103b. That is, in a channel length direction, the length of the first gate electrode 105a is longer than that of the semiconductor layer 102.

The second gate electrode 105b is provided over the insulating layer 104 and has a ring-shaped top surface having an opening over the first electrode 103a. An inner end portion of the second gate electrode 105b overlaps with the first electrode 103a and an outer end portion thereof overlaps with the semiconductor layer 102.

Here, as illustrated in FIG. 20B, a top surface of the semiconductor layer 102 not covered with the second gate electrode 105b is preferably covered with the insulating layer 104. The insulating layer 104 remains over the semiconductor layer 102, whereby damage to the semiconductor layer 102 in the formation process of the insulating layer 107 can be suppressed.

In a region of the semiconductor layer 102 not covered with the second gate electrode 105b, oxygen released from the insulating layer 107 by heat treatment in a manufacturing process can be supplied to a channel formation region of the semiconductor layer 102 through the insulating layer 104. Thus, oxygen vacancies in the semiconductor layer 102 can be reduced and the reliability of the transistor 220 can be improved.

Figure 21A:
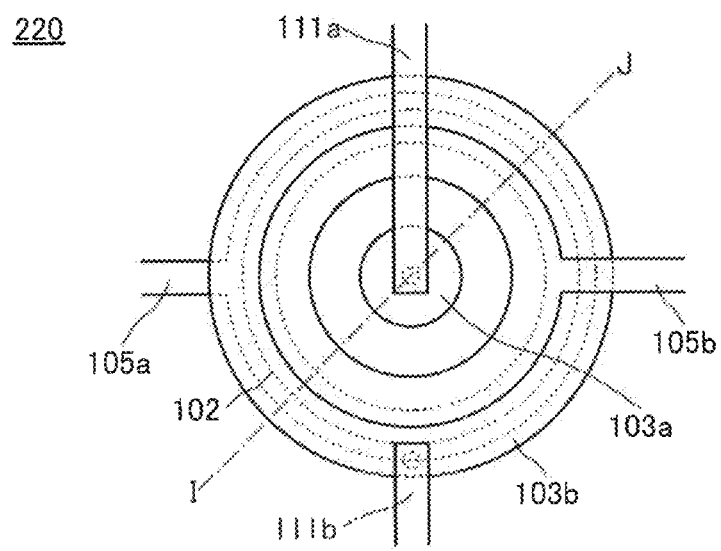
FIGS. 21A and 21B illustrate a structural example of a semiconductor device of an embodiment.
Figure 21B:
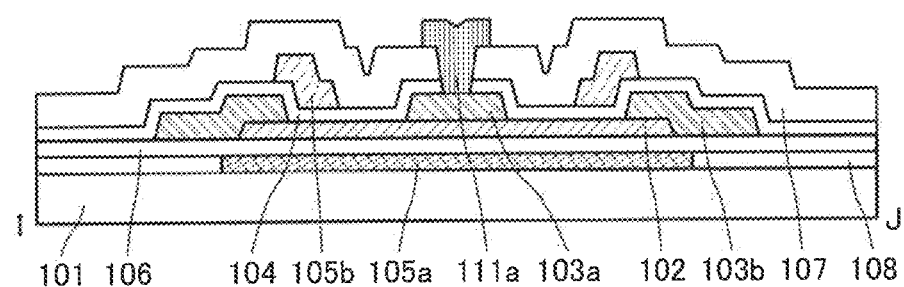

Note that, as illustrated in FIGS. 21A and 21B, the ring-shaped second gate electrode 105b may be provided so that an inner end portion of the second gate electrode 105b overlaps with the semiconductor layer 102 and an outer end portion thereof overlaps with the second electrode 103b.

Structural Example 4

Figure 22A:
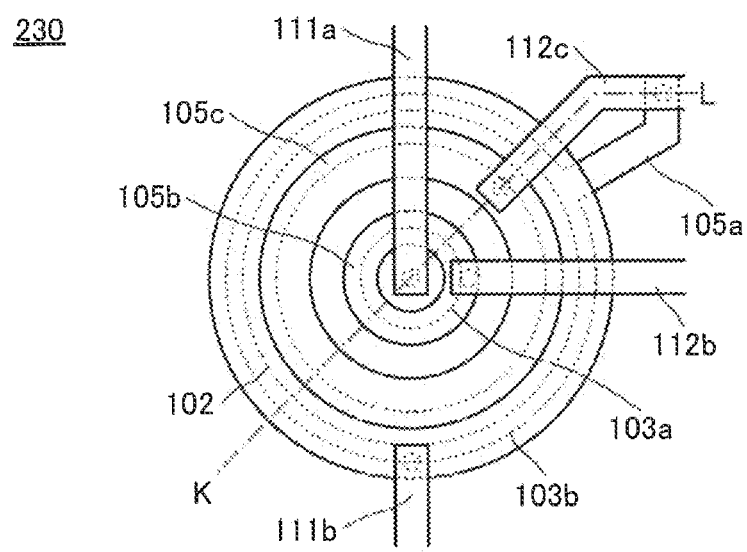
FIGS. 22A and 22B illustrate a structural example of a semiconductor device of an embodiment.
Figure 22B:
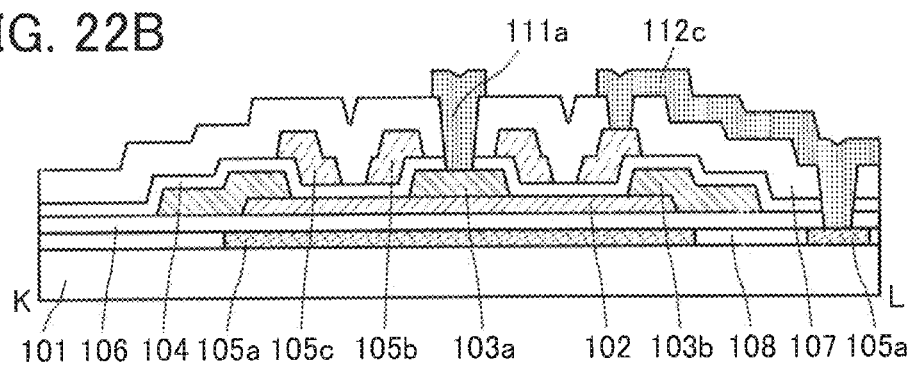

FIG. 22A is a schematic top view of a transistor 230 described in this structural example FIG. 22B is a schematic cross-sectional view taken along line K-L in FIG. 22A.

The transistor 230 is mainly different from the transistor 220 in Structural Example 3 in that the third gate electrode 105c, a wiring 112b, and a wiring 112c are included.

The third gate electrode 105c is provided over the insulating layer 104 and has a ring-shaped top surface having an opening over the semiconductor layer 102. An inner end portion of the third gate electrode 105c overlaps with the semiconductor layer 102 and an outer end portion thereof overlaps with the second electrode 103b. The second gate electrode 105b and the first electrode 103a are provided inside an opening of the third gate electrode 105c.

Here, in the transistor 230, as in the transistor 220, a top surface of the semiconductor layer 102 in a region not covered with the second gate electrode 105b and the third gate electrode 105c is preferably covered with the insulating layer 104. In a region of the semiconductor layer 102 not covered with the second gate electrode 105b and the third gate electrode 105c, oxygen released from the insulating layer 107 by heat treatment in a manufacturing process can be supplied to a channel formation region of the semiconductor layer 102 through the insulating layer 104, so that the reliability of the transistor 230 can be improved.

The wiring 112b and the wiring 112c are provided over the insulating layer 107 in a manner similar to that of the wiring 111a and the wiring 111b. The wiring 112b is electrically connected to the second gate electrode 105b through an opening provided in the insulating layer 107. Furthermore, the wiring 112c is electrically connected to the third gate electrode 105c through an opening provided in the insulating layer 107.

In FIGS. 22A and 22B, part of the first gate electrode 105a which is led to the outside is provided to overlap with the wiring 112c, and the wiring 112c and the first gate electrode 105a are electrically connected to each other through an opening provided in the insulating layer 107, the insulating layer 104, and the insulating layer 106. Thus, the first gate electrode 105a and the third gate electrode 105c are electrically connected to each other through the wiring 112c. With such a structure, the same potential (signal) can be input to the first gate electrode 105a and the third gate electrode 105c.

Here, the wiring 112c is in contact with the first gate electrode 105a; however, the present invention is not limited thereto, and the third gate electrode 105c may be in contact with the first gate electrode 105a through an opening provided in the insulating layer 104 and the insulating layer 106. Alternatively, the first gate electrode 105a may be electrically connected to the third gate electrode 105c through a wiring obtained by processing the conductive film which is the same as the first electrode 103a and the second electrode 103b or a wiring obtained by processing the conductive film which is the same as the second gate electrode 105b and the third gate electrode 105c.

Note that, here, an electrode which is in contact with the top surface of the semiconductor layer 102 and provided inside of the transistor when seen from the top is the first electrode 103a serving as a source electrode, and an electrode which is provided outside of the transistor is a second electrode 103b serving as a drain electrode; however, by switching the potentials input to these electrodes, the functions can be switched with each other. In this case, the potentials input to the third gate electrode 105c and the second gate electrode 105b are switched with each other, whereby these functions can also be switched with each other.

Structural Example 5

Figure 23A:
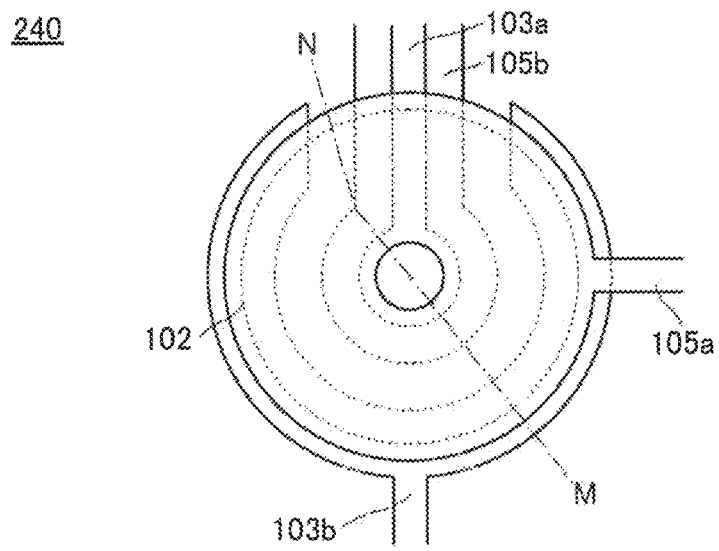
FIGS. 23A and 23B illustrate a structural example of a semiconductor device of an embodiment.
Figure 23B:
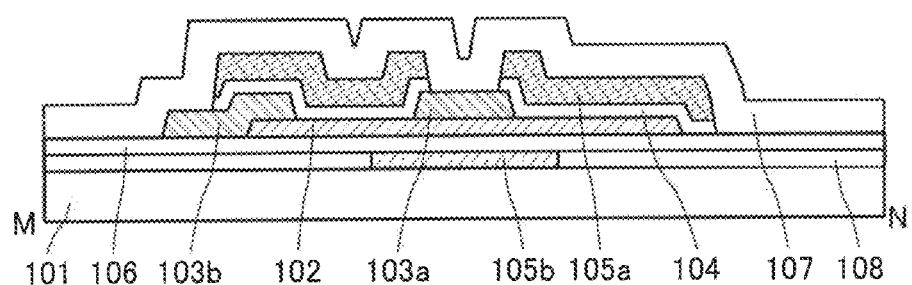

FIG. 23A is a schematic top view of a transistor 240 described in this structural example FIG. 23B is a schematic cross-sectional view taken along line M-N in FIG. 23A.

The transistor 240 is mainly different from the transistor 200 in Structural Example 1 in the top surface shapes of the first electrode 103a, the second electrode 103b, and the second gate electrode 105b and in that the wirings 111a and 111b are not included.

Part of the first electrode 103a is provided to cross over the end portion of the semiconductor layer 102 and extend to the outside when seen from the top. The second electrode 103b is provided so that the distance between the second electrode 103b over the semiconductor layer 102 and the first electrode 103a is substantially uniform. The first electrode 103a and the second electrode 103b are apart from each other at part of the end portion of the semiconductor layer 102; thus, the part of the end portion of the semiconductor layer 102 is not covered with the first electrode 103a and the second electrode 103b.

The second gate electrode 105b has a top surface shape so that the distance between the second gate electrode 105b and the second electrode 103b is substantially uniform in a region overlapping with the semiconductor layer 102. Furthermore, the distance between the end portion of the second gate electrode 105b and the end portion of the first electrode 103a is substantially uniform.

With such a structure in which the wiring 111a, the wiring 111b, and the like are not provided, the process can be simplified. Moreover, the connection portion of the wiring or the electrode can be reduced; thus, the adverse effects of the contact resistance at the connection portion can be reduced. In particular, in the case where a large current flows, the contact portion is at a high temperature and might be broken due to the contact resistance; thus, the number of wirings is preferably reduced in this manner.

As illustrated in FIG. 23B, the end portion of the semiconductor layer 102 not covered with the first electrode 103a and the second electrode 103b is covered with the first gate electrode 105a. In the region, the electric field from the first gate electrode 105a is applied to the semiconductor layer 102 not only in the vertical direction but also in the lateral direction; thus, a region where a channel is formed in the semiconductor layer 102 is increased and the on-state current of the transistor 240 can be further increased.

Here, the first electrode 103a serving as a source electrode is placed on an inner side and the second electrode 103b serving as a drain electrode is placed on an outer side; however, these functions may be switched with each other. In this case, the second gate electrode 105b may be placed to overlap with the second electrode 103b and part of the semiconductor layer 102. When the structure is combined with that in Structural Example 4, the second gate electrode 105b and the third gate electrode 105c can be included.

Figure 24A:
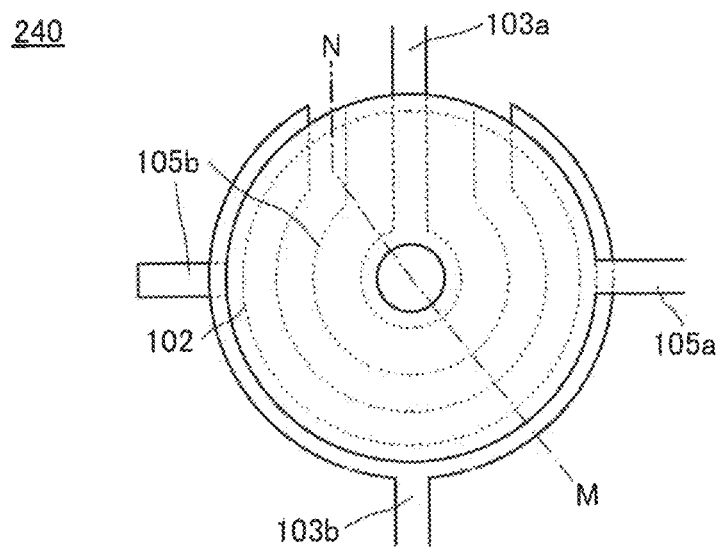
FIGS. 24A and 24B illustrate a structural example of a semiconductor device of an embodiment.
Figure 24B:
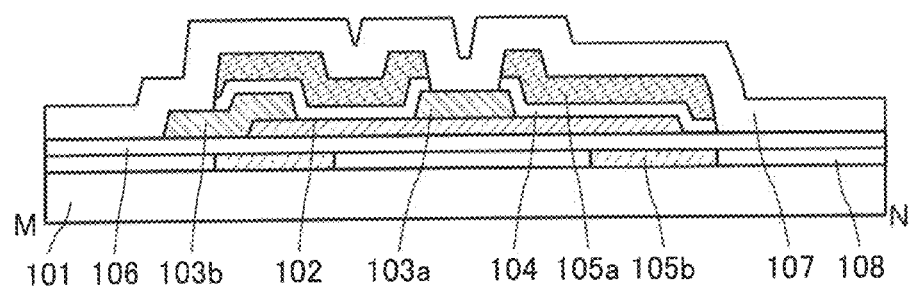

As illustrated in FIGS. 24A and 24B, at least in a region overlapping with the semiconductor layer 102, the second gate electrode 105b may be provided so that the distance between the end portion of the second gate electrode 105b and the second electrode 103b is substantially uniform.

The above is the description of each structural example.

The transistors exemplified in this embodiment each have a structure in which the channel width with respect to the occupation area can be large. Thus, the transistors each can obtain a larger drain current and are preferably used for a power device for high-power application.

This embodiment can be implemented in combination with any of the other embodiments described in this specification as appropriate.

Embodiment 4

An oxide semiconductor that can be favorably used for a semiconductor layer of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electrical characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is an integer) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

Note that if the oxide semiconductor film contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled the oxygen adding treatment, so that the oxide semiconductor film can be an i-type (intrinsic) oxide semiconductor film or an oxide semiconductor film extremely close to an i-type oxide semiconductor (a substantially i-type oxide semiconductor). Note that "substantially intrinsic" means that the oxide semiconductor film includes extremely few (close to zero) carriers derived from a donor, and the carrier concentration thereof is lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (25° C.) can be less than or equal to $1\times10^{-18}$ A, preferably less than or equal to $1\times10^{-21}$ A, and further preferably $1\times10^{-24}$ A; or at 85° C., less than or equal to $1\times10^{-15}$ A, preferably $1\times10^{-18}$ A, further preferably less than or equal to $1\times10^{-21}$ A. An off state of a transistor refers to a state where gate voltage is lower than the threshold voltage in an n-channel transistor. Specifically, the transistor is in an off state when the gate voltage is lower than the threshold voltage by 1V or more, 2V or more, or 3V or more.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

The CAAC-OS film is an oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, a boundary between crystal parts, that is, a grain boundary is not clearly observed even in the high-resolution TEM image. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

FIG. 34A is a high-resolution cross-sectional TEM image of a CAAC-OS film. FIG. 34B is a high-resolution cross-sectional TEM image obtained by enlarging the image of FIG. 34A. In FIG. 34B, atomic arrangement is highlighted for easy understanding.

FIG. 34C is local Fourier transform images of regions each surrounded by a circle (the diameter is about 4 nm) between A and O and between O and A' in FIG. 34A. As seen in FIG. 34C, c-axis alignment can be observed in each region. The c-axis direction between A and O is different from that between O and A', which indicates that a grain in the region between A and O is different from that between O and A'. In addition, the angle of the c-axis between A and O continuously and gradually changes, for example, from 14.3°, 16.6° to 26.4°. Similarly, the angle of the c-axis between O and A' continuously changes from −18.3°, −17.6°, to −15.9°.

Figure 35A:
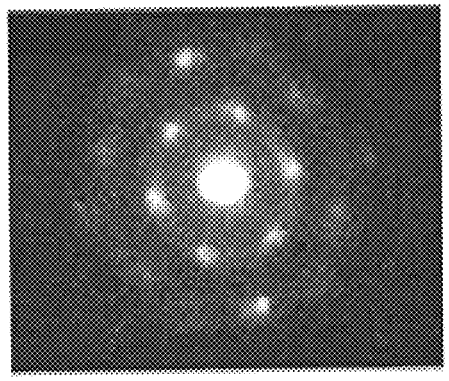
FIGS. 35A and 35B show nanobeam electron diffraction patterns of oxide semiconductor films and FIGS. 35C and 35D illustrate an example of a transmission electron diffraction measurement apparatus.

Note that in an electron diffraction pattern of the CAAC-OS film, spots (bright spots) having orientation characteristics are shown. For example, when electron diffraction with an electron beam having a diameter of, for example, 1 nm or more and 30 nm or less (such electron diffraction is also referred to as nanobeam electron diffraction) is performed on the top surface of the CAAC-OS film, the spots are observed (see FIG. 35A).

From the high-resolution cross-sectional TEM image and the high-resolution planar TEM image, orientation characteristics are found in the crystal parts in the CAAC-OS film.

Most of the crystal parts included in the CAAC-OS film each fit inside a cube whose one side is less than 100 nm. Thus, the crystal part included in the CAAC-OS film can fit inside a cube whose one side is less than 10 nm, less than 5 nm, or less than 3 nm. Note that one large crystal region can be formed if a plurality of crystal parts included in the CAAC-OS film are connected to each other. For example, a crystal region with an area of 2500 nm$^2$ or more, 5 μm$^2$ or more, or 1000 μm$^2$ or more can be observed in the high-resolution planar TEM image.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of InGaZnO$_4$, six peaks appear. The six peaks are derived from crystal planes equivalent to the (110) plane. In contrast, when the sample is the CAAC-OS film, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, if crystal growth leading to the crystal parts of the CAAC-OS film occurs from the vicinity of the top surface of the film, the proportion of the c-axis aligned crystal parts in the vicinity of the top surface may be higher than that in the vicinity of the formation surface. Furthermore, when an impurity is added to the CAAC-OS film, a region to which the impurity is added is altered, and the proportion of the c-axis aligned crystal parts in the CAAC-OS film can vary depending on regions.

Note that when the CAAC-OS film with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS film. It is preferable that a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

With the use of the CAAC-OS film in a transistor, variation in the electrical characteristics of the transistor due to irradiation with visible light or ultraviolet light is small.

Next, a microcrystalline oxide semiconductor film is described.

In the high-resolution TEM image of the microcrystalline oxide semiconductor film, there are a region where a crystal part is clearly observed and a region where a crystal part is not observed. In most cases, the crystal part size in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal (nc) is referred to as an nc-OS (nanocrystalline oxide semiconductor) film. In a high-resolution TEM image of the nc-OS film, a crystal grain cannot be clearly observed sometimes.

Figure 35B:
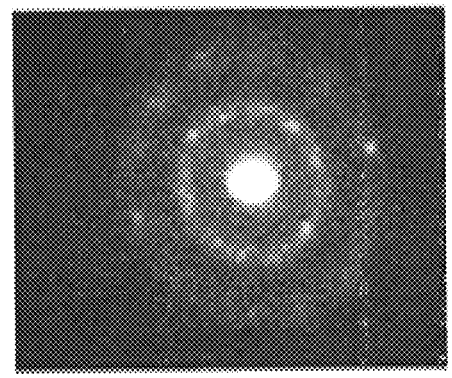

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, the nc-OS film sometimes cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, regions with high luminance in a circular (ring) pattern may be shown. Furthermore, in a nanobeam electron diffraction pattern of the nc-OS film, a plurality of circumferentially distributed spots may be observed (see FIG. 35B).

The nc-OS film is an oxide semiconductor film that has high regularity as compared to an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the InGaZnO$_4$ crystal, focusing on the lattice fringes in the high-resolution TEM image. Let the maximum length in the region in which the lattice fringes are observed be the size of crystal part of the amorphous-like OS film and the nc-OS film. Note that the crystal part whose size is 0.8 nm or larger is selectively evaluated.

Figure 36:
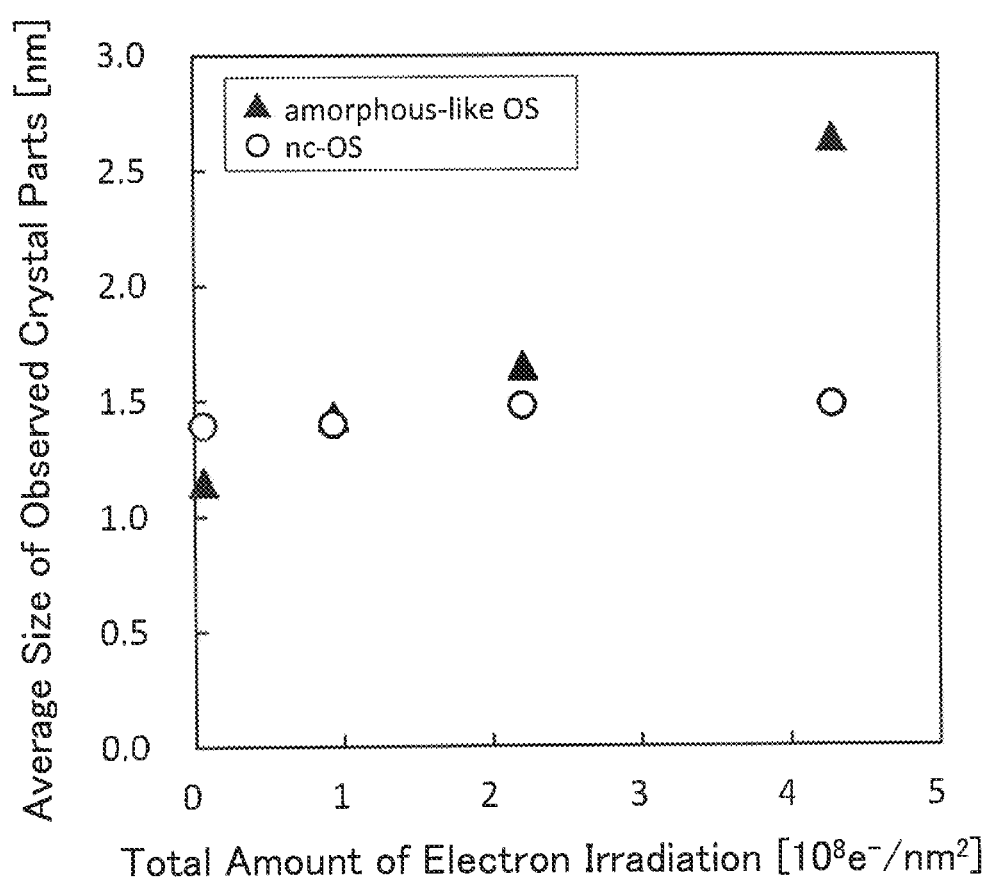
FIG. 36 shows a change in crystal parts by electron beam irradiation.

FIG. 36 shows examination results of change in average size of crystal parts (20-40 points) in the amorphous-like OS film and the nc-OS film using the high-resolution TEM images. As in FIG. 36, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8 e^-/nm^2$. In contrast, the crystal part size in the good-quality nc-OS film shows little change from the start of electron irradiation to the total amount of electron irradiation of $4.2 \times 10^8 e^-/nm^2$ regardless of the amount of electron irradiation.

Furthermore, in FIG. 36, by linear approximation of the change in the crystal part size in the amorphous-like OS film and the nc-OS film and extrapolation to the total amount of electron irradiation of $0 e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures may be analyzed using nanobeam electron diffraction.

Figure 35C:
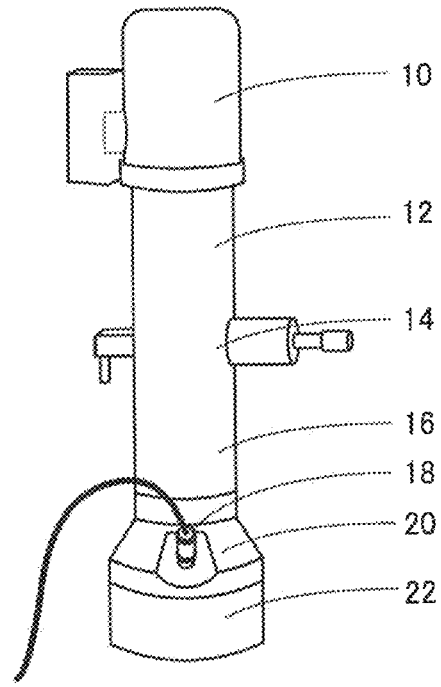

FIG. 35C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 35D:
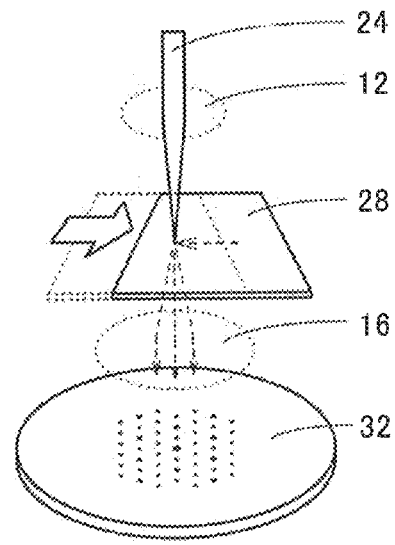

FIG. 35D illustrates an internal structure of the transmission electron diffraction measurement apparatus illustrated in FIG. 35C. In the transmission electron diffraction measurement apparatus, a substance 28 provided in the sample chamber 14 is irradiated with electrons ejected from an electron gun provided in the electron gun chamber 10 through the optical system 12. Electrons passing through the substance 28 enter a fluorescent plate 32 provided in the observation chamber 20 through the optical system 16. A pattern which depends on the intensity of the incident electrons appears in the fluorescent plate 32, so that the transmitted electron diffraction pattern can be measured.

The camera 18 is set toward the fluorescent plate 32 so that a pattern on the fluorescent plate 32 can be taken. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger.

Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. Electrons which passes through the substance 28 penetrate the holder. Furthermore, the holder may have a function of transferring the substance 28 along the x-axis, the y-axis, the z-axis, or the like, for example. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. These ranges may be optimized depending on the structure of the substance 28.

Then, a method of measuring a transmission electron diffraction pattern of a substance by the transmission electron diffraction measurement apparatus described above will be described.

For example, changes in the structure of a substance can be observed by changing (scanning) the irradiation position of the electrons 24 that are a nanobeam in the substance, as illustrated in FIG. 35D. At this time, when the substance 28 is a CAAC-OS film, a diffraction pattern shown in FIG. 35A can be observed. When the substance 28 is an nc-OS film, a diffraction pattern shown in FIG. 35B can be observed.

Even when the substance 28 is a CAAC-OS film, a diffraction pattern similar to that of an nc-OS film or the like may be partly observed. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of not-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 37A:
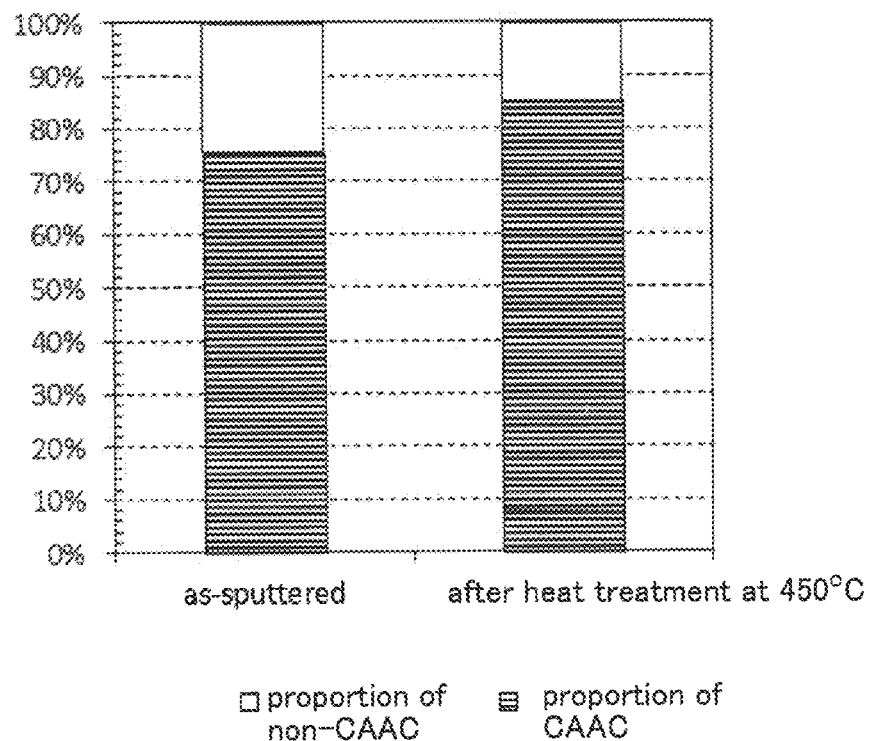
FIG. 37A shows an example of structural analysis by transmission electron diffraction measurement and FIGS. 37B and 37C show high-resolution planar TEM images.

FIG. 37A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. The above results suggest that the region having a structure similar to that of an nc-OS film is rearranged by the heat treatment owing to the influence of the structure of the adjacent region, whereby the region becomes CAAC.

Figure 37B:
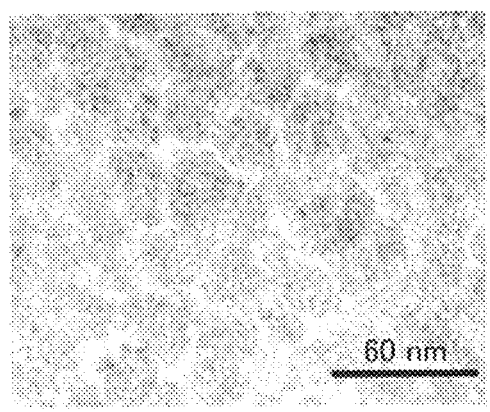
Figure 37C:
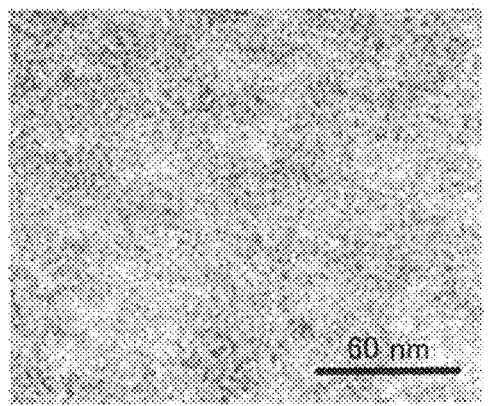

FIGS. 37B and 37C are high-resolution planar TEM images of the CAAC-OS film obtained just after the deposition and the CAAC-OS film subjected to the heat treatment at 450° C., respectively. Comparison between FIGS. 37B and 37C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

This embodiment can be implemented in combination with any of the other embodiments described in this specification as appropriate.

Embodiment 5

In this embodiment, configuration examples of power converter circuits such as an inverter and an converter each including the transistor described in the above embodiment are described as an example of a semiconductor device that is one embodiment of the present invention.

[DC-DC Converter]

Figure 25A:
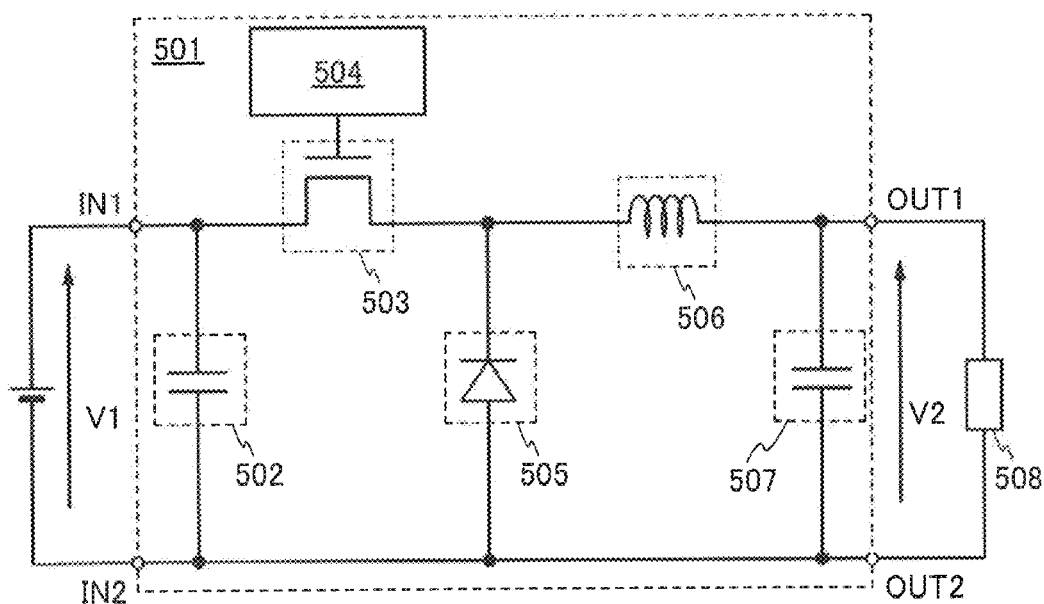
FIGS. 25A and 25B each illustrate a configuration example of a power converter circuit of an embodiment.

A DC-DC converter 501 in FIG. 25A is an example of a step-down DC-DC converter using a chopper circuit. The DC-DC converter 501 includes a capacitor 502, a transistor 503, a control circuit 504, a diode 505, a coil 506, and a capacitor 507.

The DC-DC converter 501 is operated by a switching operation of the transistor 503 with the control circuit 504. By the DC-DC converter 501, an input voltage V1 applied to input terminals IN1 and IN2 can be output from output terminals OUT1 and OUT2 to a load 508 as a voltage V2 which is stepped down. The semiconductor device described in the above embodiment can be used in the transistor 503 included in the DC-DC converter 501. Therefore, large output current can flow through the DC-DC converter 501 by the switching operation, and off-state current can be reduced. Therefore, the DC-DC converter consumes less power and can operate at high speed.

Although the step-down DC-DC converter using a chopper circuit is shown in FIG. 25A as an example of a non-isolated power converter circuit, the semiconductor device described in the above embodiment can also be used in a transistor included in a step-up DC-DC converter using a chopper circuit or a step-up/step-down DC-DC converter using a chopper circuit. Therefore, large output current can flow through the DC-DC converter by the switching operation, and off-state current can be reduced. Therefore, the DC-DC converter consumes less power and can operate at high speed.

Figure 25B:
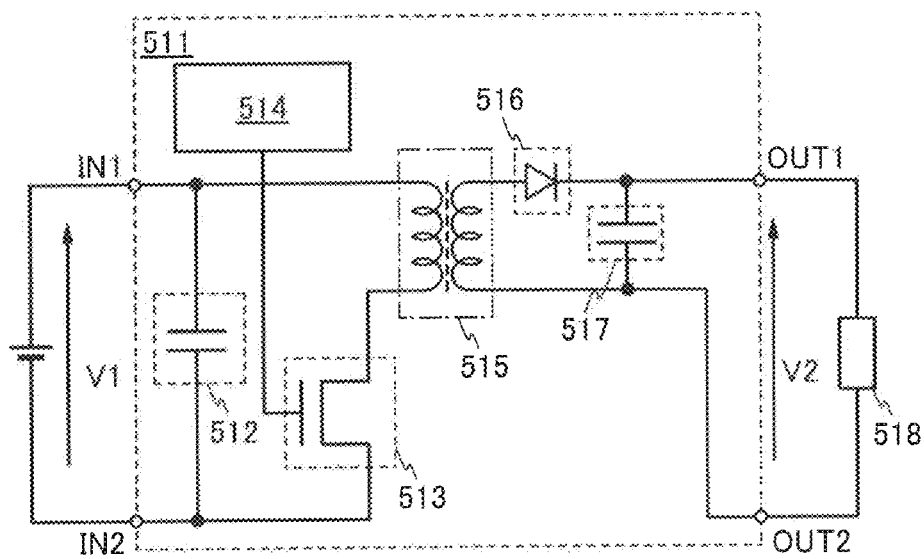

Next, a DC-DC converter 511 illustrated in FIG. 25B is an example of a fly-back converter which is an isolated power converter circuit. The DC-DC converter 511 includes a capacitor 512, a transistor 513, a control circuit 514, a transformer 515 including a primary coil and a secondary coil, a diode 516, and a capacitor 517.

The DC-DC converter 511 in FIG. 25B is operated by a switching operation of the transistor 513 with the control circuit 514. By the DC-DC converter 511, an input voltage V1 applied to input terminals IN1 and IN2 can be output from output terminals OUT1 and OUT2 to a load 518 as a voltage V2 which is stepped up or stepped down. The semiconductor device described in the above embodiment can be used in the transistor 513 included in the DC-DC converter 511. Therefore, large output current can flow through the DC-DC converter 511 by the switching operation, and off-state current can be reduced. Therefore, the DC-DC converter consumes less power and can operate at high speed.

Note that the semiconductor device described in the above embodiment can also be used in a transistor included in a forward DC-DC converter.

[Inverter]

Figure 26:
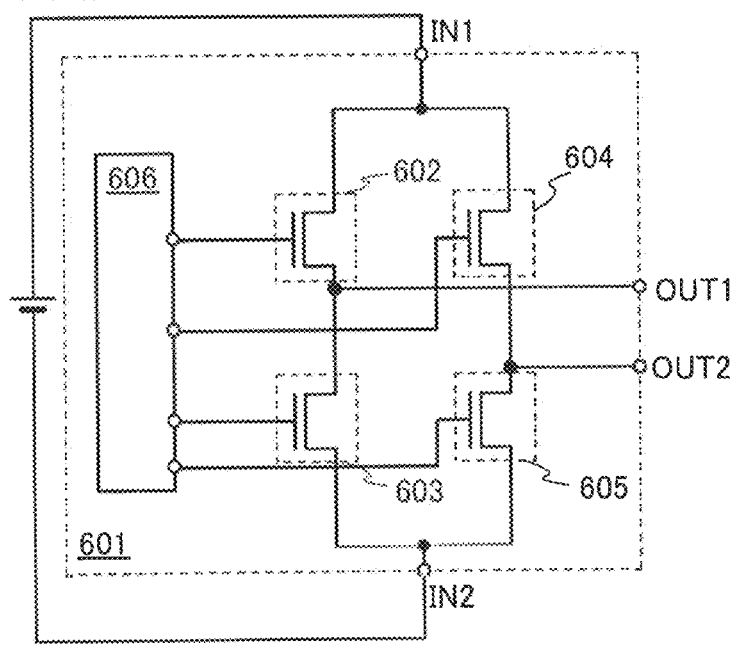
FIG. 26 illustrates a configuration example of a power converter circuit of an embodiment.

An inverter 601 in FIG. 26 is an example of a full-bridge inverter. The inverter 601 includes a transistor 602, a transistor 603, a transistor 604, a transistor 605, and a control circuit 606.

The inverter 601 in FIG. 26 is operated by a switching operation of the transistors 602 to 605 with the control circuit 606. A direct-current voltage V1 applied to input terminals IN1 and IN2 can be output from output terminals OUT1 and OUT2 as an alternating-current voltage V2. The semiconductor device described in the above embodiment can be used in the transistors 602 to 605 included in the inverter 601. Therefore, large output current can flow through the inverter 601 by the switching operation, and off-state current can be reduced. Therefore, the inverter consumes less power and can operate at high speed.

In the case where the transistor shown in the above embodiments is used for the circuit shown in FIGS. 25A and 25B and FIG. 26, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit and the potential described above as an example, e.g., a potential lower than the potential applied to the source electrode, may be input to the second gate electrode through a wiring that is not illustrated.

This embodiment can be implemented in combination with any of the other embodiments described in this specification as appropriate.

Embodiment 6

In this embodiment, a configuration example of a power supply circuit including the transistor described in the above embodiment is described as an example of a semiconductor device of one embodiment of the present invention.

Figure 27:
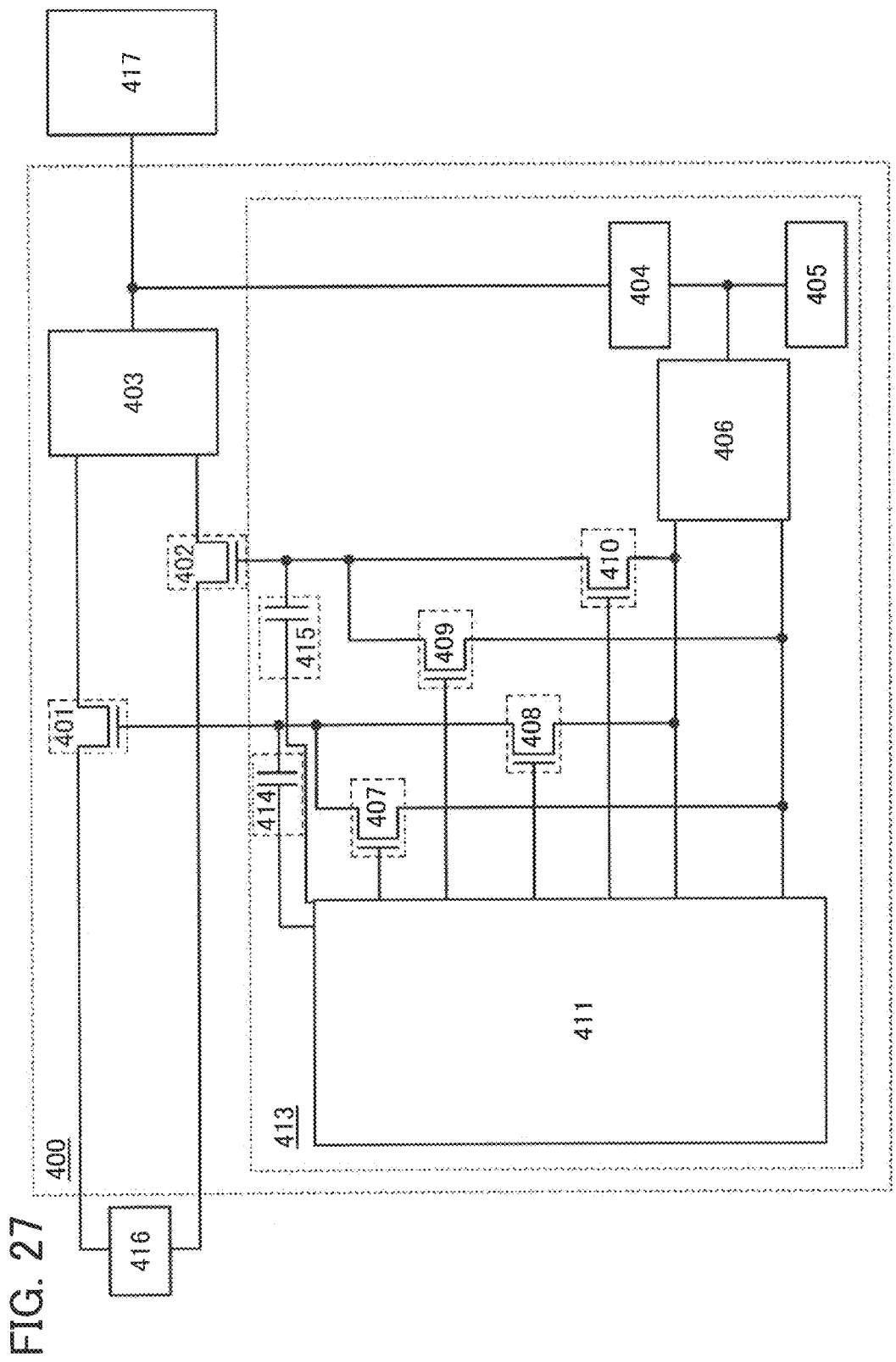
FIG. 27 illustrates a configuration example of a power supply circuit of an embodiment.

FIG. 27 illustrates a configuration example of a power supply circuit 400 of one embodiment of the present invention. The power supply circuit 400 in FIG. 27 includes a control circuit 413, a power switch 401, a power switch 402, and a voltage regulator 403.

Voltage is supplied from a power supply 416 to the power supply circuit 400. The power switches 401 and 402 each have a function of controlling input of the voltage to the voltage regulator 403.

Note that in the case where the voltage output from the power supply 416 is AC voltage, as illustrated in FIG. 27, the power switch 401 controlling input of a first potential to the voltage regulator 403 and the power switch 402 controlling input of a second potential to the voltage regulator 403 are provided in the power supply circuit 400. In the case where the voltage output from the power supply 416 is DC voltage, as illustrated in FIG. 27, the power switch 401 controlling input of the first potential to the voltage regulator 403 and the power switch 402 controlling input of the second potential to the voltage regulator 403 may be provided in the power supply circuit 400; alternatively, the second potential may be a ground potential, the power switch 402 controlling input of the second potential to the voltage regulator 403 may be eliminated, and the power switch 401 controlling input of the first potential to the voltage regulator 403 may be provided in the power supply circuit 400.

In one embodiment of the present invention, a transistor having high withstand voltage is used as each of the power switches 401 and 402. For example, any of the transistors described in the above embodiments can be used for the transistor.

When the oxide semiconductor film having the crystalline structure is used for the power switches 401 and 402, high output current can flow through the power switches 401 and 402 and the power switches 401 and 402 can each have high withstand voltage.

The use of a field-effect transistor including the above semiconductor material in an active layer as the power switch 401 or 402 can achieve high-speed switching of the power switch 401 or 402, compared with a field-effect transistor including silicon carbide or gallium nitride in an active layer. Consequently, power loss due to the switching can be reduced.

The voltage regulator 403 has a function of regulating voltage input from the power supply 416 through the power switches 401 and 402. Specifically, voltage regulation in the voltage regulator 403 means any one or more of conversion of AC voltage into DC voltage, change of a voltage level, smoothing of a voltage level, and the like.

Voltage regulated in the voltage regulator 403 is applied to a load 417 and the control circuit 413.

In addition, the power supply circuit 400 in FIG. 27 includes a power storage device 404, an auxiliary power supply 405, a voltage generation circuit 406, transistors 407 to 410, and capacitors 414 and 415.

The power storage device 404 has a function of temporarily storing power supplied from the voltage regulator 403. Specifically, the power storage device 404 includes a power storage portion such as a capacitor or a secondary battery that can store power with the use of voltage applied from the voltage regulator 403.

The auxiliary power supply 405 has a function of compensating for the lack of power output from the power storage device 404 for operation of the control circuit 413. A primary battery or the like can be used as the auxiliary power supply 405.

The voltage generation circuit 406 has a function of generating voltage for controlling switching of the power switches 401 and 402 with the use of voltage output from the power storage device 404 or the auxiliary power supply 405. Specifically, the voltage generation circuit 406 has a function of generating voltage for turning on the power switches 401 and 402 and a function of generating voltage for turning off the power switches 401 and 402.

A wireless signal input circuit 411 has a function of controlling the power switches 401 and 402 in accordance with switching of the transistors 407 to 410.

Specifically, the wireless signal input circuit 411 includes an input portion that converts an instruction superimposed on a wireless signal given from the outside to control the operating states of the power switches 401 and 402 into an electric signal, and a signal processor that decodes the instruction included in the electric signal and generates a signal for controlling the switching of the transistors 407 to 410 in accordance with the instruction.

The transistors 407 to 410 switch in accordance with the signal generated in the wireless signal input circuit 411. Specifically, when the transistors 408 and 410 are on, the voltage for turning on the power switches 401 and 402 that is generated in the voltage generation circuit 406 is applied to the power switches 401 and 402. When the transistors 408 and 410 are off, the voltage for turning on the power switches 401 and 402 is continuously applied to the power switches 401 and 402. Further, when the transistors 407 and 409 are on, the voltage for turning off the power switches 401 and 402 that is generated in the voltage generation circuit 406 is applied to the power switches 401 and 402. When the transistors 408 and 410 are off, the voltage for turning off the power switches 401 and 402 is continuously applied to the power switches 401 and 402.

In one embodiment of the present invention, a transistor with extremely low off-state current is used as each of the transistors 407 to 410 so that the voltage is continuously applied to the power switches 401 and 402. With this structure, even when generation of the voltage for determining the operating states of the power switches 401 and 402 in the voltage generation circuit 406 is stopped, the operating states of the power switches 401 and 402 can be kept. Thus, the power consumption of the voltage generation circuit 406 is reduced, so that the power consumption of the power supply circuit 400 can be reduced.

Note that the transistors 407 to 410 may be provided with back gates, which are supplied with a potential, in order to control the threshold voltages of the transistors 407 to 410.

Since a transistor including a wide-gap semiconductor whose bandgap is two or more times that of silicon in an active layer has extremely low off-state current, the transistor is preferably used as each of the transistors 407 to 410. For example, an oxide semiconductor or the like can be used as the wide-gap semiconductor.

Note that a highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. Accordingly, with the use of an oxide semiconductor film that is highly purified by sufficiently reducing the concentration of impurities such as moisture or hydrogen and by reducing oxygen vacancy, the off-state current of the transistor can be reduced. Consequently, the use of a transistor including a highly purified oxide semiconductor film as each of the transistors 407 to 410 reduces the power consumption of the voltage generation circuit 406, so that the effect of reducing the power consumption of the power supply circuit 400 can be increased.

A variety of experiments can prove a low off-state current of a transistor including a highly purified oxide semiconductor for a channel formation region. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In this case, it is found that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the In—Ga—Zn-based oxide can be deposited even at room temperature; thus, a transistor with favorable electrical characteristics can be formed over a glass substrate or an integrated circuit using silicon. Further, a larger substrate can be used.

The capacitor 414 has a function of holding voltage applied to the power switch 401 when the transistors 407 and 408 are off. The capacitor 415 has a function of holding voltage applied to the power switch 402 when the transistors 409 and 410 are off. One of a pair of electrodes of each of the capacitors 414 and 415 is connected to the wireless signal input circuit 411. Note that as illustrated in FIG. 28, the capacitors 414 and 415 are not necessarily provided.

When the power switches 401 and 402 are on, voltage is supplied from the power supply 416 to the voltage regulator 403. In addition, with the voltage, power is stored in the power storage device 404.

When the power switches 401 and 402 are off, supply of voltage from the power supply 416 to the voltage regulator 403 is stopped. Thus, although power is not supplied to the power storage device 404, the control circuit 413 can be operated using power stored in the power storage device 404 or the auxiliary power supply 405 in one embodiment of the present invention, as described above. In other words, in the power supply circuit 400 according to one embodiment of the present invention, supply of voltage to the voltage regulator 403 can be stopped while the operating states of the power switches 401 and 402 are controlled by the control circuit 413. By stopping the supply of voltage to the voltage regulator 403, it is possible to prevent power consumption due to charging and discharging of the capacitance of the voltage regulator 403 when voltage is not supplied to the load 417. Consequently, the power consumption of the power supply circuit 400 can be reduced.

Figure 28:
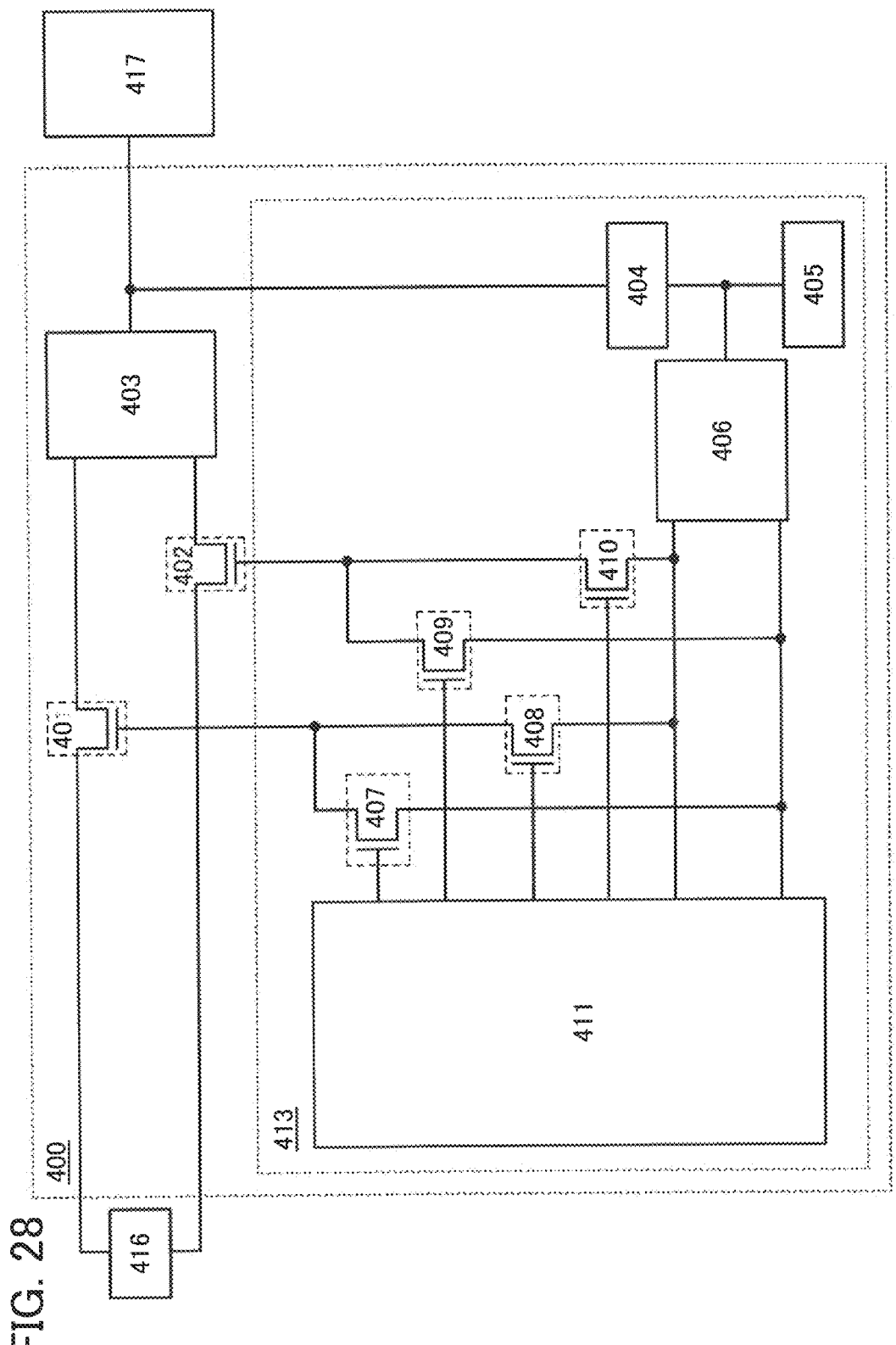
FIG. 28 illustrates a configuration example of a power supply circuit of an embodiment.

In the case where the transistor shown in the above embodiments is used for the circuit shown in FIGS. 27 and 28, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit and the potential described above as an example, e.g., a potential lower than the potential applied to the source electrode, may be input to the second gate electrode through a wiring that is not illustrated.

This embodiment can be implemented in combination with any of the other embodiments described in this specification as appropriate.

Embodiment 7

In this embodiment, a configuration of a buffer circuit including the transistor of one embodiment of the present invention is described.

The transistor of one embodiment of the present invention can be used in a buffer circuit for supplying voltage to a gate of a power switch.

Figure 29A:
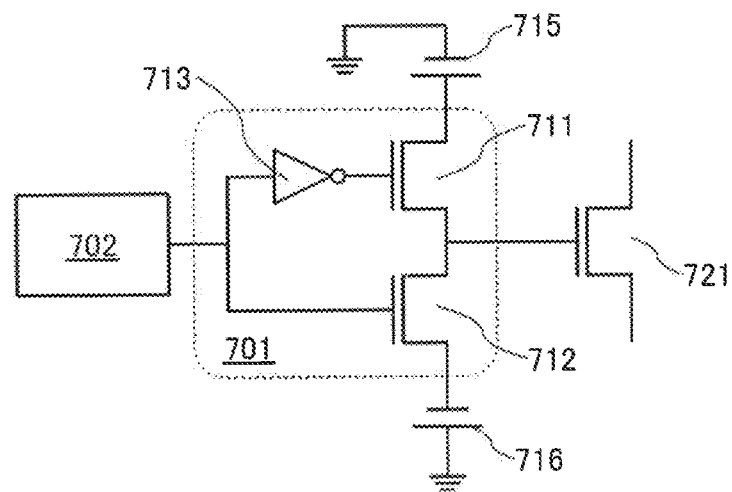
FIGS. 29A and 29B each illustrate a configuration example of a buffer circuit of an embodiment.

FIG. 29A shows a circuit including a buffer circuit 701 of one embodiment of the present invention.

A driver circuit 702 and a power switch 721 are electrically connected to the buffer circuit 701. A positive potential from a power source 715 and a negative potential from a power source 716 are applied to the buffer circuit 701.

The driver circuit 702 outputs a signal for controlling on/off operation of the power switch 721. A signal output from the driver circuit 702 is input to a gate of the power switch 721 through the buffer circuit 701.

For the power switch 721, any of the transistors exemplified in the above embodiments or a power transistor using silicon, silicon carbide, gallium nitride, or the like as a semiconductor can be used. Then, the case where the power switch 721 is an n-channel transistor is described below; however, the power switch 721 may be a p-channel transistor.

The buffer circuit 701 includes a transistor 711, a transistor 712, and an inverter 713.

One of a source and a drain of the transistor 711 is electrically connected to a high-potential output terminal of the power source 715, the other of the source and the drain is electrically connected to one of a source and a drain of the transistor 712 and a gate of the power switch 721, and a gate of the transistor 711 is electrically connected to an output terminal of the inverter 713. The other of the source and the drain of the transistor 712 is electrically connected to a low-potential output terminal of the power source 716. An output portion of the driver circuit 702 is electrically connected to an input terminal of the inverter 713 and a gate of the transistor 712.

A high-level potential or a low-level potential is output from the driver circuit 702. Here, the high-level potential is at least a potential for turning on the transistor 712 and the low-level potential is at least a potential for turning off the transistor 712.

When the high-level potential is input from the driver circuit 702, the low-level potential is input to the gate of the transistor 711 through the inverter 713, so that the transistor 711 is turned off. At the same time, the high-level potential is input to the gate of the transistor 712, so that the transistor 712 is turned on. Thus, the negative potential is input to the gate of the power switch 721 from the power source 716, so that the power switch 721 is turned off.

On the other hand, when the low-level potential is input from the driver circuit 702, the high-level potential is input to the gate of the transistor 711 through the inverter 713, so that the transistor 711 is turned on. At the same time, the low-level potential is input to the gate of the transistor 712, so that the transistor 712 is turned off. Thus, the positive potential is input to the gate of the power switch 721 from the power source 715, so that the power switch 721 is turned on.

As described above, a pulse signal having a high-level potential or a low-level potential is output from the driver circuit 702, whereby on/off operation of the power switch 721 can be controlled. As a method for controlling the power switch 721, a pulse width modulation (PWM) method, a pulse frequency modulation (PFM) method, or the like can be used.

Here, any of the transistors exemplified in the above embodiments can be used in each of the transistor 711 and the transistor 712. Thus, the power switch 721 can be driven at a high potential. Moreover, these transistors can operate stably at a high temperature; thus, these transistors can stably control the operation of the power switch even in a high-temperature environment and can be placed near the power switch 721 which generates a large amount of heat. By the switching operation of the transistors 711 and 712, a large amount of output current can flow and the off-state current can be reduced. Therefore, the buffer circuit which consumes less power and can operate at high speed can be obtained.

Figure 29B:
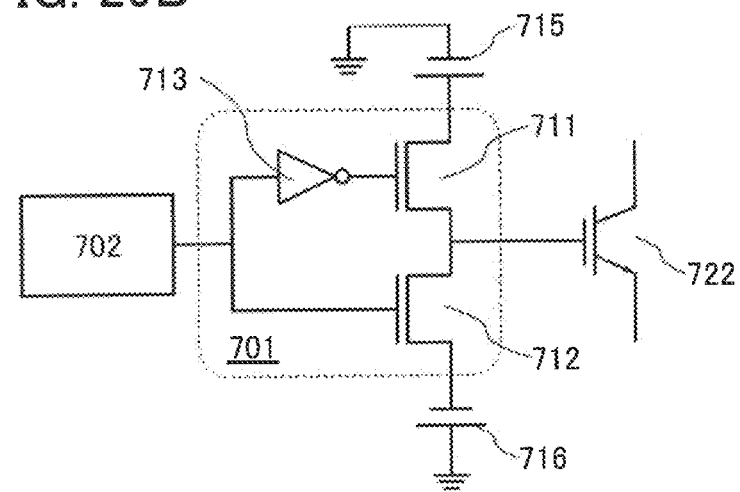

In FIGS. 29A and 29B, the power source 716 which outputs a negative potential is provided; however, a ground potential (or a reference potential) may be input to the other of the source and the drain of the transistor 712 without the power source 716.

Alternatively, the inverter 713 may be electrically connected to the transistor 712 instead of the transistor 711. In this case, in the above operation, a potential inverted to the above potential is output from the buffer circuit 701.

Here, instead of the power switch 721, a power device such as a bipolar power transistor, an insulated gate bipolar transistor (IGBT), a thyristor, a gate turnoff thyristor (GTO), a triac, or a metal semiconductor field-effect transistor (MESFET) can be used.

At this time, the output signal of the driver circuit 702 is not limited to the above signal, and a signal suitable for controlling the driving of each element may be used.

In FIG. 29B, an IGBT 722 is provided instead of the power switch 721.

In the case where the transistor shown in the above embodiments is used for the circuit shown in FIGS. 29A and 29B, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit and the potential described above as an example, e.g., a potential lower than the potential applied to the source electrode, may be input to the second gate electrode through a wiring that is not illustrated.

This embodiment can be implemented in combination with any of the other embodiments described in this specification as appropriate.

Embodiment 8

In this embodiment, an example of a semiconductor device (memory device) that includes a transistor provided with the oxide semiconductor according to one embodiment of the present invention, which can hold stored data even when not powered, and which has an unlimited number of write cycles, will be described with reference to drawings.

Figure 30:
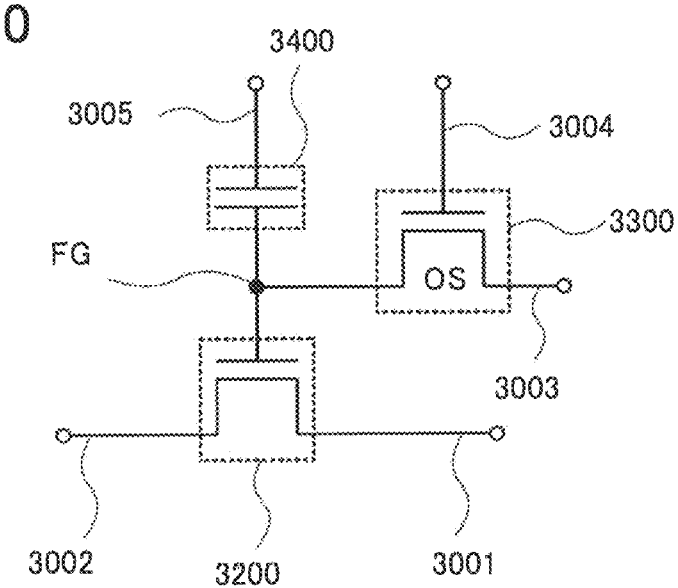
FIG. 30 is a circuit diagram of a memory device of an embodiment.

FIG. 30 is a circuit diagram of a semiconductor device.

The semiconductor device illustrated in FIG. 30 includes a transistor 3200 including a first semiconductor material, a transistor 3300 including a second semiconductor material, and a capacitor 3400. As the transistor 3300, the transistor described in the above embodiments can be used.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in the above embodiment can be used as the second semiconductor material. A transistor using single crystal silicon, for example, as the material other than an oxide semiconductor can operate at high speed easily. A transistor including an oxide semiconductor has low off-state current.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 30, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 30 utilizes a characteristic in which the potential of the gate electrode of the transistor 3200 can be held, and thus enables writing, holding, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, by setting the potential of the fifth wiring 3005 to a potential $V_0$ which is between $V_{th\_H}$ and $V_{th\_L}$, charge given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode can be read by determining the potential of the second wiring 3002.

Note that in the case where memory cells are arrayed to be used, only data of desired memory cells needs to be read. In the case where such reading is not performed, the fifth wiring 3005 may be supplied with a potential at which the transistor 3200 is turned off regardless of the state of the gate electrode, that is, a potential smaller than $V_{th\_H}$. Alternatively, the fifth wiring 3005 may be supplied with a potential at which the transistor 3200 is turned on regardless of the state of the gate electrode, that is, a potential higher than $V_{th\_L}$.

When a transistor having a channel formation region formed using an oxide semiconductor and having extremely small off-state current is used for the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

In the case where the transistor shown in the above embodiments is used for the circuit shown in FIG. 30, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit or the like and the potential described above as an example, e.g., a potential lower than the potential applied to the source electrode, may be input to the second gate electrode through a wiring that is not illustrated.

This embodiment can be implemented in combination with any of the other embodiments described in this specification as appropriate.

Embodiment 9

In this embodiment, a structural example of a display panel of one embodiment of the present invention is described.

Structural Example

Figure 31A:
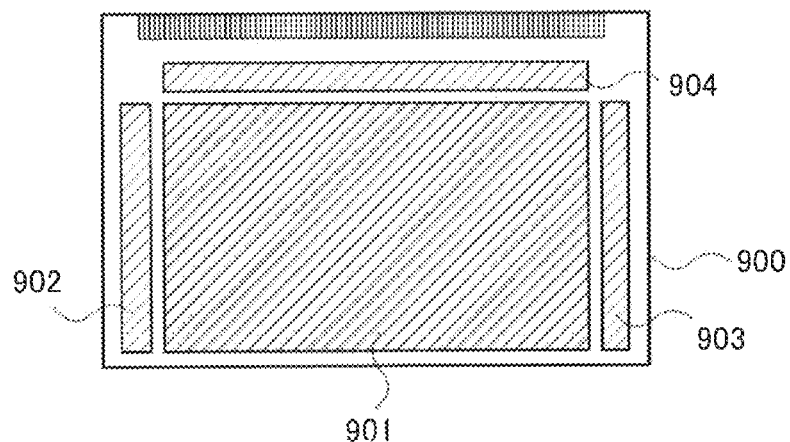
FIGS. 31A to 31C illustrate a structure of a display panel of an embodiment.
Figure 31B:
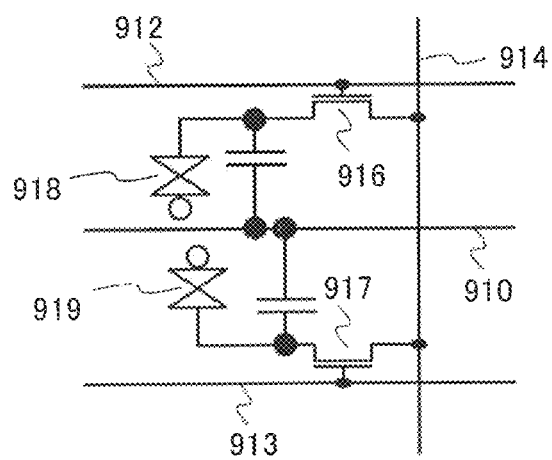
Figure 31C:
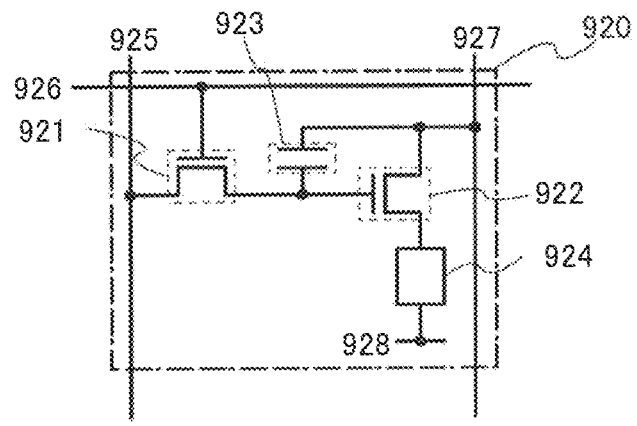

FIG. 31A is a top view of the display panel of one embodiment of the present invention. FIG. 31B illustrates a pixel circuit that can be used in the case where a liquid crystal element is used in a pixel in the display panel of one embodiment of the present invention. FIG. 31C illustrates a pixel circuit that can be used in the case where an organic EL element is used in a pixel in the display panel of one embodiment of the present invention.

The transistor in the pixel portion can be formed in accordance with the above embodiments. Further, the transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 31A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged and a plurality of scan lines extended from the first scan line driver circuit 902 and the second scan line driver circuit 903 are arranged. Note that pixels that include display elements are provided in a matrix in respective regions where the scan lines and the signal lines intersect with each other. The substrate 900 of the display device is connected to a timing control circuit (also referred to as a controller or a controller IC) through a connection portion such as a flexible printed circuit (FPC).

In FIG. 31A, the first scan line driver circuit 902, the second scan line driver circuit 903, and the signal line driver circuit 904 are formed over the same substrate 900 as the pixel portion 901. Accordingly, the number of components that are provided outside, such as a drive circuit, is reduced, so that a reduction in cost can be achieved. Further, in the case where the driver circuit is provided outside the substrate 900, wirings would need to be extended and the number of connections of wirings would be increased. When the driver circuit is provided over the substrate 900, the number of connections of the wirings can be reduced. Consequently, an improvement in reliability or yield can be achieved.

<Liquid Crystal Panel>

FIG. 31B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 912 of a transistor 916 and a gate wiring 913 of a transistor 917 are separated so that different gate signals can be supplied thereto. In contrast, a source or drain electrode 914 functioning as a data line is shared by the transistors 916 and 917. Any of the transistors described in the above embodiments can be used as appropriate as each of the transistors 916 and 917. Thus, a highly reliable liquid crystal display panel can be provided.

The shapes of a first pixel electrode layer electrically connected to the transistor 916 and a second pixel electrode layer electrically connected to the transistor 917 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film functioning as a dielectric, and a capacitor electrode electrically connected to the first pixel electrode layer or the second pixel electrode layer.

The multi-domain pixel includes a first liquid crystal element 918 and a second liquid crystal element 919. The first liquid crystal element 918 includes the first pixel electrode layer, a counter electrode layer, and a liquid crystal layer therebetween. The second liquid crystal element 919 includes the second pixel electrode layer, a counter electrode layer, and a liquid crystal layer therebetween.

Note that a pixel circuit of the present invention is not limited to that shown in FIG. 31B. For example, a switch, a resistor, a capacitor, a transistor, a sensor, a logic circuit, or the like may be added to the pixel illustrated in FIG. 31B.

<Organic EL Panel>

FIG. 31C illustrates another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 31C illustrates an applicable example of a pixel circuit. Here, one pixel includes two n-channel transistors. Note that the metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 920 includes a switching transistor 921, a driver transistor 922, a light-emitting element 924, and a capacitor 923. A gate electrode layer of the switching transistor 921 is connected to a scan line 926, a first electrode (one of a source electrode layer and a drain electrode layer) of the switching transistor 921 is connected to a signal line 925, and a second electrode (the other of the source electrode layer and the drain electrode layer) of the switching transistor 921 is connected to a gate electrode layer of the driver transistor 922. The gate electrode layer of the driver transistor 922 is connected to a power supply line 927 through the capacitor 923, a first electrode of the driver transistor 922 is connected to the power supply line 927, and a second electrode of the driver transistor 922 is connected to a first electrode (a pixel electrode) of the light-emitting element 924. A second electrode of the light-emitting element 924 corresponds to a common electrode 928. The common electrode 928 is electrically connected to a common potential line provided over the same substrate.

As the switching transistor 921 and the driver transistor 922, any of the transistors described in the above embodiments can be used as appropriate. In this manner, a highly reliable organic EL display panel can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 indicates a voltage at which a desired luminance is obtained, and includes at least a forward threshold voltage.

Note that gate capacitance of the driver transistor 922 may be used as a substitute for the capacitor 923, so that the capacitor 923 can be omitted. The gate capacitance of the driver transistor 922 may be formed between the channel formation region and the gate electrode layer.

Next, a signal input to the driver transistor 922 is described. In the case of a voltage-input voltage driving method, a video signal for turning on or off the driver transistor 922 without fail is input to the driver transistor 922. In order for the driver transistor 922 to operate in a linear region, voltage higher than the voltage of the power supply line 927 is applied to the gate electrode layer of the driver transistor 922. Note that voltage higher than or equal to voltage that is the sum of power supply line voltage and the threshold voltage Vth of the driver transistor 922 is applied to the signal line 925.

In the case of performing analog grayscale driving, a voltage greater than or equal to a voltage that is the sum of the forward voltage of the light-emitting element 924 and the threshold voltage Vth of the driver transistor 922 is applied to the gate electrode layer of the driver transistor 922. A video signal by which the driver transistor 922 is operated in a saturation region is input, so that current is supplied to the light-emitting element 924. In order for the driver transistor 922 to operate in a saturation region, the potential of the power supply line 927 is set higher than the gate potential of the driver transistor 922. When an analog video signal is used, it is possible to supply current to the light-emitting element 924 in accordance with the video signal and perform analog grayscale driving.

Note that the configuration of the pixel circuit of the present invention is not limited to that shown in FIG. 31C. For example, a switch, a resistor, a capacitor, a sensor, a transistor, a logic circuit, or the like may be added to the pixel circuit illustrated in FIG. 31C.

In the case where the transistor shown in the above embodiments is used for the circuit shown in FIGS. 31A to 31C, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit or the like and the potential described above as an example, e.g., a potential lower than the potential applied to the source electrode, may be input to the second gate electrode through a wiring that is not illustrated.

This embodiment can be implemented in combination with any of the other embodiments described in this specification as appropriate.

Embodiment 10

A semiconductor device (including a power converter circuit, a power supply circuit, and a buffer circuit) of one embodiment of the present invention is suitable for controlling supply of power to a device and favorably used particularly for a device that needs large power. For example, the semiconductor device can be favorably used for a device provided with a driver portion whose driving is controlled with power of a motor or the like and a device that controls heating or cooling by power.

Electronic appliances in which the semiconductor device of one embodiment of the present invention can be used are display devices, personal computers, image reproducing devices provided with recording media (typically, devices which reproduce the content of recording media such as digital versatile discs (DVDs) and have displays for displaying the reproduced images), and the like. Further, as electronic appliances in which the semiconductor device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, electric fans, driers, air-conditioning systems such as air conditioners, raising and lowering devices such as elevators and escalators, electric refrigerators, electric freezers, electric refrigerator-freezers, electric sewing machines, electric tools, semiconductor testing devices, and the like can be given. The semiconductor device of one embodiment of the present invention may be used for a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. Further, the semiconductor device can be used for controlling driving of industrial robots used in a variety of fields, e.g., industries of food, home electric appliances, the moving objects, steel, semiconductor devices, civil engineering, architecture, and construction.

Specific examples of these electronic appliances are illustrated in FIGS. 32A to 32D.

Figure 32A:
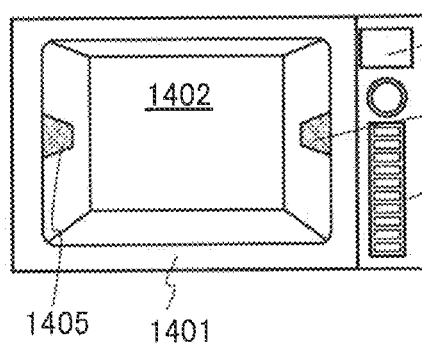
FIGS. 32A to 32D each illustrate an electronic appliance of an embodiment.

FIG. 32A illustrates a microwave oven 1400, which includes a housing 1401, a treatment room 1402 for placing an object, a display portion 1403, an input device (e.g., an operating panel) 1404, and an irradiation portion 1405 supplying an electromagnetic wave generated from a high-frequency wave generator provided in the housing 1401 to the treatment room 1402.

The semiconductor device of one embodiment of the present invention can be used, for example, in a power supply circuit that controls supply of power to the high-frequency wave generator.

Figure 32B:
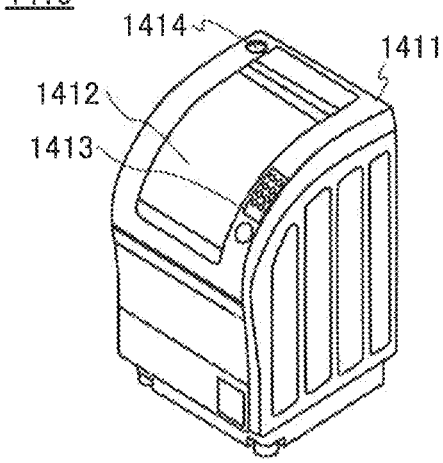

FIG. 32B illustrates a washing machine 1410, which includes a housing 1411, an open/close portion 1412 for opening or closing a washing tub provided in the housing 1411, an input device (e.g., an operating panel) 1413, and a water inlet 1414 of the washing tub.

The semiconductor device of one embodiment of the present invention can be used, for example, in a circuit that controls supply of power to a motor controlling rotation of the washing tub.

Figure 32C:
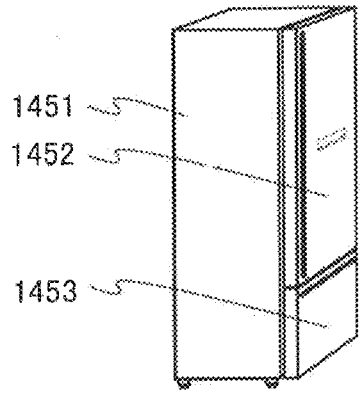

FIG. 32C is an example of an electric refrigerator-freezer. The electronic appliance illustrated in FIG. 32C includes a housing 1451, a refrigerator door 1452, and a freezer door 1453.

In the electronic appliance illustrated in FIG. 32C, the semiconductor device that is one embodiment of the present invention is provided inside the housing 1451. With this structure, supply of a power voltage to the semiconductor device in the housing 1451 can be controlled in accordance with the temperature inside the housing 1451 or in response to opening and closing of the refrigerator door 1452 and the freezer door 1453, for example.

Figure 32D:
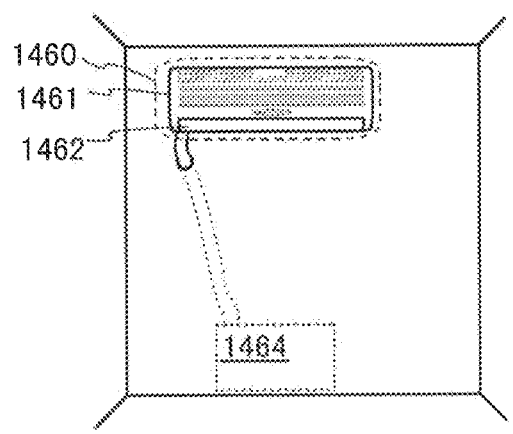

FIG. 32D illustrates an example of an air conditioner. The electronic appliance illustrated in FIG. 32D includes an indoor unit 1460 and an outdoor unit 1464.

The indoor unit 1460 includes a housing 1461 and a ventilation duct 1462.

In the electronic appliance illustrated in FIG. 32D, the semiconductor device that is one embodiment of the present invention is provided inside the housing 1461. With this structure, supply of a power supply voltage to the semiconductor device in the housing 1461 can be controlled in response to a signal from a remote controller or in accordance with the indoor temperature or humidity, for example.

The semiconductor device of one embodiment of the present invention can be used, for example, in a circuit that controls supply of power to a motor controlling rotation of a fan included in the outdoor unit 1464.

Note that the split-type air conditioner including the indoor unit and the outdoor unit is shown in FIG. 32D as an example; alternatively, an air conditioner may be such that the functions of an indoor unit and an outdoor unit are integrated in one housing.

This embodiment can be implemented in combination with any of the other embodiments described in this specification as appropriate.

Embodiment 11

In this embodiment, structural examples of electronic appliances each including a semiconductor device of one embodiment of the present invention are described.

FIGS. 33A to 33D are external views of electronic appliances each including the semiconductor device of one embodiment of the present invention.

Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 33A:
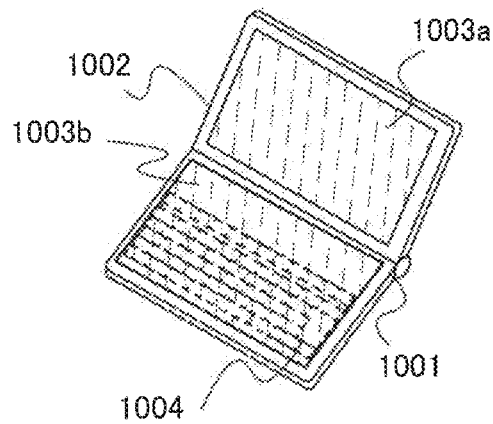
FIGS. 33A to 33D are each an external view of an electronic appliance of an embodiment.

FIG. 33A illustrates a portable information terminal, which includes a main body 1001, a housing 1002, a display portion 1003a, a display portion 1003b, and the like. The display portion 1003b includes a touch panel. By touching a keyboard button 1004 displayed on the display portion 1003b, screen operation can be carried out, and text can be input. Needless to say, the display portion 1003a may function as a touch panel. A liquid crystal panel or an organic light-emitting panel is fabricated using any of the transistors described in the above embodiments as a switching element and used in the display portion 1003*a* or 1003*b*, whereby a highly reliable portable information terminal can be provided.

The portable information terminal illustrated in FIG. 33A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Further, an external connection terminal (an earphone terminal, a USB terminal, or the like), a recording medium insertion portion, or the like may be provided on the back surface or the side surface of the housing.

The portable information terminal illustrated in FIG. 33A may transmit and receive data wirelessly. Through wireless communication, desired book data or the like can be purchased and downloaded from an electronic book server.

Figure 33B:
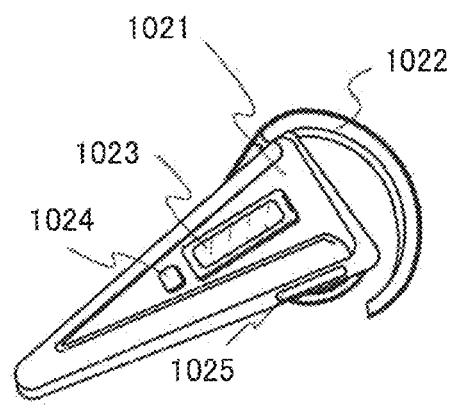

FIG. 33B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 33B has an antenna, a microphone function, or a wireless communication function and is used with a mobile phone, a user can talk on the phone wirelessly in a hands-free way while driving a car or the like.

Figure 33C:
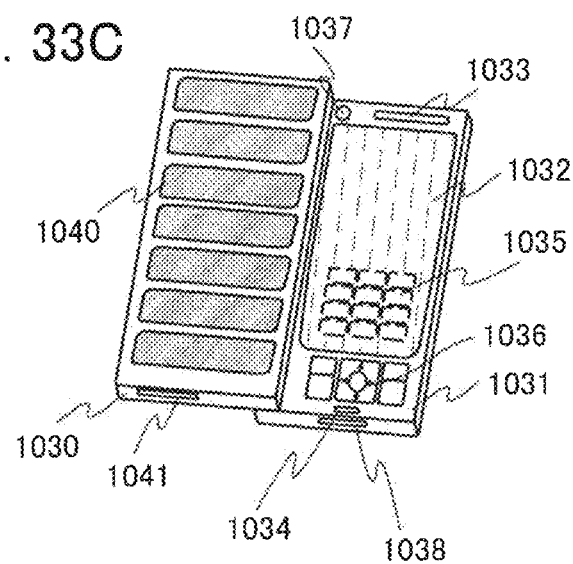

FIG. 33C illustrates a mobile phone that includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Further, the display panel 1032 includes a touch panel. A plurality of operation keys 1035 that are displayed as images are indicated by dotted lines in FIG. 33C. Note that a boosting circuit by which a voltage output from the solar cell 1040 is increased so as to be sufficiently high for each circuit is also included.

For example, a power transistor used for a power supply circuit such as a boosting circuit can also use any of the transistors described in the above embodiments.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 33C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 33D:
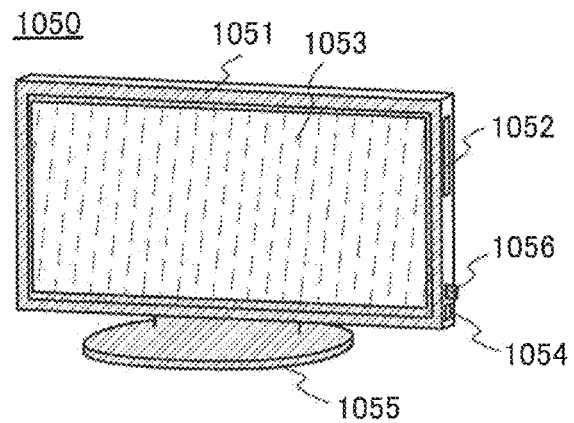

FIG. 33D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, the television set 1050 can receive general TV broadcasts. Moreover, when the television set 1050 is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, whereby data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be implemented in combination with any of the other embodiments described in this specification as appropriate.

REFERENCE NUMERALS

100: transistor, 101: substrate, 102: semiconductor layer, 103: electrode, 103*a*: electrode, 103*b*: electrode, 104: insulating layer, 105: gate electrode, 105*a*: gate electrode, 105*b*: gate electrode, 105*c*: gate electrode, 106: insulating layer, 107: insulating layer, 108: insulating layer, 109: insulating layer, 111*a*: wiring, 111*b*: wiring, 112*b*: wiring, 112*c*: wiring, 200: transistor, 210: transistor, 220: transistor, 230: transistor, 240: transistor, 400: power supply circuit, 401: power switch, 402: power switch, 403: voltage regulator, 404: power storage device, 405: auxiliary power supply, 406: voltage generation circuit, 407: transistor, 408: transistor, 409: transistor, 410: transistor, 411: wireless signal input circuit, 413: control circuit, 414: capacitor, 415: capacitor, 416: power supply, 417: load, 501: DCDC converter, 502: capacitor, 503: transistor, 504: control circuit, 505: diode, 506: coil, 507: capacitor, 508: load, 511: DCDC converter, 512: capacitor, 513: transistor, 514: control circuit, 515: transformer, 516: diode, 517: capacitor, 518: load, 601: inverter, 602: transistor, 603: transistor, 604: transistor, 605: transistor, 606: control circuit, 701: buffer circuit, 702: driver circuit, 711: transistor, 712: transistor, 713: inverter, 715: power source, 716: power source, 721: power switch, 722: IGBT, 900: substrate, 901: pixel portion, 902: scan line driver circuit, 903: scan line driver circuit, 904: signal line driver circuit, 910: capacitor wiring, 912: gate wiring, 913: gate wiring, 914: drain electrode layer, 916: transistor, 917: transistor, 918: liquid crystal element, 919: liquid crystal element, 920: pixel, 921: switching transistor, 922: driver transistor, 923: capacitor, 924: light-emitting element, 925: signal line, 926: scan line, 927: power supply line, 928: common electrode, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera lens, 1038: external connection terminal, 1040: solar cell, 1041: external memory slot, 1050: television set, 1051: housing, 1052: reproducing portion, 1053: display portion, 1054: external connection terminal, 1055: stand, 1056: external memory, 1400: microwave oven, 1401: housing, 1402: treatment room, 1403: display portion, 1404: input device, 1405: irradiation portion, 1410: washing machine, 1411: housing, 1412: open/close portion, 1413: input device, 1414: water inlet, 1451: housing, 1452: refrigerator door, 1453: refrigerator door, 1460: indoor unit, 1461: housing, 1462: ventilation duct, 1464: outdoor unit, 3001: wiring, 3002: wiring, 3003: wiring, 3004: wiring, 3005: wiring, 3200: transistor, 3300: transistor, 3400: capacitor.

This application is based on Japanese Patent Application serial no. 2013-134865 filed with Japan Patent Office on Jun. 27, 2013, and Japanese Patent Application serial no. 2013-156551 filed with Japan Patent Office on Jul. 29, 2013, the entire contents of which are hereby incorporated by reference.

The invention claimed is:

1. A semiconductor device comprising:
a semiconductor layer including a channel formation region;
a first electrode and a second electrode electrically connected to the semiconductor layer;
a first gate insulating layer and a second gate insulating layer with the semiconductor layer therebetween;
a first gate electrode overlapping with the first electrode, the semiconductor layer, and the second electrode through the first gate insulating layer; and
a second gate electrode overlapping with the semiconductor layer and the first electrode through the second gate insulating layer,
wherein an outer end of the second gate electrode extends beyond an end of the semiconductor layer, and an inner end of the second gate electrode overlaps with the semiconductor layer,
wherein each of the first gate electrode and the second gate electrode has a circular ring shape with an opening, and
wherein, in a top view, the opening of the second gate electrode is larger than the opening of the first gate electrode.

2. The semiconductor device according to claim 1,
wherein the first electrode is a drain electrode, and
wherein the second electrode is a source electrode.

3. The semiconductor device according to claim 1,
wherein the first electrode is a source electrode, and
wherein the second electrode is a drain electrode.

4. The semiconductor device according to claim 3, wherein the second gate electrode is configured to receive a potential lower than a potential applied to the source electrode.

5. The semiconductor device according to claim 1,
wherein the semiconductor layer has an island shape,
wherein one of the first electrode and the second electrode has a ring shape and an opening of the ring shape overlaps with the semiconductor layer, and
wherein the other of the first electrode and the second electrode is in the opening.

6. The semiconductor device according to claim 1, wherein the semiconductor layer includes an oxide semiconductor.

7. The semiconductor device according to claim 6, further comprising:
a first oxide layer between the semiconductor layer and the second gate insulating layer; and
a second oxide layer between the semiconductor layer and the first gate insulating layer,
wherein the first oxide layer and the second oxide layer each contain one or more of metal elements contained in the semiconductor layer.

* * * * *